(12) United States Patent
Mueller et al.

(10) Patent No.: US 9,175,123 B2
(45) Date of Patent: Nov. 3, 2015

(54) GATE INSULATOR LAYER FOR ORGANIC ELECTRONIC DEVICES

(75) Inventors: David Christoph Mueller, Frankfurt am Main (DE); Toby Cull, Newbury (GB); Pawel Miskiewicz, Cambridge, MA (US); Miguel Carrasco-Orozco, Winchester (GB); Andrew Bell, Lakewood, OH (US); Edmund Elce, Lakewood, OH (US); Larry F. Rhodes, Silver Lake, OH (US); Kazuyoshi Fujita, Tokyo (JP); Hendra Ng, Highland Heights, OH (US); Pramod Kandanarachchi, Brecksville, OH (US); Steven Smith, Perrysburg, OH (US)

(73) Assignees: Merck Patent GmbH, Darmstadt (DE); Promerus LLC, Brecksville, OH (US)

( * ) Notice: Subject to any disclaimer, the term of this patent is extended or adjusted under 35 U.S.C. 154(b) by 84 days.

(21) Appl. No.: 13/223,884

(22) Filed: Sep. 1, 2011

(65) Prior Publication Data

US 2012/0056183 A1 Mar. 8, 2012

Related U.S. Application Data

(60) Provisional application No. 61/379,799, filed on Sep. 3, 2010.

(30) Foreign Application Priority Data

Sep. 2, 2010 (EP) .................................... 10009118

(51) Int. Cl.
*B32B 27/32* (2006.01)
*C08F 132/08* (2006.01)

(Continued)

(52) U.S. Cl.
CPC ............ *C08F 232/00* (2013.01); *H01L 51/052* (2013.01); *H01L 51/0537* (2013.01)

(58) Field of Classification Search
USPC .................................... 257/288; 526/266, 268
See application file for complete search history.

(56) References Cited

U.S. PATENT DOCUMENTS

| 3,622,321 A | 11/1971 | Smets et al. |
| 4,565,873 A | 1/1986 | Lohmann et al. |

(Continued)

FOREIGN PATENT DOCUMENTS

| CN | 1698217 A | 11/2005 |
| EP | 1687830 | 8/2006 |

(Continued)

OTHER PUBLICATIONS

Alloway, D.M., et al., "Tuning the Effective Work Function of Gold and Silver Using ω- Functionalized Alkanethiols: Varying Surface Composition through Dilution and Choice of Terminal Groups," J. Phys. Chem. C (2009), vol. 113, pp. 20328-20334.

(Continued)

*Primary Examiner* — Peter D Mulcahy
*Assistant Examiner* — Henry Hu
(74) *Attorney, Agent, or Firm* — Drinker Biddle & Reath LLP

(57) ABSTRACT

Embodiments in accordance with the present invention provide for the use of polycycloolefins in electronic devices and more specifically to the use of such polycycloolefins as gate insulator layers used in the fabrication of electronic devices, the electronic devices that encompass such polycycloolefin gate insulator and processes for preparing such polycycloolefin gate insulator layers and electronic devices encompassing such layers.

25 Claims, 12 Drawing Sheets

(51) Int. Cl.
*C08F 232/00* (2006.01)
*H01L 51/05* (2006.01)

(56) References Cited

U.S. PATENT DOCUMENTS

| | | | |
|---|---|---|---|
| 5,468,819 | A | 11/1995 | Goodall et al. |
| 5,789,757 | A | 8/1998 | Husson, Jr. et al. |
| 5,861,235 | A | 1/1999 | Harkness et al. |
| 6,538,087 | B2 | 3/2003 | Zhao et al. |
| 6,690,029 | B1 | 2/2004 | Anthony et al. |
| 6,890,847 | B1 | 5/2005 | Farrar |
| 7,029,945 | B2 | 4/2006 | Veres et al. |
| 7,385,221 | B1 | 6/2008 | Anthony et al. |
| 2005/0104058 | A1 | 5/2005 | Veres et al. |
| 2005/0186502 | A1* | 8/2005 | Elce et al. .............. 430/270.1 |
| 2005/0192409 | A1* | 9/2005 | Rhodes et al. ........... 525/326.7 |
| 2006/0020068 | A1* | 1/2006 | Elce et al. .................. 524/356 |
| 2007/0066775 | A1 | 3/2007 | Rhodes et al. |
| 2007/0096088 | A1 | 5/2007 | Tano et al. |
| 2008/0160405 | A1 | 7/2008 | Yang et al. |
| 2008/0194740 | A1* | 8/2008 | Elce et al. ..................... 524/82 |
| 2008/0237583 | A1 | 10/2008 | Masuda |
| 2009/0057656 | A1* | 3/2009 | Matsubara et al. ............. 257/40 |
| 2010/0108999 | A1* | 5/2010 | Mueller et al. ................ 257/40 |
| 2011/0018061 | A1 | 1/2011 | Noh et al. |
| 2012/0056249 | A1 | 3/2012 | Mueller et al. |

FOREIGN PATENT DOCUMENTS

| | | | |
|---|---|---|---|
| WO | WO-03/052841 A1 * | 6/2003 | |
| WO | WO-2005/055248 A2 * | 6/2005 | |
| WO | WO-2005081306 A1 | 9/2005 | |

OTHER PUBLICATIONS

Marmont, P., et al., "Improving charge injection in organic thin-film transistors with thiol-based self-assembled monolayers," Organic Electronics (2008), vol. 9, pp. 419-424.

Wu, K., et al., "Continuous Modulation of Electrode Work Function with Mixed Self-Assembled Monolayers and Its Effect in Charge Injection," Langmuir (2009), vol. 25, No. 11, pp. 6232-6238.

European Search Report for EP 13004590, dated Oct. 22, 2013.

Grove, N. R. et al., "Functionalized Polynorbornene Dieelectric Polymers: Adhesion and Mechanical Properties", Journal of Polymer Science Part B: Polymer Physics, vol. 37, (1999), pp. 3003-3010.

Kim, C. et al., "Pentacene Transistors Fabricated on Photocurable Polymer Gate Dielectrics: Tuning Surface Viscoelasticity and Device Response", Advanced Materials, vol. 22, (2010), pp. 342-346.

Kagan C.R. et al., "Patterning Organic-Inorganic Thin-Film Transistors Using Microcontact Printed Templates", Applied Physics Letters, vol. 79, (2001), pp. 3536-3538.

Eiroma, K. et al., "UV Curing for Printed Electronics", Radtech Report, Technical Paper, Sep./Oct. 2007, pp. 31-34.

International Search Report of corresponding PCT Application No. PCT/EP2011/004282 dated Apr. 12, 2012.

Chinese Office Action dated Jul. 23, 2015 for Chinese Application No. 201180042505.9.

* cited by examiner

US 9,175,123 B2

GATE INSULATOR LAYER FOR ORGANIC ELECTRONIC DEVICES

CROSS-REFERENCE TO RELATED APPLICATIONS

This application claims benefit (under 35 USC 119(e)) of European Application No. 10009118.0, filed Sep. 2, 2010 and U.S. Provisional Application 61/379,799, filed Sep. 3, 2010 which is incorporated by reference.

TECHNICAL FIELD

The invention relates generally to the use of polycycloolefins in electronic devices and more specifically to the use of norbornene-type polymers to form gate insulator layers in the fabrication of electronic devices, including organic electronic devices (OEs), devices that encompass such norbornene-type polymer gate insulator layers and processes for preparing such devices that incorporate norbornene-type polymer gate insulator layers.

BACKGROUND

Electronic devices, for example field effect transistors (FETs) are used in display devices and logic capable circuits. A conventional FET typically includes source, drain and gate electrodes, a semiconducting layer made of a semiconductor (SC) material, and an insulator layer (also referred to as "dielectric" or "gate dielectric"), made of a dielectric material and positioned between the SC layer and the gate electrode. Also known are organic electronic devices, for example organic field effect transistors (OFETs) that are useful in display devices and logic capable circuits. A conventional OFET also includes source, drain and gate electrodes but rather than an inorganic semiconductor layer, an OFET includes a semiconducting layer made of an organic semiconductor (OSC) material and generally an insulator layer made of an organic dielectric material positioned between the OSC layer and the gate electrode.

U.S. Pat. No. 7,029,945 B2 discloses embodiments of an organic field effect transistor (OFET) wherein the gate insulator layer is made of a dielectric material having a permittivity ($\in$) (also known as relative permittivity or dielectric constant (k)) of less than 3.0. Such materials, generally referred as "low k materials", are reported to provide good mobility regardless of whether or not the organic semiconductor layer is disordered or semi-ordered. US '945 further reports that commercially available fluoropolymers such as Cytop™ (from Asahi Glass) or Teflon AF™ (from DuPont) are exemplary low k materials.

In EP1687830B1 the use of Cytop as a gate insulator material is disclosed as being advantageous for solution processed OFET devices where the OSC material is selected from soluble, substituted oligoacenes, such as pentacene, tetracene, anthracene, or heterocyclic derivatives thereof. These OSC materials are soluble in most common organic solvents. Therefore, when preparing a top gate OFET, the solvents for the gate dielectric formulation have to be carefully chosen to avoid dissolution of the OSC material by the solvent of the gate dielectric formulation when deposited in adjacent layers. Such a solvent is generally referred to as being orthogonal to the material of the OSC layer. Similarly, when preparing a bottom gate device, the solvent for carrying the OSC material onto a previously formed gate dielectric layer is selected to be orthogonal to the gate dielectric material.

It has been reported that the above-mentioned fluoropolymers are problematic with regard to limited structural integrity and integration into processing in the mass production of OFET devices. Regarding proccessability, fluoropolymers often do not adhere well to other layers, for example the substrate and OSC layer, among others, generally exhibiting poor wetting of such layers. Also, many fluoropolymers, such as those of the aforementioned Cytop™ series, have low glass transition temperatures, $T_g$ (~100-130° C.) that make it difficult to use standard physical or chemical deposition methods for applying a metallized gate electrode layer over such a fluoropolymer dielectric layer. With regard to structural integrity, if a fluoropolymer having a low $T_g$ is heated to, or above the $T_g$ temperature during a metallization process, polymer cracking due to built-in stress can occur. Even where such cracking can be avoided, differential expansion between the fluoropolymer and any adjacent layer due to heating can result in polymer wrinkling. Where fluoropolymers with a higher $T_g$, like those of the Teflon AF™ series (e.g., Teflon AF 2400 with $T_g$=240° C.), have been used to overcome the aforementioned wrinkling or cracking problems, such materials often exhibit wetting and adhesion problems that are more severe than those exhibited by the low $T_g$ materials. Thus there is a need for a polymer with good wettability and high $T_g$ capable of forming a low k gate dielectric layer.

BRIEF DESCRIPTION OF THE DRAWINGS

Embodiments of the invention are described below with reference to the following drawings.

In FIGS. 3 to 22, the X-axis depicts the gate voltage, left Y-axis depicts the drain current, and the right Y-axis depicts the mobility. The upper two curves, which are exemplarily labeled "c" in FIG. 3, depict the current-voltage characteristic for forward and reverse scans, illustrating the current hysteresis of the device. The lower two curves, which are labeled "a" and "b" as exemplarily shown in FIG. 3, depict the mobility-voltage characteristic, wherein curve (a) shows the mobility obtained in the linear regime, and curve (b) shows the mobility obtained in the saturation mode.

DETAILED DESCRIPTION

Figure 1:
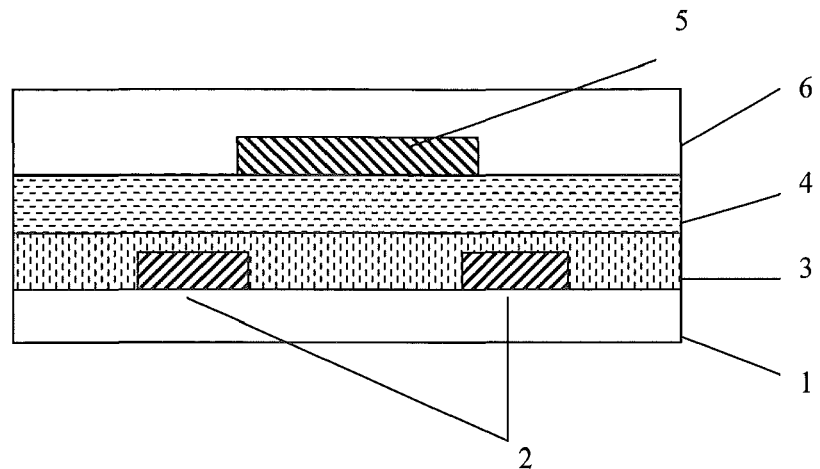
FIG. 1 depicts a top gate OFET device in accordance with embodiments of the present invention.

Embodiments in accordance with the present invention are directed to the use of polycycloolefinic polymers such as norbornene-type addition polymers, to form a gate insulator layer that is in contact with the organic semiconductor layer in organic electronic devices. Advantageously, such norbornene-type addition polymers are structurally tailorable to overcome the previously discussed drawbacks observed in known devices. Thus such embodiments can allow for time-, cost- and material-effective production of devices containing organic semiconductors on a large scale. Further, as will be discussed, such norbornene-type polymer embodiments exhibit orthogonal solubility with respect to the organic semiconducting materials. They are easily processable, exhibit structural integrity that generally exceeds that of the aforementioned fluoropolymers, enable an effective modification of the surface energy and provide improved adhesion to adjacent layers. Therefore they are especially suitable for use in gate insulator layers of organic electronic devices such as FETs and OFETs.

Advantageously, some embodiments in accordance with the present invention are directed to the methods and/or processes that use such norbornene-type addition polymers in the fabrication of electronic devices such as FETs and OFETs and other embodiments are directed to the electronic and optoelectronic constructs that are the result of such methods and or processes As used herein, the terms FETs and OFETs will be understood to be inclusive of the subclass of such devices known as Thin Film Transistors (TFTs) and Organic Thin Film Transistors (OTFTs) where a FET or TFT described herein is inclusive of an organic dielectric material and an OFET or OTFT is inclusive of both an organic semiconductor material and the aforementioned organic dielectric material.

It will be understood that the terms "dielectric" and "insulating" are used interchangeably herein. Thus reference to an insulating layer is inclusive of a dielectric layer. Further, as used herein, the term "organic electronic device" will be understood to be inclusive of the term "organic semiconductor device" and the several specific implementations of such devices such as the FETs and OFETs discussed herein.

As used herein, the phrase "photoreactive and/or crosslinkable", when used to describe certain pendent groups, will be understood to mean a group that is reactive to actinic radiation and as a result of that reactivity enters into a crosslinking reaction, or a group that is not reactive to actinic radiation but can, in the presence of a crosslinking activator, enter into a crosslinking reaction.

As used herein, the term "polymer" will be understood to mean a molecule that encompasses a backbone of one or more distinct types of repeating units and is inclusive of the commonly known terms "copolymer", "homopolymer" and "terpolymer". Further, it will be understood that the term polymer is inclusive of, in addition to the polymer itself, small amounts of residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the term "polymer composition" means at least one polymer and one or more other materials added to the at least one polymer to provide, or to modify, specific properties of the polymer composition and or the at least one polymer therein. It will be understood that a polymer composition is a vehicle for carrying the polymer to a substrate to enable the forming of layers or structures thereon. Exemplary materials include, but are not limited to, solvents, antioxidants, photoinitiators, photosensitizers, crosslinking moieties or agents, reactive diluents, acid scavengers, leveling agents and adhesion promoters. Further, it will be understood that a polymer composition may, in addition to the aforementioned exemplary materials, also encompass a blend of two or more polymers.

As defined herein, the terms "polycycloolefin" and "norbornene-type" are used interchangeably and refer to addition polymerizable monomers, or the resulting repeating unit, encompassing at least one norbornene moiety such as shown by either Structure A1 or A2, below. The simplest norbornene-type or polycycloolefin monomer bicyclo[2.2.1]hept-2-ene (A1) is commonly referred to as norbornene.

A1

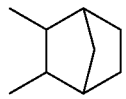

A2

The term norbornene-type monomer or repeating unit, as used herein, is understood to not only mean norbornene itself but also to refer to any substituted norbornene, or substituted and unsubstituted higher cyclic derivatives thereof, for example Structures B1 and B2, shown below, where Z is selected from —CH$_2$— or —CH$_2$—CH$_2$— and m is an integer from 0 to 3.

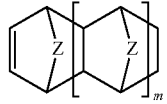

B1

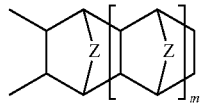

B2

By the substitution of the norbornene with a pendent group, the polymer properties can be tailored to fulfill the needs of individual applications. The procedures and methods that have been developed to polymerize functionalized norbornenes exhibit an outstanding flexibility and tolerance to various moieties and groups attached to the norbornene ring. In addition to polymerization of monomers with specific pendent groups, monomers possessing different functionalities can be randomly polymerized to form a final material where the types and ratios of monomers used dictate the overall bulk properties of the resulting polymer.

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, I). The term perhalocarbyl refers to a hydrocarbyl group where each hydrogen has been replaced by a halogen. Non-limiting examples of hydrocarbyls, include, but are not limited to, a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. Representative alkyl groups include, but are not limited to, methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include, but are not limited, to vinyl, propenyl, butenyl and hexenyl. Representative alkynyl groups include but are not limited to ethynyl, 1-propynyl, 2-propynyl, 1 butynyl, and 2-butynyl. Representative cycloalkyl groups include, but are not limited to, cyclopentyl, cyclohexyl, and cyclooctyl substituents. Representative aryl groups include, but are not limited to, phenyl, biphenyl, naphthyl, and anthracenyl. Representative aralkyl groups include, but are not limited to, benzyl, phenethyl and phenbutyl.

The term halohydrocarbyl as used herein is inclusive of the hydrocarbyl moieties mentioned above but where there is a degree of halogenation that can range from at least one hydrogen atom being replaced by a halogen atom (e.g., a fluoromethyl group) to where all hydrogen atoms on the hydrocarbyl group have been replaced by a halogen atom (e.g., trifluoromethyl or perfluoromethyl), also referred to as perhalogenation. For example, halogenated alkyl groups that can be useful in embodiments of the present invention can be partially or fully halogenated, alkyl groups of the formula $C_zX_{2z+1}$ wherein X is independently a halogen or a hydrogen and z is selected from an integer of 1 to 25. In some embodiments each X is independently selected from hydrogen, chlorine, fluorine, bromine and iodine. In other embodiments each X is independently either hydrogen or fluorine. Thus, representative halohydrocarbyls and perhalocarbyls are exemplified by the aforementioned exemplary hydrocarbyls where an appropriate number of hydrogen atoms are each replaced with a halogen atom.

In addition, the definition of the terms hydrocarbyl, halohydrocarbyl, and perhalohydrocarbyl, are inclusive of moieties where one or more of the carbons atoms is replaced by a heteroatom selected independently from O, N, P, or Si. Such heteroatom containing moieties can be referred to as, for example, either "heteroatom-hydrocarbyls" or "heterohydrocarbyls". Exemplary hydrocarbyls containing one or more heteroatoms encompass, among others, groups such as ethers, epoxies, glycidyl ethers, alcohols, carboxylic acids, esters, ketones, anhydrides, maleimides, amines, imines, amides, phenols, amido-phenols, silanes, siloxanes, phosphines, phosphine oxides, phosphinites, phosphonites, phosphites, phosphonates, phosphinates, phosphates and the like.

In some embodiments in accordance with the present invention, a polymer incorporates two or more distinct types of repeating units, where at least one such type of repeating unit encompasses pendent crosslinkable groups or moieties that have some degree of latency. By latency, it is meant that such groups do not crosslink under ambient conditions or during the initial forming of the polymers, but rather crosslink when such reactions are specifically initiated, for example by actinic radiation or heat. Such latent crosslinkable groups are incorporated into the polymer backbone by, for example, providing one or more norbornene-type monomers encompassing such a pendent crosslinkable group, for example a maleimide-type or substituted maleimide-type containing pendaet group, to the polymerization reaction mixture and subsequently causing the polymerization of such monomers.

One consideration in the design of dielectric materials for use in Bottom Gate FETs and OFETs is for the deposited material to form a layer that can withstand subsequent solution-phase processing steps that may be employed for the deposition or formation of layers after the aforementioned layer. The inclusion of pendent crosslinkable groups or moieties into repeating units, as discussed above, has been found advantageous in some embodiments in accordance with the present invention, as the inclusion of a latent crosslinking functional group onto the polymer backbone can provide for changing soluble polymer chains into insoluble polymer chains with only a small degree of crosslinking. However, in some embodiments in accordance with the present invention, resistance to solvent swelling of the dielectric is also desirable and a higher degree of crosslinking may be needed that for just providing insolubility. Therefore, it has been found advantageous to add distinct crosslinking agents to some embodiments of the present invention Therefore embodiments in accordance with the present invention take advantage of any of several crosslinking methodologies. For example, in some embodiments an acid catalyzed epoxide ring opening is employed for crosslinking while in other embodiments a photoinduced dimerization (e.g., 2+2) crosslinking reaction is used. Other embodiments employ thermally activated crosslinking, where either a thermally activated group is present in the polymer, or a multi-component mixture (resin) is used, e.g., a trifluorovinylether moiety. For the later, a polymer with a reactive site, e.g., an OH group, and a crosslinker, e.g., a latent hardener such as an isocyanate, can be employed.

It will be understood that embodiments in accordance with the present invention are not limited to the above described crosslinking methodologies as other methods of achieving the desired degree of crosslinking can also be used in which additional photoactive crosslinkers, e.g., bisazides, can be employed with appropriate polymer compositions. Additionally, embodiments of the present invention can include combinations of the above methodologies. For example a process including a basic photo-patterning step (to provide insolubility and patterning of the dielectric material), and including an additional high temperature curing step via additional thermally activated crosslinking sites in the polymer (to increase the crosslinking density), or a combination of various photoactive systems, e.g., maleimides, coumarins, cinnamates and bisazides, to increase photoefficiency.

Embodiments of the present invention encompass polymer compositions that can be a blend of a first polymer having one or more types of repeating units of formula I, and a second polymer having one or more types of repeating units of formula II. Further, embodiments can also be polymer compositions that encompass only the first polymer or the second polymer and polymer compositions that encompass a single polymer having one or more repeating units in accordance with each of formulae I and II:

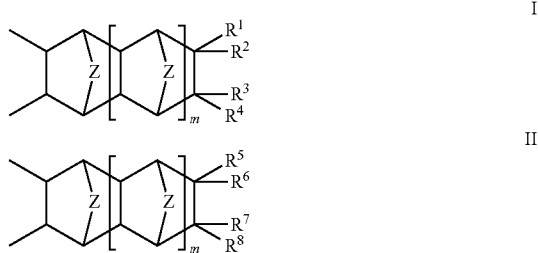

For each of the above formulae, Z, m and each of $R^1$, $R^2$, $R^3$ and $R^4$ are as defined above. $R^5$, $R^6$, $R^7$ and $R^8$ are defined as having the same scope as $R^1$, $R^2$, $R^3$ and $R^4$ but with the proviso that the first polymer encompasses at least one type of repeating unit that is distinct from the one or more repeating units of the second polymer.

The repeating units of formulae I and II are formed by corresponding norbornene-type monomers of formula Ia and IIa, respectively, where Z, m, $R^{1-4}$, and $R^{5-8}$ are as defined above:

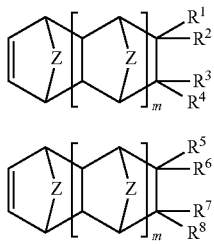

In some embodiments in accordance with the present invention, for the repeating units and monomers of formula I, Ia, II and IIa, Z is —CH$_2$— and m is 0, 1 or 2, in other embodiments, Z is —CH$_2$— and m is 0 or 1 and in still other embodiments, Z is —CH$_2$— and m is 0.

Further, for some embodiments only one of R$^{1-4}$ is different from H and only one of R$^{5-8}$ is different from H.

In order to produce the desired properties for specific applications, a combination of norbornene monomers with several different classes of pendent groups can be polymerized to obtain control over the flexibility, adhesion, interface and solubility of the resulting polymer(s). For example, varying the length of an alkyl group attached to the backbone can allow control of the polymer's modulus and glass transition temperature (T$_g$). Also, pendent groups selected from maleimide, cinnamate, coumarin, anhydride, alcohol, ester, and epoxy functional groups can be used to promote crosslinking and to modify solubility characteristics. Polar functional groups, epoxy and triethoxysilyl groups can be used to provide adhesion to metals, silicon, and oxides in adjacent device layers. Fluorinated groups, for example, can be used to effectively modify surface energy and influence the orthogonality of the solution with respect to other materials.

Thus, in some embodiments in accordance with the present invention, in particular for such embodiments where only one of R$^{1-4}$ is different from H and where only one of R$^{5-8}$ is different from H, one or more of R$^{1-4}$ or one or more of R$^{5-8}$ denote a halogenated or perhalogenated aryl or aralkyl group including, but not limited to those of the formula —(CH$_2$)$_x$—C$_6$F$_y$H$_{5-y}$, and —(CH$_2$)$_x$—C$_6$F$_y$H$_{4-y}$-pC$_z$F$_q$H$_{2z+1-q}$, where x, y, q, and z are independently selected integers from 0 to 5, 0 to 5, 0 to 9, and 1 to 4, respectively. Specifically such formulae include, but are not limited to, pentachlorophenyl, pentafluorophenyl, pentafluorobenzyl, 4-trifluoromethylbenzyl, pentafluorophenylethyl, pentafluorophenpropyl, and pentafluorophenbutyl.

Further still, some embodiments in accordance with the present invention, in particular for such embodiments where only one of R$^{1-4}$ is different from H and where only one of R$^{5-8}$ is different from H, encompass a group that is different from H that is a polar group having a terminal hydroxy, carboxy or oligoethyleneoxy moiety, for example a terminal hydroxyalkyl, alkylcarbonyloxy (for example, acetyl), hydroxy-oligoethyleneoxy, alkyloxy-oligoethyleneoxy or alkylcarbonyloxy-oligoethyleneoxy moiety, where "oligoethyleneoxy" is understood to mean —(CH$_2$CH$_2$O)$_s$— with s being 1, 2 or 3; for example 1-(bicyclo[2.2.1]hept-5-en-2-yl)-2,5,8,11-tetraoxadodecane (NBTODD) where s is 3 and 5-((2-(2-methoxyethoxy)ethoxy)methyl)bicyclo[2.2.1]hept-2-ene (NBTON) where s is 2.

Yet further still, for such embodiments where only one of R$^{1-4}$ is different from H and where only one of R$^{5-8}$ is different from H, such embodiments encompass a group that is either a photoreactive or a crosslinkable group. Further such groups encompass a linking portion L and a functional portion F. For example, L can appropriately encompass a C$_1$-C$_{12}$ alkyls, aralkyls, aryls or hetero atom analogs, while F can encompass one or more of a maleimide, a 3-monoalkyl- or 3,4-dialkyl-maleimide, epoxy, vinyl, acetylenic, cinnamate, indenyl or coumarin moiety, which is capable of a crosslinking or 2+2 crosslinking reaction.

Exemplary repeating units of Formula I and II encompassing a pendant photoreactive or crosslinkable group such as described above are formed by one or more norbornene-type monomers that include, but not limited to, those selected from the following formulae:

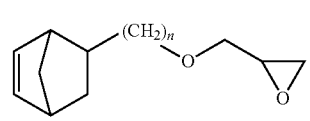

P1

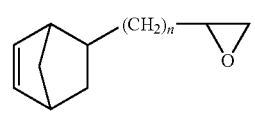

P2

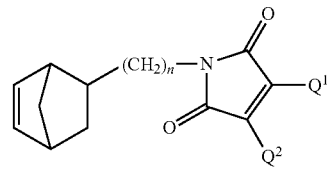

P3

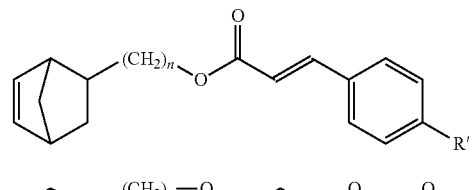

P4

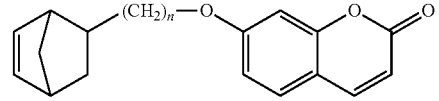

P5 where n is an integer from 1 to 8, Q$^1$ and Q$^2$ are each independently of one another —H or —CH$_3$, and R' is —H or —OCH$_3$ Further exemplary repeating units of Formula I and II such as described above are derived from one or more norbornene-type monomers represented by the following structural formulae 1 through 5, below:

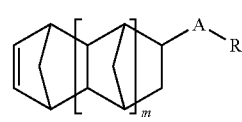

(1)

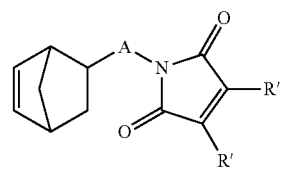

(2)

-continued

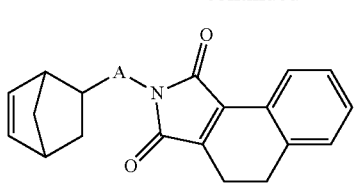
(3)

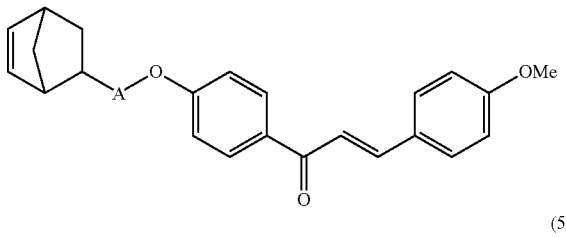
(4)

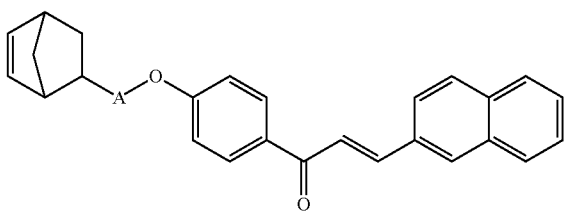
(5)

For structural formula 1 above, m is an integer from 0 to 3, -A-R is a pendent group having connecting, spacer or bridging group -A- selected from $(CZ_2)_n$, $(CH_2)_n$—$(CH=CH)_p$—$(CH_2)_n$, $(CH_2)_n$—O, $(CH_2)_n$—O—$(CH_2)_n$, $(CH_2)_n$—$C_6Q_4$—$(CH_2)_n$, and C(O)—O; and where the end group —R is selected from H, $CZ_3$, $(CZ_2)_nCZ_3$, OH, O—(O)$CCH_3$, $(CH_2CH_2O)_nCH_3$, $(CH_2)_n$—$C_6Q_5$, cinnamate or p-methoxycinnamate, coumarin, phenyl-3-indene, epoxide, CCSi $(C_2H_5)_3$ or CCSi(i-$C_3H_7)_3$, where each n is independently an integer from 0 to 12, p is an integer from 1-6, Q is independently H, F, $CH_3$, $CF_3$ or $OCH_3$, Z is independently H or F, and R' is independently H or $CH_3$. For structural formulae 2-5, -A- is as defined for formula 1.

The chemical names, and where available CAS numbers, of exemplary monomers in accordance with structural formulae 1-5 include, but are not limited to, 5-butylbicyclo[2.2.1]hept-2-ene (BuNB) CAS #22094-81-1, 5-hexylbicyclo[2.2.1]hept-2-ene (HexNB) CAS #22094-83-3, 5-octylbicyclo[2.2.1]hept-2-ene (OctNB) CAS #22094-84-4, 5-decylbicyclo[2.2.1]hept-2-ene (DecNB) CAS #22094-85-5, 5-(2-phenylethyl)bicyclo[2.2.1]hept-2-ene (PENB) CAS #29415-09-6, 1,2,3,4,4a,5,8,8a-octahydro-1,4:5,8-dimethanonaphthalene (TD) CAS #21635-90-5, bicyclo[2.2.1]hept-5-en-2-ylmethyl acetate (MeOAcNB) CAS #10471-24-6, 2-(bicyclo[2.2.1]hept-5-en-2-ylmethoxy)-ethylacetate (NBCH$_2$GlyOAc), 2-(bicyclo[2.2.1]hept-5-en-2-ylmethoxy)-ethanol (NBCH$_2$GlyOH) CAS #754231-21-5, 5-[[2-(2-methoxyethoxy)ethoxy]methyl]-bicyclo[2.2.1] hept-2-ene (NBTON) CAS #544716-19-0, 1-bicyclo[2.2.1] hept-5-en-2-yl-2,5,8,11-tetraoxadodecane (NBTODD) CAS #307923-40-6, 5-(perfluorobutyl)-bicyclo[2.2.1]hept-2-ene (NBC$_4$F$_9$) CAS #118777-97-2, 5-((perfluorophenyl)methyl)-bicyclo[2.2.1]hept-2-ene (NBMeC$_6$F$_5$) CAS #848781-71-5, 5-(perfluorophenyl)bicyclo[2.2.1]hept-2-ene (NBC$_6$F$_5$), 5-(3,4-difluorobenzyl)bicyclo[2.2.1]hept-2-ene (NBCH$_2$C$_6$H$_3$F$_2$), 5-(4-(trifluoromethyl)phenyl)bicyclo [2.2.1]hept-2-ene (NBCH$_2$C$_6$H$_4$CF$_3$), 2,2,3,3,3-pentafluoropropyl bicyclo[2.2.1]hept-5-ene-2-carboxylate (FPCNB) CAS #908372-02-1, 3,3,4,4,5,5,6,6,6-nonafluorohexyl bicyclo[2.2.1]hept-5-ene-2-carboxylate (FHCNB) CAS #944462-77-5, 2,2,3,3,4,4,5,5.octafluoropentyl-bicyclo [2.2.1]hept-5-ene-2-carboxylate (FOCHNB) CAS #99807-26-8, 2,2,3,3-tetrafluoropropyl-bicyclo[2.2.1]hept-5-ene-2-carboxylate (FPCHNB), bicyclo[2.2.1]hept-5-en-2-ylmethyl perfluorooctanoate (C$_8$PFAcNB) CAS #908372-04-3, 5-((1, 1,2-trifluoro-2-(perfluoropropoxy)ethoxy)methyl)bicyclo [2.2.1]hept-2-ene (PPVENB), 2-(6-bicyclo[2.2.1]hept-5-en-2-ylhexyl)-oxirane (EONB) CAS #950896-95-4, 2-[(bicyclo [2.2.1]hept-5-en-2-ylmethoxy)methyl]-oxirane (MGENB) CAS #3188-75-8, (4-(bicyclo[2.2.1]hept-5-en-2-yl)but-1-yn-1-yl)triethylsilane (AkSiNB), ((4-(2-(bicyclo[2.2.1]hept-5-en-2-yl)ethyl)phenyl)ethynyl)triethylsilane (ArSiNB), (E)-1-(4-(bicyclo[2.2.1]hept-5-en-2-ylmethoxy)phenyl)-3-(4-methoxyphenyl)prop-2-en-1-one (MCHMNB), (E)-1-(4-(bicyclo[2.2.1]hept-5-en-2-ylmethoxy)phenyl)-3-(naphthalen-2-yl)prop-2-en-1-one (NPCHMMNB), 1-(bicyclo[2.2.1] hept-5-en-2-ylmethyl)-3,4-dimethyl-1H-pyrrole-2,5-dione (DMMIMeNB) CAS #1031898-89-1, 1-(2-(bicyclo[2.2.1] hept-5-en-2-yl)ethyl)-3,4-dimethyl-1H-pyrrole-2,5-dione (DMMIEtNB) CAS #1031898-91-5, 1-(4-(bicyclo[2.2.1] hept-5-en-2-yl)butyl)-3,4-dimethyl-1H-pyrrole-2,5-dione (DMMIBuNB), 1-(bicyclo[2.2.1]hept-5-en-2-ylmethyl)-3-methyl-1H-pyrrole-2,5-dione (MMIMeNB), 1-(bicyclo [2.2.1]hept-5-en-2-ylmethyl)-1H-pyrrole-2,5-dione (MIMeNB) CAS #442665-16-9, 1-(2-(bicyclo[2.2.1]hept-5-en-2-yl)ethyl)-1H-pyrrole-2,5-dione (MIEtNB), 1-(6-(bicyclo [2.2.1]hept-5-en-2-yl)hexyl)-3,4-dimethyl-1H-pyrrole-2,5-dione (DMMIHxNB), 1-(4-(2-(bicyclo[2.2.1]hept-5-en-2-yl)ethyl)phenyl)-3,4-dimethyl-1H-pyrrole-2,5-dione (EtPhDMMINB), 2-(bicyclo[2.2.1]hept-5-en-2-ylmethyl)-4, 5-dihydro-1H-benzo[e]isoindole-1,3(2H)-dione (DHNMINB), (E)-bicyclo[2.2.1]hept-5-en-2-ylmethyl 3-(4-methoxyphenyl)acrylate (MeOCinnNB) CAS #1059706-16-8, bicyclo[2.2.1]hept-5-en-2-ylmethyl cinnamate (CinnNB) CAS #185827-76-3, (E)-2-(bicyclo[2.2.1]hept-5-en-2-yl) ethyl 3-(4-methoxyphenyl)acrylate (EtMeOCinnNB), 7-(bicyclo[2.2.1]hept-5-en-2-ylmethoxy)-2H-chromen-2-one (MeCoumNB) CAS #192633-28-6, 7-(2-(bicyclo[2.2.1] hept-5-en-2-yl)ethoxy)-2H-chromen-2-one (EtCoumNB), 7-(4-(bicyclo[2.2.1]hept-5-en-2-yl)butoxy)-2H-chromen-2-one (BuCoumNB), 2-(4-(2-(bicyclo[2.2.1]hept-5-en-2-yl) ethyl)phenyl)-1H-indene (EtPhIndNB), 2-(4-(bicyclo[2.2.1] hept-5-en-2-yl)phenyl)-1H-indene (PhIndNB). It will be noted that as an acronym has been provided for each of the above named chemicals, hereinafter where reference to any such chemicals is made, it will be made through use of a chemical's acronym.

Some of the chemical structures of norbornene-type monomers, from which exemplary repeating units of Formula I and II such as described above and below are derived, are shown in the following list:

-continued
| | | | |
|---|---|---|---|
| 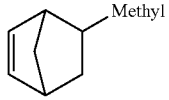 Methyl | MeNB | 2 |
| 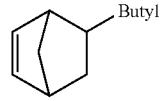 Butyl | BuNB | 3 |
| 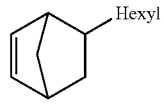 Hexyl | HexNB | 4 |
| 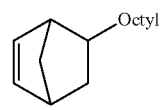 Octyl | OctNB | 5 |
| 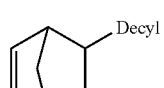 Decyl | DecNB | 6 |
| 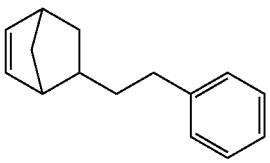 | PENB | 7 |
|  | TD | 8 |
| 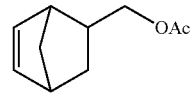 OAc | MeOAcNB | 9 |
| 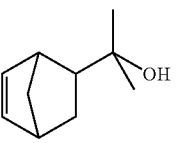 OH | NBXOH | 10 |
| 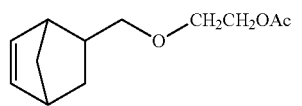 O—CH$_2$CH$_2$OAc | NBCH$_2$GlyOAc | 11 |
| 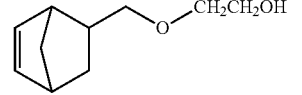 O—CH$_2$CH$_2$OH | NBCH$_2$GlyOH | 12 |
| 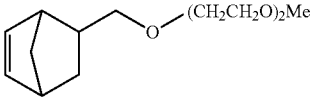 O—(CH$_2$CH$_2$O)$_2$Me | NBTON | 13 |
| 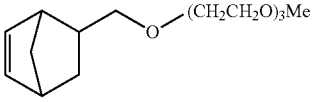 O—(CH$_2$CH$_2$O)$_3$Me | NBTODD | 14 |

| Structure | Name | # |
|---|---|---|
| norbornene-C₄F₉ | NBC₄F₉ | 15 |
| norbornene-CH₂C₆F₅ | NBCH₂C₆F₅ | 16 |
| norbornene-C₆F₅ | NBC₆F₅ | 17 |
| norbornene-CH₂-C₆H₃F₂ (3,4-difluoro) | NBCH₂C₆F₂ | 18 |
| norbornene-CH₂-C₆H₄-CF₃ | NBCH₂C₆H₄CF₃ | 19 |
| norbornene-(CH₂)$_p$-C₆F₅ | NBalkylC₆F₅ | 20 |
| norbornene-C(O)O-CH₂C₂F₅ | FPCNB | 21 |
| norbornene-C(O)O-CH₂CH₂C₄F₉ | FHCNB | 22 |
| norbornene-C(O)O-CH₂(CF₂)₃CF₂H | FOCHNB | 23 |
| norbornene-C(O)O-CH₂CF₂CF₂H | FPCHNB | 24 |
| norbornene-CH₂-O-C(O)-C₇F₁₅ | C₈PFAcNB | 25 |
| norbornene-CH₂-O-CF₂-CFH-OC₃F₇ | PPVENB | 26 |

-continued
| | | |
|---|---|---|
| 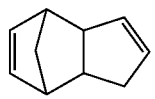 | DCPD | 27 |
| 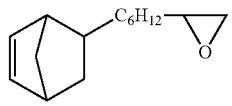 | EONB | 28 |
| 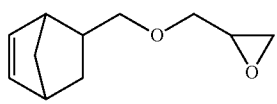 [SMILES: C1=CC2CC1CC2COCC1CO1] | MGENB | 29 |
| 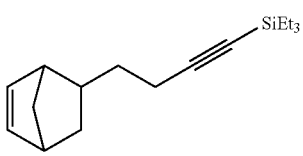 | AkSiNB | 30 |
| 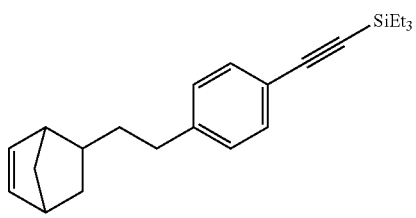 | ArSiNB | 31 |
| 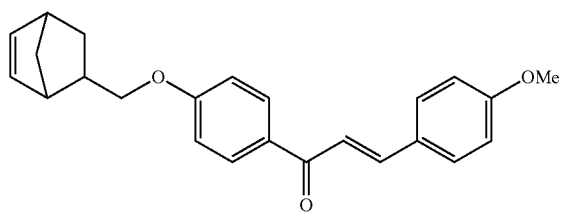 [SMILES: COc1ccc(/C=C/C(=O)c2ccc(OCC3CC4C=CC3C4)cc2)cc1] | MCHMNB | 32 |
| 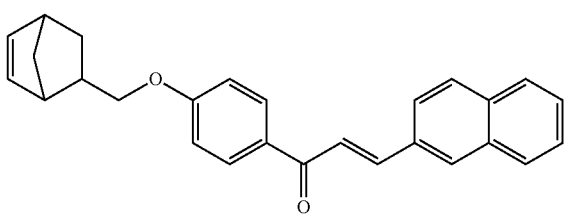 [SMILES: O=C(/C=C/c1ccc2ccccc2c1)c1ccc(OCC2CC3C=CC2C3)cc1] | NPCHMNB | 33 |
| 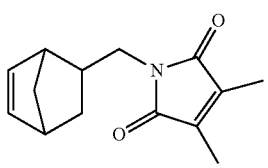 [SMILES: CC1=C(C)C(=O)N(CC2CC3C=CC2C3)C1=O] | DMMIMeNB | 34 |
| 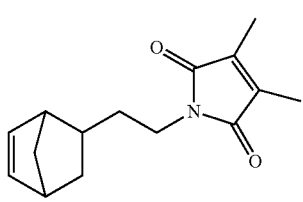 [SMILES: CC1=C(C)C(=O)N(CCC2CC3C=CC2C3)C1=O] | DMMIEtNB | 35 |

-continued
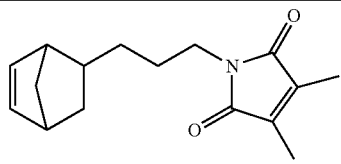 DMMIPrNB 36
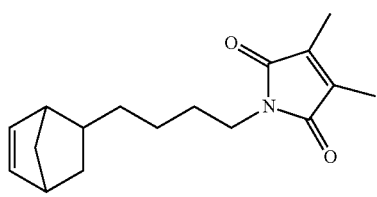 [SMILES: CC1=C(C)C(=O)N(CCCCC2CC3C=CC2C3)C1=O] DMMIBuNB 37
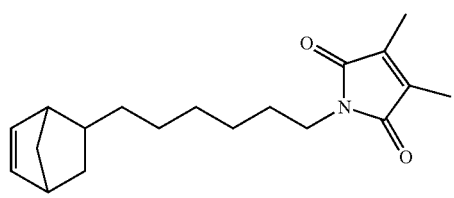 [SMILES: CC1=C(C)C(=O)N(CCCCCCC2CC3C=CC2C3)C1=O] DMMIHxNB 38
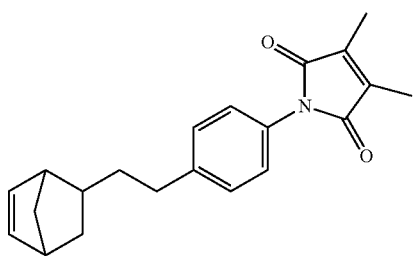 [SMILES: CC1=C(C)C(=O)N(c2ccc(CCC3CC4C=CC3C4)cc2)C1=O] EtPhDMMINB 39
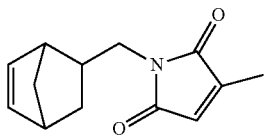 [SMILES: CC1=CC(=O)N(CC2CC3C=CC2C3)C1=O] MMIMeNB 40
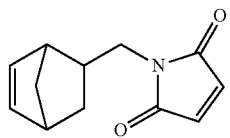 [SMILES: O=C1C=CC(=O)N1CC1CC2C=CC1C2] MINB 41
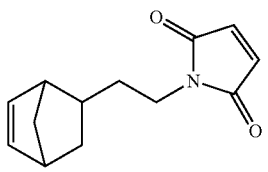 [SMILES: O=C1C=CC(=O)N1CCC1CC2C=CC1C2] MIENB 42
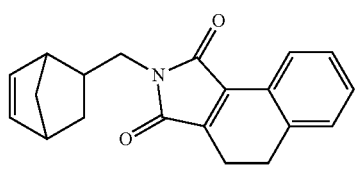 [SMILES: O=C1C2=C(C(=O)N1CC1CC3C=CC1C3)c1ccccc1CC2] DHNMINB 43
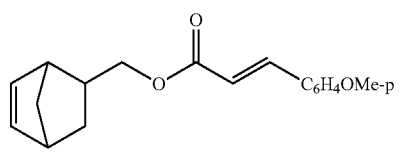 MeOCinnNB 44

-continued
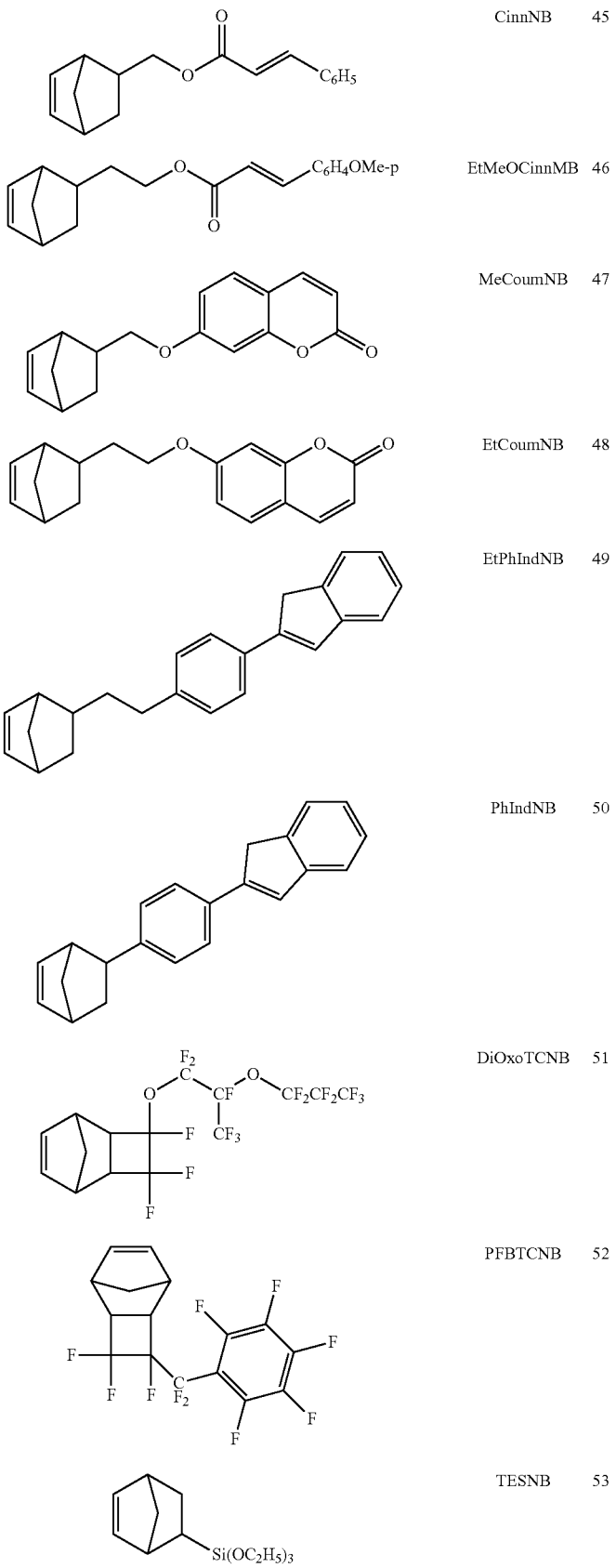
| | |
|---|---|
| CinnNB | 45 |
| EtMeOCinnMB | 46 |
| MeCoumNB | 47 |
| EtCoumNB | 48 |
| EtPhIndNB | 49 |
| PhIndNB | 50 |
| DiOxoTCNB | 51 |
| PFBTCNB | 52 |
| TESNB | 53 |

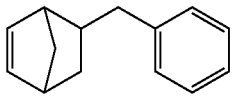 [SMILES: C1=CC2CC1CC2Cc1ccccc1] PMNB 54 where "Me" means methyl, "Et" means ethyl, "OMe-p" means para-methoxy, "Ph" and "$C_6H_5$" mean phenyl, "$C_6H_4$" means phenylene, "$C_6F_5$" means pentafluorophenyl, in subformulae 9 and 11 "OAc" means acetate, in subformula 25 "PFAc" means —OC(O)—$C_7F_{15}$, and for each of the above subformulae having a methylene bridging group (a $CH_2$ covalently bonded to both the norbornene ring and a functional group), including but not limited to 11-14, 16, 18, 19 and 54, it will be understood that the methylene bridging group can be replaced by a covalent bond or —$(CH_2)_p$— where p can be an integer from 1 to 6.

It will be further noted that while 54 specific examples are provided above, other monomers in accordance with embodiments of the present invention are inclusive of monomers represented by formulae Ia and IIa where at least one of $R^1$, $R^2$, $R^3$ and $R^4$ or $R^5$, $R^6$, $R^7$ and $R^8$ are hydrocarbyls, halohydrocarbyls, and perhalocarbyls, inclusive of heteroatoms, that include, —$(CH_2)_n$—$C(CF_3)_2$—OH, —$(CH_2)_n$—$C(CF_3)(CH_3)$—OH, $(CH_2)_n$—C(O)NHR*, $(CH_2)_n$—C(O)Cl, —$(CH_2)_n$—C(O)OR*, $(CH_2)_n$—OR*, —$(CH_2)_n$—OC(O)R* and —$(CH_2)_n$—C(O)R*, where n independently represents an integer from 0 to 10 and R* independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl. Exemplary perhalogenated alkyl groups include, but are not limited to, trifluoromethyl, trichloromethyl, —$C_2F_5$, —$C_3F_7$, —$C_4F_9$, —$C_7F_{15}$, and —$C_{11}F_{23}$. Exemplary halogenated or perhalogenated aryl and aralkyl groups include, but are not limited groups having the formula —$(CH_2)_x$—$C_6F_yH_{5-y}$, and —$(CH_2)_x$—$C_6F_yH_{4-y}$-p$C_zF_qH_{2z+1-q}$, where x, y, q, and z are independently selected integers from 0 to 5, 0 to 5, 0 to 9, and 1 to 4, respectively. Specifically, such exemplary perhalogenated aryl groups include, but are not limited to, pentachlorophenyl, pentafluorophenyl, pentafluorobenzyl, 4-trifluoromethylbenzyl, pentafluorophenylethyl, pentafluorophenpropyl, and pentafluorophenbutyl.

While each formula I, Ia, II and IIa, as well as each of the structural formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that some embodiments in accordance with the present invention are made to take advantage of such differences by using monomers that are either a mixture of isomers that is rich in either the exo- or endo-isomer or are essentially the pure exo- or endo-isomer.

Some embodiments of the present invention encompass polymers that have repeating units derived from monomers in accordance with formula Ia where one of $R^{1-4}$, for example $R^1$, is a fluorinated or perfluorinated alkyl, aryl or aralkyl group as described above and the others of $R^{1-4}$ are H. Specifically the monomer is one of $NBC_4F_9$. $NBCH_2C_6F_5$, $NBC_6F_5$, $NBCH_2C_6H_3F_2$, $NBCH_2C_6H_4CF_3$, FPCNB, FHCNB, FHCNB, FPCHNB, $C_8PFAcNB$ or PPVENB.

Some embodiments of the present invention encompass polymers that have repeating units derived from monomers in accordance with formula Ia where one of $R^{1-4}$, for example $R^1$, is a photoreactive or crosslinkable group as described above and the others of $R^{1-4}$ are H. Specifically the monomer is one of DCPD, EONB, MGENB, AkSiNB, ArSiNB, MCHMNB, NPCHMMNB, DMMIMeNB, DMMIEtNB, DMMIBuNB, MMMIMeNB, MIMeNB, MIEtNB, DMMIHxNB, EtPhDMMINB, DHNMINB, MeOCinnNB, CinnNB, EtMeOCinnNB, MeCoumNB, EtCoumNB, BuCoumNB, EtPhIndNB or PhIndNB.

Some embodiments of the present invention encompass polymers that have repeating units derived from monomers in accordance with formula Ia where one of $R^{1-4}$, for example $R^1$, is a polar group having a hydroxy, carboxy, acetoxy or oligoethyleneoxy moiety as described above and the others of $R^{1-4}$ denote H. Specifically the monomer is one of MeOAcNB, NBXOH, $NBCH_2GlyOAc$, $NBCH_2GlyOH$, NBTON or NBTODD.

Some embodiments of the present invention encompass polymers that have repeating units derived from monomers in accordance with formula Ia where one of $R^{1-4}$, for example $R^1$, is an alkyl group as described above and the others of $R^{1-4}$ denote H. Specifically the monomer is one of BuNB, HexNB, OctNB and DecNB.

One exemplary embodiment in accordance with the present invention encompasses a polymer having a first type of repeating unit derived from a fluorinated monomer as described above and a second type of repeating unit derived from a crosslinkable monomer, also described above. A specific example of such an embodiment is a polymer having repeating units derived from monomers in accordance with $NBCH_2C_6F_5$ and one of DMMIMeNB, DMMIEtNB, DMMIBuNB or DMMIHxNB.

Another specific example of such an exemplary embodiment is a polymer having repeating units derived from monomers in accordance with one of BuNB, HexNB, OctNB, DecNB or MeOAcNB and one of EONB, MGNEB, MMMIMeNB, DMMIMeNB, DMMIEtNB, DMMIBuNB or DMMIHxNB.

Other exemplary embodiments of the present invention encompass a polymer having two, three or more than three different types of repeating units in accordance with formula I or formula II, a polymer blend of a first polymer having a first type of repeating unit in accordance with formula I, and a second polymer having, at least, a first type of repeating unit and a second type of repeating unit in accordance with formula II. Alternately such polymer blends can encompass the aforementioned second polymer mixed with an alternative first polymer having two or more types of repeat units in accordance with formula I. Further, such polymer blends can encompass the aforementioned alternative first polymer mixed with an alternative second polymer having three types of repeat units in accordance with formula II.

Still other exemplary embodiments in accordance with the present invention encompass a polymer having at least one repeat unit in accordance with formula I and at least one repeat unit in accordance with formula II where the ratio of such formula I to formula II repeat units is from 95:5 to 5:95. In other such embodiments the ratio of repeat units is from 80:20 to 20:80 and in still other embodiments from 60:40 to 40:60 and in yet other embodiments from 55:45 to 45:55.

Another embodiment in accordance with the present invention encompasses a polymer blend of one or more polymers each having at least one type of repeat unit in accordance with formula I and one or more polymers having repeat units that are different from norbornene-type repeat units. These other polymers are selected from polymers including but not limited to poly(methyl methacrylate) (PMMA), polystyrene (PS), poly-4-vinylphenol, polyvinylpyrrolidone, or combinations thereof, like PMMA-PS and PS-polyacrylnitrile.

Examples of suitable norbornene monomers, polymers and methods for their synthesis are provided herein and can also be found in U.S. Pat. No. 5,468,819, U.S. Pat. No. 6,538,087, US 2006/0020068 A1, US 2007/0066775 A1 and US 2008/0194740 A1, which are incorporated herein by reference. For example, exemplary polymerizations processes employing Group VIII transition metal catalysts are described in the aforementioned US 2006/0020068 A1 at paragraphs [0053] and [0057].

The polymer embodiments of the present invention are formed having a weight average molecular weight ($M_w$) that is appropriate to their use. Generally, a $M_w$ from 5,000 to 500,000 is found appropriate for some embodiments, while for other embodiments other Mw ranges can be advantageous. For example, for some embodiments, it is advantageous for the polymer to have a $M_w$ from at least 30,000, while in others from at least 60,000. In some embodiments, the upper range of the polymer's $M_w$ is up to 400,000, while in others is up to 250,000. It will be understood that since an appropriate $M_w$, is a function of the desired physical properties in the cured polymer, films, layers or structures derived there from, it is a design choice and thus any $M_w$ within the ranges provided above is within the scope of the present invention.

Embodiments in accordance with the present invention encompass the use of a polymer composition for forming a gate insulator layer in organic electronic devices. Such a composition generally encompasses, in addition to one or more polymer components, a casting solvent, optionally having orthogonal solubility properties with respect to the OSC layer material, an optional crosslinking agent, an optional reactive solvent, an optional UV sensitizer, an optional adhesion promoter and an optional thermal sensitizer. The sensitizers and other additives are typically added to the composition prior to it being used to form the aforementioned gate insulator layer. Therefore, embodiments in accordance with the present invention encompass electronic devices or optoelectronic devices having or being obtained through the use of such polymer compositions. Such electronic or optoelectronic devices including, among others, field effect transistors (FETs) and organic field effect transistors (OFETs), thin film transistors (TFT) and organic thin film transistors (OTFTs) and integrated circuits (IC) as well as such devices as Radio Frequency Identification (RFID) tags. Where such electronic and optoelectronic device embodiments include transistors made through the use of such polymer compositions as gate insulator or dielectric layers, and where such transistors include both top gate and bottom gate transistors such as those depicted schematically in FIGS. 1 and 2.

When using polynorbornenes that include pendent maleimide groups as crosslinkable groups, some embodiments use commercially available UV sensitizers such as 1-chloro-4-propoxythioxanthone (CPTX), or other commercial UV sensitizers that absorb at wavelengths different than that of the maleimide group, thereby increasing the amount of absorbed incident light and undergoing a triplet-triplet energy transfer to the maleimide excited state. The sensitizer can be either incorporated within the polymer chain or added to the polymer composition as mentioned above. It is also possible to use a first compound of formula Ia or IIa with better absorption characteristics at a given wavelength, that is incorporated into a polymer formed from a second compound of formula Ia or IIa having the same latent reactive groups as the first compound. This can be achieved by adding a lower amount, for example 20%, of the first compound to a larger amount, for example 80%, of the second compound, and allowing curing to take place at the given wavelength. For example the compound DHNMINB (structure 43) absorbs well at 365 nm whereas the compound DMMIMeNB (34) does not, thus by adding e.g. 20% of DHNMINB to the DMMIMeNB allows curing to take place at 365 nm without the addition of a further UV sensitizer. The DMMIMeNB may undergo reaction with the DHNMINB, or alternatively, where the second component is not involved in the crosslinking, may be in-solubilized by the surrounding DHNMINB polymer network.

The epoxide crosslinking is achieved using pendant epoxide functionality in combination with an acid catalyst. This acid catalyst is typically an onium salt which undergoes dissociation on exposure to UV radiation or heat. In the case of a photo acid generator (PAG) the initiation generally requires a low UV dose of an appropriate wavelength followed by a thermal annealing at between 80 and 180° C. Generally, temperatures at the lower end of the aforementioned range are advantageous as higher temperatures can require a nitrogen atmosphere to prevent oxidation of the polymer. Alternatively, crosslinking can be thermally initiated and cured by baking at 180° C. for 30 min in a nitrogen atmosphere. Following the crosslinking process the polymer network can contain residual acid from the PAG. To prevent unwanted effects in the organic transistor device which contains the dielectric due to such residual acid, the crosslinked polymer can be subjected to a swelling solvent into which water and base are dissolved. In this manner, such residual acid can be captured, neutralized and/or solubilized then removed from the polymer by further washes with fresh swelling solvent.

In some embodiments in accordance with the present invention, apart from the addition of components directly related to the photo crosslinking, multi-component formulations can also be added to the norbornene-type addition polymer to improve certain other characteristics. These additional components include, among others, anti-oxidants, radical-scavengers, adhesion-promoting components, surface-modification components and morphology controlling components. Exemplary adhesion promoting compounds include, among others, silanes or sulphur containing compounds.

Further still, in some embodiments in accordance with the present invention, in the process for preparing a gate insulator layer a separate formulation, such as a formulation encompassing adhesion promoters or a scavenging reactive wash solution, is used in addition to the gate insulator polymer composition described herein.

Further embodiments of the present invention encompass electronic devices having or being obtained through the use of such polymer compositions. Such electronic devices including, among others, organic field effect transistors (OFET), thin film transistors (TFT), integrated circuits (IC) and Radio Frequency Identification (RFID) tags. Where such electronic device embodiments include transistors made through the use of such polymer compositions for forming gate insulator layers, such transistors can advantageously include both top gate and bottom gate transistors.

Figure 2:
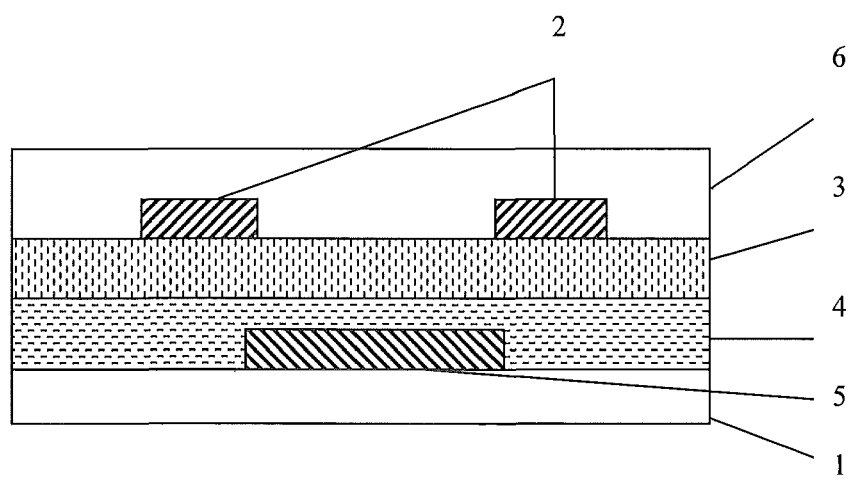
FIG. 2 depicts a bottom gate OFET device in accordance with embodiments of the present invention.

Turning now to the accompanying figures, FIG. 1 and FIG. 2 depict top and bottom gate organic field effect transistors, respectively, in accordance with embodiments of the present invention.

The top gate OFET device of FIG. 1 includes a substrate (1), source and drain electrodes (2), an OSC layer (3), a gate insulator layer (4), a gate electrode (5), and an optional second insulator or protection layer (6) to shield the gate electrode from further layers or devices that may be later provided.

Embodiments in accordance with the present invention encompass the process for preparing the device illustrated in FIG. 1 where a) source and drain electrodes (2) are formed on substrate (1), b) a layer of organic semiconducting (OSC) material (3) is formed overlying portions of substrate (1) and source and drain electrodes (2), c) a gate insulator layer (4) is formed overlying OSC material (3), d) gate electrode (5) is formed overlying at least a part of gate insulator layer (4) and e) optionally forming another layer (6), for example an insulating and/or protection and/or stabilizing and/or adhesive layer, overlying gate electrode (5) and gate insulator layer (4).

For some embodiments, the device shown in FIG. 1 is prepared where OSC layer (3) is formed on substrate (1) before source and drain electrodes (2) are formed.

The bottom gate OFET device of FIG. 2 includes a substrate (1), source and drain electrodes (2), an OSC layer (3), a gate insulator layer (4), a gate electrode (5), and an optional second insulator or protection layer (6) to shield the source and drain electrodes from further layers or devices provided on top of the OFET.

Embodiments in accordance with the present invention encompass the process for preparing the device illustrated in FIG. 2 where: a) gate electrode (5) is formed overlying substrate (1), b) gate insulator layer (4) is formed overlying gate electrode (5) and portions of substrate (1), c) organic semiconducting (OSC) material layer (3) is formed overlying gate insulator layer (4), d) source and drain electrodes (2) are formed on at least a part of organic semiconductor layer (3) and e) optionally forming another layer (6), for example an insulating and/or protection and/or stabilizing and/or adhesive layer, overlying source and drain electrodes (2) and portions of OSC layer (3).

For some embodiments, the device shown in FIG. 2 is prepared where source and drain electrodes (2) are overlying gate insulator layer (4) before the organic semiconductor layer (3) is formed.

In the process embodiments in accordance with the present invention, as described above with respect to FIGS. 1 and 2, the forming of some or all of the layers is carried out using solution processing techniques. This can be done for example by applying a formulation or composition, generally a solution, that encompasses, for example, the OSC or gate dielectric material, respectively, and at least one solvent, onto or over a previously deposited layer, followed by evaporation of the solvent(s). For forming the gate dielectric or insulator layer, a polymer composition embodiment of the present invention, as described above, is employed. Exemplary deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating, or pad printing. Generally spin coating, flexographic printing, or inkjet printing techniques are employed.

It will of course be understood that specific parameters of any of the above solution deposition techniques will be tailored for the specific layer being formed and the final characteristics desired of such layer and device that the layer is part of. For example, where in some OFETs a gate insulating layer having a thickness of 0.5 microns (μm) is desired, in other OFETs such a layer may be formed having a desired thickness of 1.0 μm. Thus the specific parameters needed to form the 1.0 μm layer will of course be different than those needed to form the 0.5 μm layer. That being said, when a spin coating deposition technique is employed, an appropriate amount of a polymer composition embodiment of the present invention is applied to a substrate and spun, for example, between 500 and 2000 rpm for a period of, for example, 20 to 50 seconds to form a layer having a desired thickness, for example between 0.2 and 1.5 After such layer is cast over the substrate, the substrate and layer are generally heated to remove residual volatile solvents. Such heating can be accomplished in an oven or by placing the substrate on a heated surface set to a temperature from 70 to 130° C., for a period of time from 1 to 30 minutes. It should be noted that where a spin coating technique is employed it is generally desirable to employ a solvent that is mostly evaporated after the spinning is completed, whereas when an inkjet or flexographic printing technique is used organic ketone solvents with a high boiling point are generally employed to extend equipment related processing times.

Some embodiments in accordance with the present invention encompass compositions that include one or more polymers or polymer blends as described above and below, and one or more solvents selected from organic solvents including, but not limited to, hydrocarbon solvents, aromatic solvents, cycloaliphatic cyclic ethers, cyclic ethers, esters, lactones, ketones, amides, cyclic carbonates, fluorinated or perfluorinated solvents or multi-component mixtures of the above. Exemplary solvents include cyclohexanone, mesitylene, xylene, toluene, tetrahydrofuran, methyl ethyl ketone (MEK), methyl n-amyl ketone (MAK), cyclohexanone, 4-methylanisole, butyl-phenyl ether, cyclohexylbenzene, propylene glycol methyl ether acetate (PGMEA), HFE7500, perfluoromethyldecalin and perfluoroperhydrophenanthrene.

Some embodiments of the present invention encompass solutions having a polymer concentration of from 0.1 to 30 wt %, while other embodiments have a polymer concentration of from 1 to 20 wt % and still other embodiments have a polymer concentration of from 2 to 12 wt %.

As mentioned above, some polymer composition embodiments in accordance with the present invention employ a crosslinkable or crosslinked polymer embodiment to form the gate insulator layer, or component thereof, in order to improve one or more properties of the resulting film. Such film properties include, among others, structural integrity, durability, mechanical resistivity, and solvent resistance. Suitable crosslinkable polymers are for example those having one or more repeating units derived from monomers in accordance with formula Ia wherein one or more of $R^{1-4}$ denote a crosslinkable group as described above, for example one of the DMMI-type monomers or one of EONB or MGENB.

For crosslinking, the gate insulator forming polymer is exposed to electron beam or electromagnetic (actinic) radiation such as X-ray, UV or visible radiation or IR radiation like for example focused IR (e.g., using a laser) for local thermal crosslinking. For example, actinic radiation may be employed to image the polymer using a wavelength of from 11 nm to 700 nm, such as from 200 to 700 nm. A dose of actinic radiation for exposure is generally from 25 to 5,000 mJ/cm², although higher energies can be employed where appropriate. Suitable radiation sources of actinic radiation include mercury, mercury/xenon, mercury/halogen and xenon lamps, argon or xenon laser sources, x-ray, or e-beam sources. Such exposure to actinic radiation is to cause crosslinking in exposed regions.

If desired, the gate insulator layer can be optionally post exposure baked at a temperature from 70° C. to 300° C., for example for a period of 1 to 10 minutes. Post exposure bake can be used to further promote crosslinking of other crosslinkable moieties within exposed portions of the polymer, where the increased temperature of such bake serves to further the degree of crosslinking within such exposed areas.

Polymer composition embodiments of the present invention are generally directed to forming a gate insulator layer in an electronic device. Such embodiments therefore encompass a polymer embodiment capable of forming such a layer. Such polymer embodiments of the present invention generally have one or more distinct types of repeating units, represented by formula I or II, where at least one of such repeating units encompasses crosslinkable pendent groups.

In some polymer composition embodiments in accordance with the present invention, a stabilizer material or moiety is included to prevent spontaneous crosslinking and improve shelf life of the polymer composition. Suitable stabilizers are antioxidants such as catechol or phenol derivatives that optionally contain one or more bulky alkyl groups, e.g. t-butyl groups, positioned ortho- to the phenolic OH group.

The physical integrity of the electronic device is a key element for the manufacturing of more complex structures, like for example active-matrix backplanes of flat panel electro-optical displays. Adhesion between the substrate and the stack of the built-above layers should be strong enough to withstand further processing, like for example air-curtain drying or wet-processing with the use of organic solvents. If the adhesion is not strong enough it is possible that the built-above layer will peel-off, for example in case of air-curtain drying, or will be moved over the substrate, for example when in case of wet processing the solvent gets between substrate and layer by capillary forces. This is even more important when plastic substrates are used, because the surface energy of untreated plastic is usually low so that adhesion forces are not high. Possible solutions suggested in prior art to overcome these problems include methods which chemically modify the surface of the substrate, like for example oxygen plasma treatment, or use substrates pre-coated with additional layers like for example metal oxide layers for plastic substrates. However, methods of chemical modification of e.g. dielectric polymers are limited as these may negatively influence their properties, like for example their solubility, or may negatively influence device performance.

Therefore, in some embodiments of the present invention, reactive adhesion promoters are used in addition to the crosslinkable polymer composition for forming the gate insulator layer. The reactive adhesion promoters encompass a first, crosslinkable functional group that is capable of reacting with the pendent crosslinkable group of the crosslinkable polycycloolefinic polymer, and a second functional group which is a surface-active group that is capable of interactions, for example chemical bonding, with adjacent device layers. Such adjacent device layers being, for example, a substrate, an underlying functional device layer onto which the gate insulator layer is deposited, or a functional layer that is deposited onto the gate insulator layer.

In a first type of these embodiments, the adhesion promoter is deposited on the substrate or layer, on which the gate insulator is later formed, before deposition of the crosslinkable polycycloolefinic polymer composition that will form the gate insulator layer. The adhesion promoter is deposited on the substrate for example by soaking the substrate with a solution of the adhesion promoter in a suitable solvent and then removing the solvent. The adhesion promoter forms a layer on the surface of the substrate, optionally under formation of chemical bonds with the substrate. Afterwards the crosslinkable polymer composition is deposited on the surface of the substrate covered with the layer of the adhesion promoter. After removal of any solvents, the crosslinkable groups of the adhesion promoter and of the crosslinkable polycycloolefinic polymer are crosslinked, for example by UV exposure.

The gate insulator layer according to this first type of embodiments can be prepared a) depositing on a substrate, or onto a device layer, which is for example a semiconductor layer or an electrode, an adhesion promoter which is optionally dissolved or dispersed in one or more organic solvents, b) if solvents are present, removing said solvents, thereby forming a layer of the adhesion promoter on the surface of the substrate c) depositing a layer of a crosslinkable polycycloolefinic polymer composition, which encompasses a crosslinkable polycycloolefinic polymer and optionally a solvent, on the surface of the substrate containing the adhesion promoter layer, d) if solvents are present, removing said solvents, and e) exposing the layer of the polycycloolefinic polymer to heat or actinic radiation that causes crosslinking of the crosslinkable groups of the adhesion promoter and the crosslinkable groups of the polycycloolefinic polymer, thereby forming the gate insulator layer.

In a second type of these embodiments the gate insulator is formed from a crosslinkable polymer composition which encompasses a crosslinkable polycycloolefinic polymer and an adhesion promoter additive comprising a surface-active functional group and a crosslinkable functional group capable of crosslinking with the said crosslinkable groups of the crosslinkable polycycloolefinic polymer.

The gate insulator layer according to the second type of these embodiments can be prepared by a) depositing onto a substrate, or onto a device layer, which is for example a semiconductor layer or an electrode, a layer of a crosslinkable polymer composition encompassing an adhesion promoter, a crosslinkable polycycloolefinic polymer and a solvent, b) removing the solvent, and c) exposing the layer of the polymer composition to heat or actinic radiation that causes crosslinking of the crosslinkable groups of the adhesion promoter and the crosslinkable groups of the polycycloolefinic polymer, thereby forming a gate insulator layer.

The use of such reactive adhesion promoters in a gate insulator layer polymer composition embodiment of the present invention advantageously can improve the adhesion of the layer formed therefrom to an underlying layer.

Thereby, the adhesion of the gate insulator layer can be improved without changing the polymer used to form the layer and potentially negatively affecting the layer's performance.

The surface active group of the reactive adhesion promoter can be, for example, a silane of the formula —$SiR^{12}R^{13}R^{14}$ or a silazane group of the formula —$NH-SiR^{12}R^{13}R^{14}$, wherein $R^{12}$, $R^{13}$ and $R^{14}$ are independently selected from halogen, silazane, $C_1$-$C_{12}$-alkoxy, $C_1$-$C_{12}$-alkylamino, optionally substituted $C_5$-$C_{20}$-aryloxy and optionally substituted $C_2$-$C_{20}$-heteroaryloxy, and wherein one or two of $R^{12}$, $R^{13}$ and $R^{14}$ may also denote $C_1$-$C_{12}$-alkyl, an optionally substituted $C_5$-$C_{20}$-aryl or an optionally substituted $C_2$-$C_{20}$-heteroaryl.

The crosslinkable group of the reactive adhesion promoter can be, for example, a maleimide, a 3-monoalkyl-maleimide, a 3,4-dialkylmaleimide, an epoxy, a vinyl, an acetyl, an indenyl, a cinnamate or a coumarin group. Further, the crosslinkable group can encompass a substituted or unsubstituted maleimide portion, an epoxide portion, a vinyl portion, a cinnamate portion or a coumarin portion.

In some embodiments in accordance with the present invention, the reactive adhesion promoter is represented by formula III $$G\text{-}A'\text{-}P \qquad \text{III}$$

wherein G is a surface-active group as defined above and below, A' is a single covalent bond or a connecting, spacer or bridging group, which is, for example, selected from $(CZ_2)_n$, $(CH_2)_n$—$(CH=CH)_p$—$(CH_2)_n$, $(CH_2)_n$—O, $(CH_2)_n$—O—$(CH_2)_n$, $(CH_2)_n$—$C_6Q_4$-$(CH_2)_n$, $(CH_2)_n$—$C_6Q_{10}$-$(CH_2)_n$, and C(O)—O, where each n is independently an integer from 0 to 12, p is an integer from 1-6, Z is independently H or F, $C_6Q_4$ is phenyl that is substituted with Q, $C_6Q_{10}$ is cyclohexyl that is substituted with Q, Q is independently H, F, $CH_3$, $CF_3$ or $OCH_3$ and P is a crosslinkable group as defined above and below.

Suitable compounds can be selected, for example, from those in accordance with formula A1, including, among others, DMMI-propyl-Si(OEt)$_3$, DMMI-butyl-Si(OEt)$_3$, DMMI-butyl-Si(OMe)$_3$ or DMMI-hexyl-Si(OMe)$_3$:

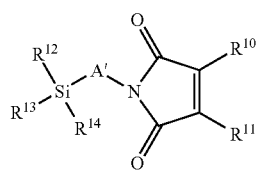

A1 where $SiR^{12}R^{13}R^{14}$ is a silane as defined above and A' is as defined above and below and $R^{10}$ and $R^{11}$ are each independently H or a $C_1$-$C_6$ alkyl group.

As used herein, the terms "spacer group" "connecting group" and "bridging group" are known to the skilled person (see e.g. Pure Appl. Chem. 73(5), 888 (2001).

Other useful spacer groups A' can include linear $C_1$ to $C_{30}$ alkylenes or branched $C_3$ to $C_{30}$ alkylenes or cyclic $C_5$ to $C_{30}$ alkylenes, each being unsubstituted or mono- or poly-substituted by F, Cl, Br, I or CN. Further, A', as defined above, can have one or more non-adjacent $CH_2$ groups replaced, in each case independently from one another, by —O—, —S—, —NH—, —$NR^{18}$—, —$SiR^{18}R^{19}$—, —C(O)—, —C(O)O—, —OC(O)—, —OC(O)—O—, —S—C(O)—, —C(O)—S—, —CH=CH— or in such a manner that O and/or S atoms are not linked directly to one another, and $R^{18}$ and $R^{19}$ are independently of each other H, methyl, ethyl or a $C_3$ to $C_{12}$ linear or branched alkyl.

Additionally, typical groups A' can encompass, for example, —$CH_2CH_2$—S—$CH_2CH_2$— or —$CH_2CH_2$—NH—$CH_2CH_2$— or —$(SiR^{18}R^{19}$—O)$_p$—, with p being an integer from 2 to 12 and $R^{18}$ and $R^{19}$ having the meanings given above.

The synthesis of adhesion promoters like those of formula A1 is disclosed in Examples AD1 as well as U.S. Pat. No. 4,565,873.

In order to improve the processing of the functional layers and the integrity of the electronic device, it is desirable to decrease the time needed for the process while keeping or improving the physical properties of the layers being formed. While such can generally be maintained where subsequent layers and solvents used in forming such layer are orthogonal and thus do not dissolve each other. Where such orthogonality is difficult to obtain, generally crosslinking, typically UV crosslinking, a first functional layer to make such first layer insoluble with respect to the polymer composition of, a second functional layer will prevent any influence of the properties of either layer on the other.

Shortening the time needed for the processing can be done for example by tuning the coating process, while decreasing the time needed for UV crosslinking can be achieved both by chemical adjustment of the dielectric polymer or by changes in the process.

However, chemical modifications of dielectric polymers are limited, because the UV sensitivity is related to certain properties of the polymer dielectric, and for example changes towards increased UV sensitivity may decrease the solubility. Changing the process, for example by using higher power UV, could increase the possibility of creating an ozone atmosphere and thus cause undesired changes in the surface of the polymer dielectric. Therefore, some polymer composition embodiments in accordance with the present invention encompass crosslinker additives. Such additives having two or more functional groups that are capable of reacting with the pendent crosslinkable groups of the polycycloolefinic polymer used to form the gate insulator layer. It will also be understood that the use of such a crosslinker additive can also enhance the crosslinking of the aforementioned polymer, thus enhancing the ability to pattern the gate insulator layer through the use of an imagewise exposure to an appropriate wavelength and dose of UV radiation. However, it should be realized that such patterning can generally be accomplished without such crosslinking additives.

The crosslinkable group of the crosslinker or crosslinking agent is, for example, selected from a maleimide, a 3-monoalkyl-maleimide, a 3,4-dialkylmaleimide, an epoxy, a vinyl, an acetyl, an indenyl, a cinnamate or a coumarin group. Further, the crosslinkable group can encompass a substituted or unsubstituted maleimide portion, an epoxide portion, a vinyl portion, a cinnamate portion or a coumarin portion.

In some embodiments the crosslinker is selected of formula IV1 to IV2

$$\text{P-X-P} \qquad \text{IV1}$$

$$H_{4-m}C(A''\text{-P})_m \qquad \text{IV2}$$

where X is A"-X'-A", X' is O, S, NH or a single covalent bond, A" is a single covalent bond or a connecting, spacer or bridging group, which is, for example, selected from $(CZ_2)_n$, $(CH_2)_n$—$(CH=CH)_p$—$(CH_2)_n$, $(CH_2)_n$—O, $(CH_2)_n$—O—$(CH_2)_n$, $(CH_2)_n$—$C_6Q_{10}$-$(CH_2)_n$, and C(O)—O, where each n is independently an integer from 0 to 12, p is an integer from 1-6, Z is independently H or F, $C_6Q_{10}$ is cyclohexyl that is substituted with Q, Q is independently H, F, $CH_3$, $CF_3$ or $OCH_3$ and P is as defined for formula III or as defined above and below, and m is 2, 3 or 4.

Suitable compounds can be, for example, selected from those in accordance with formula C1, including, among others, DMMI-butyl-DMMI, DMMI-pentyl-DMMI or DMMI-hexyl-DMMI:

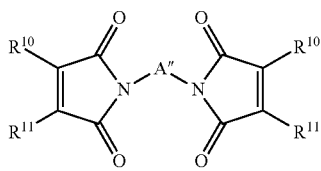

C1 where $R^{10}$ and $R^{11}$ are independently of each other H or a $C_1$-$C_6$ alkyl group, and A" is as defined in formula IV2.

Other useful spacer groups A" can include linear $C_1$ to $C_{30}$ alkylenes or branched $C_3$ to $C_{30}$ alkylenes or cyclic $C_5$ to $C_{30}$ alkylenes, each being unsubstituted or mono- or poly-substituted by F, Cl, Br, I or CN. Further, A', as defined above, can have one or more non-adjacent $CH_2$ groups replaced, in each case independently from one another, by —O—, —S—, —NH—, —NR$^{18}$—, —SiR$^{18}$R$^{19}$—, —C(O)—, —C(O)O—, —OC(O)—, —OC(O)—O—, —S—C(O)—, —C(O)—S—, —CH=CH— or —C≡C— in such a manner that O and/or S atoms are not linked directly to one another, and $R^{18}$ and $R^{19}$ are independently of each other H, methyl, ethyl or a $C_3$ to $C_{12}$ linear or branched alkyl.

Additionally, typical groups A" can encompass, for example, —CH$_2$CH$_2$—S—CH$_2$CH$_2$— or —CH$_2$CH$_2$—NH—CH$_2$CH$_2$— or —(SiR$^{18}$R$^{19}$—O)$_p$—, with p being an integer from 2 to 12 and $R^{18}$ and $R^{19}$ having the meanings given above.

The synthesis of crosslinkers like those of formula C1 is disclosed, for example, in U.S. Pat. No. 3,622,321.

The other components or functional layers of the electronic device, like the substrate, the electrodes, and the OSC layer, can be selected from standard materials, and can be manufactured and applied to the device by standard methods. Suitable materials and manufacturing methods for these components and layers are known to a person skilled in the art and are described in the literature.

While various substrates are used for the fabrication of organic electronic devices, for example a glass or plastic substrate, such plastic substrates are generally more prevalent. Exemplary plastic substrates include, but are not limited to, alkyd resins, allyl esters, benzocyclobutenes, butadiene-styrene copolymers, cellulose, cellulose acetate, epoxy resins, ethylene-chlorotrifluoroethylene copolymers, ethylene-tetra-fluoroethylene copolymers, fiber glass enhanced plastic, fluorocarbon polymers, hexafluoropropylenevinylidene-fluoride copolymer, high density polyethylene, parylene, polyamide, polyimide, polyetherimides, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, and silicones. While generally polyethyleneterephthalate, polyimide, and polyethylenenaphthalate are commonly used substrate materials a useful substrate can also encompass a metal or glass component coated with any of the above plastic materials. Further, it should be no surprise that employing a substrate with a uniform, homogeneous surface will generally result in good pattern definition. For top gate embodiments, the substrate may also be uniformly pre-aligned by extruding, stretching or rubbing to influence the orientation of the organic semiconductor in order to enhance carrier mobility.

The electrode can be deposited by liquid coating, such as spray-, dip-, web- or spin-coating, or by vacuum deposition or chemical vapor deposition methods. Suitable electrode materials and deposition methods are known to the person skilled in the art. Suitable electrode materials include, without limitation, inorganic or organic materials, or composites of the two.

Examples for suitable conductor or electrode materials include polyaniline, polypyrrole, PEDOT or doped conjugated polymers, further dispersions or pastes of graphite or particles of metal such as Au, Ag, Cu, Al, Ni or their mixtures as well as sputter coated or evaporated metals such as Cu, Cr, Pt/Pd or metal oxides such as indium tin oxide (ITO). Organometallic precursors may also be used deposited from a liquid phase.

The OSC materials and methods for applying the OSC layer can be selected from standard materials and methods known to the person skilled in the art, and are described in the literature.

In case of OFET devices, where the OFET layer is an OSC, it may be an n- or p-type OSC, which can be deposited by vacuum or chemical vapor deposition, or deposited from a solution. Desirable OSCs have a FET mobility of greater than $1 \times 10^{-5}$ cm$^2$V$^{-1}$s$^{-1}$.

The OSC is used for example as the active channel material in an OFET or a layer element of an organic rectifying diode. OSCs are generally deposited by liquid coating to allow ambient processing. Exemplary liquid coating methods include, but are not limited to, spray-, dip-, web- or spin-coating. In some embodiments in accordance with the present invention deposition by an ink-jet means is employed. Additionally, in some embodiments the OSC may be vacuum deposited or chemical vapor deposited.

The semiconducting channel may also be a composite of two or more of the same types of semiconductors. Furthermore, a p-type channel material may, for example be mixed with n-type materials for the effect of doping the layer. Multilayer semiconductor layers may also be used. For example the semiconductor may be intrinsic near the insulator interface and a highly doped region can additionally be coated next to the intrinsic layer.

The OSC material may be any conjugated molecule, for example an aromatic molecule containing at least three aromatic rings. In some embodiments of the present invention the OSC contains aromatic rings selected from 5-, 6-, or 7-membered aromatic rings, and in other embodiments the OSC contains aromatic rings selected from 5- or 6-membered aromatic rings. The OSC material may be a monomer, oligomer or polymer, including mixtures, dispersions and blends of one or more of monomers, oligomers, or polymers.

Each of the aromatic rings of the OSC can optionally include one or more hetero atoms selected from Se, Te, P, Si, B, As, N, O or S, where generally such hetero atoms are selected from N, O, or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N(R$^{15}$)(R$^{16}$), where no more than one of $R^{15}$ and $R^{16}$ is H, and one or both are independently a substituted alkyl, optionally substituted aryl, alkoxy or polyalkoxy groups, and where either $R^{11}$ and $R^{12}$ is alkyl or aryl these may be fluorinated or perfluorinated.

The rings may be optionally fused or may be linked with a conjugated linking group such as —C(T$^1$)=C(T$^2$)-, —N(R')$_2$—, —N=C(R')—. $T^1$ and $T^2$ each independently represent H, Cl, F, or —C≡N or $C_{1-4}$ alkyl groups; R' represents H, optionally substituted alkyl or optionally substituted aryl. Where R' is alkyl or aryl these may be optionally fluorinated.

Other OSC materials for embodiments in accordance with the present invention include compounds, oligomers and derivatives of compounds selected from conjugated hydrocarbon polymers such as polyacene, polyphenylene, poly (phenylene vinylene), polyfluorene including oligomers of those conjugated hydrocarbon polymers; condensed aromatic hydrocarbons such as tetracene, chrysene, pentacene, pyrene, perylene, coronene, or soluble, substituted derivatives of these; oligomeric para-substituted phenylenes such as p-quaterphenyl (p-4P), p-quinquephenyl (p-5P), p-sexiphenyl (p-6P), or soluble substituted derivatives of these; conjugated heterocyclic polymers such as poly(-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianapthene, poly (N-substituted pyrrole), poly(-substituted pyrrole), poly(3,4-bisubstituted pyrrole), polyfuran, polypyridine, poly-1,3,4-oxadiazoles, polyisothianaphthene, poly(N-substituted aniline), poly(-substituted aniline), poly(3-substituted aniline), poly(2,3-bisubstituted aniline), polyazulene, polypyrene; pyrazoline compounds; polyselenophene; polybenzofuran; polyindole; polypyridazine; polytriarylamine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9, 10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2', 3'-d]thiophene); 2,8-dialkyl, substituted dialkyl, diaryl or substituted diaryl anthradithiophene; 2,2'-bibenzo[1,2-b:4,5-b]dithiophene. In some embodiments, the above OSC compounds and derivatives thereof are soluble in an orthogonal solvent.

In some embodiments in accordance with the present invention, the OSC materials are polymers or copolymers encompassing one or more repeating units selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2, 5-diyl, or 3-substituted selenophene-2,5-diyl.

In other embodiments in accordance with the present invention, the OSC materials are substituted oligoacenes such as pentacene, tetracene or anthracene, or heterocyclic derivatives thereof, like bis(trialkylsilylethynyl) oligoacenes or bis (trialkylsilylethynyl)heteroacenes, as disclosed for example in U.S. Pat. No. 6,690,029, WO 2005/055248 A1 or U.S. Pat. No. 7,385,221.

In another embodiment of the present invention the OSC layer encompasses one or more organic binders to adjust the rheological properties as described for example in WO 2005/055248 A1.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by an alternative feature serving the same, equivalent or similar purpose. Thus, unless stated otherwise, each feature disclosed should be viewed as being merely exemplary, that is to say such a feature is a generic representation inclusive of all species therein.

It will be further appreciated that the features disclosed in this specification may be combined to produce embodiments in accordance with the present invention except where a combination includes features and/or steps that are mutually exclusive. Further, it will be appreciated that many of the features described above, are inventive in their own right and not just as part of an embodiment of the present invention.

The invention will now be described in more detail by reference to the following examples, which are illustrative only and do not limit the scope of the invention.

Unless stated otherwise percentages are percent by weight and temperatures are given in degrees Celsius.

In the examples that follow, synthetic routes to some exemplary monomers and methods for the polymerization of such monomers are demonstrated. These examples are in no way limiting to the scope of embodiments in accordance with the present invention. Additionally, it will be noted that for each of the synthetic routes and polymerizations, generally employ anhydrous and oxygen free conditions unless otherwise noted. That is to say that where an example instructs that a reaction vessel is charged with a solvent, the solvent meets the above condition and/or is sparged with an inert gas such as nitrogen to remove any dissolved oxygen and water.

A. Monomer Synthesis.

EXAMPLE A1

Synthesis of DMMIMeNB

Dimethyl maleic anhydride (679 g, 5.39 mol) and 6 L toluene were charged to a 12 L flask fitted with a mechanical stirrer, Dean-Stark trap, condenser, and thermocouple. The mixture cooled to 16° C. as the dimethylmaleic anhydride dissolved in the toluene. To the mechanically stirred mixture 663 g of 99% aminomethylnorbornene (5.39 mol) was added with a 600 ml toluene rinse. An exotherm to 34° C. was immediately observed and the mixture was slowly heated (to avoid excessive foaming) until reflux was observed. At 109° C., approximately 1.5 h from the start of heat-up, the solution cleared. 98 ml of water (>100% of theoretical) was collected in the Dean Stark trap indicating that the reaction was complete, which was confirmed by GC analysis. The mixture was then allowed to cool to room temperature, filtered, and the filtrate rotary evaporated to yield 1656 g (>100% yield) of a light brown liquid, 98.9% pure (GC). To this was added 128 g remaining from a previous batch of crude material and and both batches were then vacuum distilled. A forerun of 132 g was collected and found to contain 96.8% purity product and unreacted dimethylmaleic anhydride. In addition, a first fraction of 281 g, 99.4% purity product was collected at 146-149° C. (0.78-1.15 Torr) and a second fraction of 920 g, 99.8% purity product was collected at 149° C. (1.15-1.55 Torr). The combined first and second fraction of >99% purity product was 1201 g for a 87% yield.

EXAMPLE A2

Synthesis of MIEtNB

Maleic anhydride (389 g, 3.96 mol), ground in a mortar, and 6300 ml xylenes were charged to a reaction vessel equipped with mechanical stirring, a condenser, a Dean Stark trap and a thermocouple. The temperature was observed to drop to 19° C., while yielding a hazy solution. Aminoethylnorbornene (90.1% purity, 600 g, 3.94 mol) was added dropwise over a 20 minute period to the stirred mixture, causing the temperature to rise to 49° C. and giving a deep amber solution. The solution was heated to reflux and after 5 hours 40 minutes the water take-off into the Dean-Stark trap was seen to essentially stop; 49 ml (68% of theoretical) of water was collected. A proton NMR analysis of the reaction mixture showed a very weak amido-acid signal at 6.3-6.45 ppm and GC analysis showed 86.8% of the desired product. The reaction was allowed to cool to room temperature and filtered to remove 72 g of a white solid. One-half of the reaction mixture, 3500 ml, was loaded directly onto a column of silica gel (1280 g) and the reaction solution was eluted from the silica column. The initial 1000 ml of eluent showed no product (by TLC with 2.5% methanol/dichloromethane), but the second 1000 ml, mainly xylenes, showed one spot on TLC and was rotary evaporated to give 61 g of product (A2). The silica gel was flushed with dichloromethane, giving three successive 1000 ml fractions (A3, A4, and A5 respectively) containing 150 g impure product. The remaining reactant solution, 3500 ml in xylenes, was loaded onto 1273 g silica and flushed with recycled xylenes. The first three 1000 ml xylenes fractions (B1-B3) each showed one spot on TLC. The next 1000 ml fraction, B4, obtained with toluene as the eluent, gave one spot on TLC, but the next two 1000 ml toluene fractions (B5 and B6) showed weak levels of product in presence of other by-products. Fractions A2, B 1, B2, B3, and B4 were combined and rotary evaporated to give 223 g of an oil which crystallized on standing. This was 97.4% pure by GC. This was recrystallized from 150 ml hot heptane to yield 124 g at 99.9% purity. A second crop yielded 22 g at 99.7% purity.

EXAMPLE A3

Synthesis of MIMeNB

Maleic anhydride (117 g, 1.19 mol), charged to a reaction vessel equipped with mechanical stirring, a Dean Stark trap, a condenser and a thermocouple, was mixed with 860 ml o-xylene, causing the temperature to drop to 17° C., while yielding a hazy solution. Aminomethylnorbornene (98% purity, 1.17 mol) was dissolved in 144 ml o-xylene and added dropwise over a 15-minute period to the stirred mixture, causing the temperature to rise to 64° C. and resulting in a white slurry. The mixture was mechanically stirred while heating to reflux for 5 hours. Water take-off in the Dean Stark trap stopped at 13.5 ml (64% of theoretical) after 4.5 h. TLC (2.5% methanol/dichloromethane) and NMR confirmed the presence of product and the absence of non-cyclized amido acid. The reaction was allowed to cool to room temperature, filtered to remove precipitated white solids, and split into two 600 ml portions. Each portion was independently loaded onto 1000-1,100 g of silica and flushed with 6000 ml of dichloromethane. Rotary evaporation of the combined elutants gave 89 g crystalline product which was recrystallized from 40 ml hot heptane to give 81 g product at 99.4% purity. NMR analysis showed the product contained as much as 5.7 mol % o-xylene. The crystals were rotary evaporated under high vacuum at 45° C. to remove the o-xylene, but subsequent NMR analysis revealed the presence of 1.8% maleic anhydride (believed to be masked by o-xylene in earlier analyses). The crystals were rotary evaporated again under high vacuum at 65-75° C. to give product showing <0.6 wt % maleic anhydride by NMR. GC analysis showed 99.4% purity and no detectable maleic anhydride. Yield was 77 g (33% yield), mp 69.1-71.3° C. (glasses at 66.1-68.6° C.).

EXAMPLE A4

Synthesis of exo-DMMIEtNB

Dimethylmaleic anhydride (18.75 g, 0.149 mol), was charged to a reaction vessel equipped with mechanical stirring, a Dean-Stark trap, a condenser and a thermocouple, was dissolved in 120 ml toluene, causing the solution to cool to 18° C. A toluene slurry of solid exo-aminoethylnorbornene (20.4 g, 0.149 mol) was added to dimethylmaleic anhydride solution and precipitation of white solids immediately occurred. The reaction mixture was mechanically stirred as the reaction was heated to reflux. At 102° C., reflux began and the solution cleared. After 17 minutes at reflux, the theoretical amount of water had been collected in the Dean-Stark trap. The reaction was heated an additional two hours at reflux and then cooled to 9° C. The mixture was then filtered to remove solids and the filtrate rotary evaporated to yield 43.7 g. This was distilled in the Kugelrohr oven to collect 17.9 g (46% yield) at 175-185° C. (<1 mbar). GC analysis showed 99.0% purity.

EXAMPLE A5

Synthesis of MMIMeNB

Citraconic anhydride (352 g, 3.15 mol) and 1500 ml of toluene were charged to a 5 L flask fitted with a mechanical stirrer, Dean-Stark trap, condenser, and thermocouple. The mixture was observed to cool to 16° C. as the citraconic anhydride dissolved in the toluene. To the mechanically stirred mixture, 99% aminomethylnorbornene (387 g, 3.15 mol) and a 600 ml toluene rinse were added. The mixture immediately became a solid mass and exhibited an exotherm to 39° C. The mixture was heated carefully (to avoid excessive foaming) to reflux. At 110° C., approximately 1.5 h from the start of heat-up, the solution cleared and 56 ml water (>100% of theoretical) was collected in the Dean-Stark trap. GC analysis revealed the reaction was complete. The mixture was allowed to cool to room temperature and filtered. The filtrate was then rotary evaporated to yield 672 g (98.2%) of a light brown liquid, (97.9% pure by GC). The crude material was vacuum distilled to give 624 g, 99.1% purity, at 125-128° C. (1.15-1.2 Torr).

EXAMPLE A6

Synthesis of DMMIBuNB

A 1 L, 4 neck RBF equipped with a thermowell, condenser with a nitrogen inlet, addition funnel and mechanical stirrer was charged with 200 mL of toluene followed by potassium DMMI (35 g, 0.21 mol) and 18-crown-6 (5.7 g, 0.021 mol, 10 mol %) with stirring. The addition funnel was charged with endo-/exo-NBBuBr (45 g, 0.20 mol) in 200 mL toluene and added over 5 minutes. The mixture was heated to 100° C. and an off-white slurry was observed. The mixture was continued to be stirred at for an additional 6.5 hours at 100° C. and the color changed from the first observed off-white to dark green and then reddish brown. The reaction was monitored by GC which revealed the reaction was complete with 73.6% product and 15.6% unreacted exo-/endo-NBBuBr. The reaction mixture was then cooled to room temperature and then quenched with the addition of 250 mL water and then diluted with 150 mL toluene. The aqueous layer was extracted with (2×200 mL) $CH_2Cl_2$ and organic layers washed with brine, dried over $Na_2SO_4$, filtered and evaporated to give 55 g of crude product as a brown oil. The crude product was adsorbed onto 55 g $SiO_2$ and chromatographed over 330 g of $SiO_2$ eluting with pentane (3 L), 2% EtOAc in pentane (5 L), 3% EtOAc in heptane (3 L) and 4% EtOAc in heptane (2 L). The concentrated purified fractions yielded 31 g of product as a colorless viscous oil (58% yield) with 99.3% purity by HPLC and another fraction of 7.0 g product (13.1% yield) with 99.09% purity by HPLC. The combined yield for the reaction was 71%. $^1H$ NMR and MS were consistent with the structure of DMMIBuNB.

EXAMPLE A7

Synthesis of MeOCinnNB

4-Methoxycinnamoyl chloride: A first 3 L, 4 necked round bottomed flask (RBF) was equipped with a mechanical stirrer, thermowell, and a condenser with nitrogen adapter. The RBF was charged with 4-methoxycinnamic acid (175 g, 982 mmol) and 0.1 mL dry pyridine in 2 L dry toluene. The addition funnel was charged with 107.2 mL (1.473 mol) $SOCl_2$ which was then added slowly to the reaction mixture at room temperature. The reaction mixture was heated to reflux and monitored by GC analysis (aliquots were withdrawn periodically, quenched with MeOH, and analyzed). After 5 hours, the GC analysis indicated that the reaction was complete and the reaction mixture was allowed to cool to room temperature. Excess $SOCl_2$ and toluene were removed by rotary evaporation and the crude product was purified by distillation to give 182 g of 4-methoxycinnamoyl chloride (94% yield) with 98.9% purity by GC.

$NBCH_2O_2CCH$=$CHC_6H_4OMe$ (MeOCinnNB): A second 3 L, 4 necked RBF was equipped with a thermowell, a condenser with nitrogen adapter, addition funnel, and mechanical stirrer was charged with $NBCH_2OH$ (100 g, 805 mmol), dimethylaminopyridine (DMAP) (4.9 g, 40 mmol, 5 mol %), 563 mL triethylamine (4.03 mol) and 1.2 L dichloromethane. The mixture was stirred at room temperature for 45 minutes during which time the addition funnel was charged with 4-methoxycinnamoyl chloride (174 g, 0.885 mol), obtained as above, dissolved in 400 mL dichloromethane. After addition of the 4-methoxycinnamoyl chloride at room temperature, the mixture was stirred at 25° C. overnight. After confirmation of complete reaction by GC the reaction mixture was diluted with 1 L dichloromethane, and the resultant solution washed with (2×2 L) $NaHCO_3$ solution, (2×1 L) $NH_4Cl$ solution, (2×2 L) brine, then dried over $Na_2SO_4$, filtered, and the filtrate evaporated resulting in the collection of 208 g of crude product. This was then adsorbed onto 200 g silica and chromatographed over 600 g of silica gel eluting with 0% to 30% EtOAc in cyclohexane. The concentrated purified fractions yielded 133 g of product as colorless, viscous oil (58% yield) with 98.1% purity by GC. Additional fractions were combined to give another 72 g product with purity >96% by GC, bringing the total yield 88% (205 g).

EXAMPLE A8

Synthesis of MeCoumNB $NBCH_2OTs$: A first 3 L, 4 necked RBF equipped with a mechanical stirrer, thermowell, addition funnel, and condenser with nitrogen adapter was charged with tosyl chloride (377 g, 1.93 mol) and $NBCH_2OH$ (200 g, 1.61 mol) in 800 mL dry dichloromethane. The addition funnel was charged with 270 mL (1.93 mol) triethylamine and the charge added slowly to the reaction mixture at 0° C. The reaction mixture was stirred at room temperature while the reaction was monitored by TLC/GC. TLC monitoring indicated that the reaction was complete after 48 h. The reaction mixture was then diluted with 1 L dichloromethane, followed by washes with 1 L water, (2×1 L) $NaHCO_3$ solution, (2×1 L) brine, drying over $Na_2SO_4$ and filtration. The filtrate was then evaporated giving 463 g of crude product which was then adsorbed onto 450 g silica and chromatographed over 1600 g of silica gel eluting with 0% to 10% EtOAc in cyclohexane. The concentrated purified fractions of the chromatography yielded 427 g of product as colorless viscous oil (95% yield) with 95.3% purity by GC; Proton NMR was consistent with the structure.

MeCoumNB: A second 3 L, 4 necked RBF equipped with a thermowell, condenser with nitrogen adapter, and mechanical stirrer was charged with 7-hydroxycoumarin (168 g, 1.04 mol), potassium carbonate (179 g, 1.29 mol), $NBCH_2OTs$ (300 g, 1.08 mol) and rinsed with 1.5 L dry NMP. The mixture was heated to 100° C. and stirred while the reaction was monitored by TLC/$^1H$ NMR. Proton NMR indicated the reaction was completed after 54 h and the reaction mixture was then allowed to cool to room temperature. The reaction mixture was then quenched with 24 L 1N HCl, the resultant off-white solid that precipitated was filtered, washed with 4 L water and dried to give 268 g of crude product. This product was charged to a 5 L RBF, dissolved in 2 L (3:1 ratio) heptane: toluene and refluxed with 26.8 g of charcoal and filtered through a pad of silica. The filtrate was concentrated and added to an excess of heptane:toluene (3:1 ratio) to give 158 g (57% yield) of pure white crystalline product with 98.2% purity by HPLC.

EXAMPLE A9

Synthesis of EtMeOCinnNB

5-Norbornene-2-ethanol ($NBCH_2CH_2OH$): A 19-liter Parr Reactor was charged with 611 g (4.6 mol) dicyclopentadiene and 2000 g (27.7 mol) 3-buten-1-ol. While stirring, the reactor was flushed three times with nitrogen and then sealed under 10 psi nitrogen pressure. The reaction was brought to 220° C. over a period of 2 hr 17 min, the pressure was observed to reach a maximum of 185 psi. The reaction was stirred for 4 hours at 220° C., the pressure dropping to 130 psi. The reaction mixture was then allowed to cool to room temperature and drained, 2603 g of reaction mixture was collected. GC analysis indicated the product mixture to contain 65.6% NBEtOH isomers by GC (3-buten-1-ol is also present, but not calculated because it is in the solvent front). Excess 3-buten-1-ol, 1260 g, was removed by rotary evaporation at 50° C. The resultant concentrate was purified by distillation under high vacuum through a 14" column with glass helices packing. Fractions 4 and 5 were found to be 96.1% and 95.6% pure and were collected. In each fraction, the trimer of DCPD, F4 ~3.4% and F5 3.5% was also found to be present. Total yield, with purity >95% (F4+F5)=722 g. % Yield=56%.

$NBCH_2CH_2O_2CCH$=$CHC_6H_4OMe$ (EtMeOCinnNB): A 100 mL, 3 neck RBF equipped with a thermowell, addition funnel, and mechanical stirrer was charged with $NBCH_2OH$ (2 g, 14.47 mmol), DMAP (88.4 mg, 0.72 mmol, 5 mol %), 10.1 mL triethylamine (72.4 mmol) and 25 mL dichloromethane. The mixture was stirred at room temperature for 45 minutes before the addition of 4-methoxycinnamoyl chloride (3.1 g, 15.9 mmol) in 5 mL dichloromethane from the addition funnel was started. After this addition was completed, the mixture was stirred at 25° C. overnight. After confirmation of complete reaction by GC the reaction mixture was diluted with 20 mL dichloromethane, followed by washes with (2×25 mL) NaHCO$_3$ solution, (2×15 mL) NH$_4$Cl solution, (2×25 mL) brine, dried over Na$_2$SO$_4$ and filtered. Concentration of the filtrate gave 3.9 g of crude product as a colorless, viscous oil (93% crude yield) with 96% crude purity by GC.

EXAMPLE A10

Synthesis of EtCoumNB

NBCH$_2$CH$_2$CH$_2$OTs: A 5 L, 4 neck RBF equipped with a mechanical stirrer, thermowell, addition funnel, and condenser with nitrogen adapter was charged with tosyl chloride (CH$_3$C$_6$H$_4$SO$_2$Cl=TsCl) (745 g, 3.9 mol) and NBCH$_2$CH$_2$OH (450 g, 3.26 mol) and 2 liters dry dichloromethane. The addition funnel was charged with 547 mL (3.9 mol) triethylamine and added slowly to the reaction mixture previously chilled to 0° C. Stirring at room temperature was continued while the reaction was monitored by TLC/$^1$H NMR. After 24 hours, a proton NMR analysis indicated that the reaction was complete. The reaction mixture was then diluted with 4 L dichloromethane, followed by washes with 2 L water, (2×1 L) NaHCO$_3$ solution, (2×1 L) brine, dried over Na$_2$SO$_4$, filtered, and the filtrate rotovapped to give 1064 g of crude product as a colorless viscous oil (110% crude yield) with >95% purity by $^1$H NMR (consistent with the structure). The crude product was used for next reaction without further purification.

EtCoumNB: A 12 L, 4 neck RBF equipped with a thermowell, condenser with nitrogen adapter, and mechanical stirrer was charged with 7-hydroxycoumarin (450 g, 2.77 mol), 3.5 L dry NMP, potassium carbonate (498.6 g, 3.6 mol), NBCH$_2$CH$_2$OTs (932.6 g, 3.19 mol) and 1 L dry NMP. The mixture was heated with stirring to 100° C. and monitored by TLC/NMR. The TLC/$^1$H NMR monitoring indicated that the reaction was completed after 24 h and the reaction mixture was allowed to cool to room temperature. Then the reaction was quenched with 50 L 1N HCl, causing the product to precipitate as an off-white solid that was filtered, washed with (5×4 L) water and dried to give 1394 g of crude product. The 1394 g crude product was dissolved in 4 L dichloromethane. About 500 mL of water separated and was removed; the remaining dichloromethane solution was then dried over Na$_2$SO$_4$, filtered, and evaporated to give 864 g of crude product. The 864 g crude product was combined with 60 g of a pilot reaction's crude product and dissolved in dichloromethane and adsorbed onto 1000 g silica and chromatographed over 4 kg silica gel eluting with 0% to 25% EtOAc in cyclohexane. The concentrated purified fractions yielded 508 g of product as a fluffy light yellow solid with >97% purity by HPLC. The product was then recrystallized from 1.6 L refluxed heptane:toluene (4:1 ratio) to give 480 g (57% yield) of pure white crystalline powder product with 99.3% purity by HPLC; $^1$H NMR was consistent with the structure.

EXAMPLE A11

Synthesis of AkSiNB

NBCH$_2$CH$_2$OMs: A 12 L, 4 necked RBF equipped with a thermowell, nitrogen adapter, addition funnel and mechanical stirrer was charged with 5-(2-hydroxyethyl)norbornene (420 g, 3.03 mol), 4 L dichloromethane, and methanesulfonyl chloride (CH$_3$SO$_2$C$_1$ or MsCl) (369 g, 3.22 mol). An extra 500 ml dichloromethane was added to rinse in the CH$_3$SO$_2$C$_1$. The stirred mixture was chilled to −16° C. and triethylamine (371 g, 3.64 mol) was added dropwise over a 1.5 hr period, the temperature was observed to increase to 0° C. during the addition. The resulting slurry was allowed to continue to warm to 189° C. over a 4 hr period and then 2 L water was added with continued stirring. After the water addition was completed, the phases were allowed to separate and the aqueous phase extracted with 2 L dichloromethane. The combined dichloromethane extracts were washed with (2×2 L) NaHCO$_3$ solution followed by 1600 mL of 1 N HCl and then washed with brine in 2000 mL portions until a wash pH=6 was observed. The dichloromethane solution was then dried over sodium sulfate, filtered, and rotary evaporated to give 613 g of a red liquid. NMR was consistent with structure. GC analysis gave mesylate content at 93.2%. No further purification was attempted since the material demonstrated instability during distillation.

NBCH$_2$CH$_2$Br: A 22 L reactor equipped with a thermowell, nitrogen adapter, addition funnel and mechanical stirrer was charged with lithium bromide (369 g, 4.25 mol) and 4 L of 2-pentanone and stirred until the LiBr was dissolved, after which the solution warmed to 30° C. Norborneneethylmethanesulfonate (613 g, 2.83 mol) dissolved in 2 L of 2-pentanone was then added to the LiBr solution with stirring and then diluted further with an additional 2 L of 2-pentanone (total volume of 2-pentanone=8 L). The solution was then heated to reflux, and was observed to become a white slurry. Upon reaching 92° C., GC analysis indicated <0.8% starting material remained and after 1 h at reflux, GC analysis showed no remaining starting material. The mixture was cooled to 27° C. and 4 L distilled water was added to clear the mixture. The phases were separated and the aqueous phase extracted with (2×2 L) ethyl acetate. The organic portions were combined and rotary evaporated at <30° C. The residue was transferred to a separatory funnel using 4 L of dichloromethane as a rinse solvent. The product was washed with (2×1 L) saturated sodium bicarbonate followed by 1 L brine washes until a final wash pH=7 was obtained. The product was dried over sodium sulfate, filtered, and the filtrate rotary evaporated to give 440 g of crude product (93.6% purity by GC). The crude product was then vacuum distilled using a 14-inch Vigreux column where the following fractions were collected: 1. 17° C. (10 Torr)-43° C. (1.15 Torr), 20.6 g, 97.5% by GC, no 2-pentanone by NMR; 2. 42° C. (0.83 Torr)-44° C. (0.33 Torr), 334.2 g, 98.0% by GC; 3. 32° C. (0.3 Torr)-44° C. (0.32 Torr), 53 g, 93.5% by GC, 3.5% CPD trimer. Total yield of >93% purity product was 408 g (71.6% yield);

NBCH$_2$CH$_2$C≡CSiEt$_3$ (AkSiNB): A 3 L, 4 necked RBF was equipped with a thermowell, nitrogen adapter, addition funnel and mechanical stirrer. The RBF was charged with triethylethynylsilane (128.4 g, 915 mmol) in 800 mL dry THF. The reaction mixture was cooled to −78° C. and 359 mL n-BuLi (2.5M in hexane, 899 mmol) was added slowly and stirred for 1 h at −78° C. The reaction mixture was then warmed to 0° C. and addition funnel was charged with NBCH$_2$CH$_2$Br (160 g, 795.6 mmol) in 640 mL dry DMSO. After slow addition of NBCH$_2$CH$_2$Br solution the reaction mixture was allowed to warm to room temperature and stirred for 2 h. By GC analysis the reaction was completed after 2 h stirring at room temperature. The reaction mixture was quenched with 4 L water and diluted with 8 L heptane, followed by washes with (3×8 L) water, (2×4 L) brine, dried over Na$_2$SO$_4$, filtered, and evaporated. The GC analysis indicated that the crude product contained 62% product and 27% by-product (Et$_3$SiCCSiEt$_3$). The 178 g of crude product was distilled under high vacuum through a 14" column with glass helices packing to separate the triethylsilylacetylene and Et₃SiCCSiEt₃ by-product. The product was obtained in >99% purity (88.8 g, 43% yield) boiling point=93-97° C. at 0.20-0.21 mmHg.

EXAMPLE A12

Synthesis of EtPhDMMINB

Bromophenyl-2,3-dimethylmaleimide (BrC$_6$H$_4$DMMI): A 1 L RBF was equipped with a magnetic stir bar, condenser with nitrogen adapter. The RBF was charged with 4-bromoaniline (150.1 g, 872 mmol) and dimethyl maleic anhydride (DMMA) (100 g, 792 mmol) in 600 mL glacial acetic acid. The reaction mixture was refluxed for 6 h and TLC was checked in 30% EtOAc in heptane. By TLC the reaction was complete, and the reaction mixture was allowed to cool overnight. The product solidified as an off-white crystal, which was filtered and washed with MeOH. Crystals were dissolved in EtOAc and washed with NaHCO₃ solution. The organic layer was dried over Na₂SO₄ and after concentration gave bromophenyl-2,3-dimethylmaleimide (BrC$_6$H$_4$DMMI,170 g, 76.5% yield) with a purity of 99.7% by GC.

NBCH₂CH₂C$_6$H$_4$DMMI (EtPhDMMINB): A 3 L, 4 necked RBF was equipped with a thermowell, condenser with nitrogen adapter, addition funnel and mechanical stirrer. The RBF was charged with Zn (82.0 g, 1.26 mol), iodine (10.6 g, 0.04 mol) and 800 mL degassed N-methylpyrrolidone (NMP). The mixture was stirred at room temperature until the red color of iodine disappeared (ca. 2 minutes). Addition funnel was charged with NBCH₂CH₂Br (169 g, 0.84 mol) in 100 mL degassed NMP. The NBCH₂CH₂Br solution was added dropwise and the mixture was stirred at 80° C. for 3 h. Completion of zinc insertion was indicated by GC analysis of hydrolyzed reaction mixture. The mixture was cooled to 60° C. and BrC$_6$H$_4$DMMI (157 g, 0.56 mol) and Pd(PPh₃)₄ (51.8 g,0.045 mol) were added successively at 60° C. Then the reaction mixture was heated at 80° C. for 2 h 30 min. The reaction was monitored by quenching an aliquot with 1N HCl and extracting with EtOAc and followed by GC. After 2 h 30 min there was only 38.8% product by GC, so, another 2 mol % Pd(PPh₃)₄ was added and stirred at 80° C. for another 1 h, but no significant change in product was observed. The reaction mixture was allowed to cool to room temperature and quenched with 2 L 1N HCl and extracted with (2×4 L) 50% EtOAc in cyclohexane. The combined organic phases were washed with NaHCO₃, brine, dried over Na₂SO₄, filtered, and evaporated. The 200 g of crude product was adsorbed onto 200 g silica and chromatographed over 800 g of silica gel eluting with 0% to 20% EtOAc in cyclohexane. The concentrated purified fractions yielded 30.4 g of an off-white solid product (17% yield) with >94% purity by GC.

EXAMPLE A13

Synthesis of exo-ArSiNB exo-norbornenylphenylbromide: To 1-bromo-4-iodobenzene (250 grams, 884 mmol) and PdCl₂(PPh₃)₂ (6.20 grams, 8.84 mmol) in 400 mL of anhydrous DMF, was added norbornadiene (360 mL, 3.54 mmol), triethylamine (Et₃N) (398 mL, 2.85 mol), in a five-necked, three liter glass jacketed reactor purged with nitrogen. The reactor was heated via a hot water bath with a 50° C. set point. At an internal reactor temperature of 50° C., formic acid (88%, 80 mL, 1.86 mmol) was added drop wise through an addition funnel to prevent an exothermic reaction from occurring. The solution was heated and stirred at 50° C. for 1.25 hours and sampled every 15 minutes with GC monitoring to ensure all the 1-bromo-4-iodobenzene was reacted. The reaction mixture was cooled, transferred to a separatory funnel, and extracted with 500 mL of 10% HCl and 470 mL of heptane. The combined aqueous layers were discarded. The combined organic layers were dried with 5 grams of MgSO₄ and stirred for 30 minutes. The mixture was filtered through silica gel (200-425 Mesh) via a chromatography column, which was eluted with heptane. The crude material of exo-norbornenylphenylbromide (169 grams, 77% yield) was purified through a short path distillation setup at 90° C. and 0.2 Torr. The distillation cuts contained 62 grams (>80%), 80 grams (>99%), and were colorless liquids. A sample of the pure (>99%) exo-norbornenylphenylbromide was analyzed via $^1$H NMR and was in agreement with the proposed structure and literature values.

exo-NBCH₂CH₂C$_6$H$_4$C≡CSiEt₃ (exo-ArSiNB):

To exo-norbornenylphenylbromide (103.8 grams, 0.417 mol) and triethylsilylacetylene (70.2 grams, 0.5 moles) in 750 mL of anhydrous DMF, was added dibutylamine (Bu₂NH) (77.5 grams, 0.6 mol), PdCl₂(PPh₃)₂ (10.53 grams, 0.015 mol), and copper(I) iodide (2.86 grams, 0.015 mol), in a three-neck, one liter glass jacketed reactor purged with nitrogen. The reactor was heated via a hot water bath with a set point of 65° C. The solution was kept heated and stirred at 65° C. for 27 hours with GC monitoring every 3 hours to ensure that all the exo-norbornenylphenylbromide was reacted. The reaction mixture was cooled, and extracted with 200 mL of 10% HCl and 410 grams of heptane. The combined aqueous layers were discarded. The combined organic layers were filtered through a silica bed (200-425 Mesh) via a chromatography column and eluted with heptane. The crude material contained 122 grams of exo-norbornenylphenylethynyltriethylsilane. The main impurity in the sample was a reaction by-product, which was identified by GCMS as an acetylene dimer, Et₃SiC≡C—C≡CSiEt₃. Since the crude material could not be purified by distillation, it was retreated with silica gel via a chromatography column and eluted with heptane once more. The final material (43 grams, 35% yield) was a pale yellow oil (>98% purity). $^1$H NMR confirmed the identity of the final product as exo-norbornenylphenylethynyltriethylsilane.

EXAMPLE A14

Synthesis of EONB 1,2-Epoxy-9-decene (EPD) (≥96% (31.5 kg)) was charged to a jacketed reactor equipped with a dedicated hot oil unit, an apparatus to provide a split-range pressure control scheme and a feed weigh tank equipped with a metering pump. A premix of dicyclopentadiene (DCPD) (≥98%) and EPD (9:1 molar ratio) (4.32 kg) was prepared and charged to a feed weigh tank. Oxygen was removed from the reactor headspace using (3) pressure/vacuum swings with nitrogen and then pressurized with nitrogen to 5 psig. The reactor content was heated to 210° C. and when at temperature the premix was metered into the reactor at a constant rate over a 6 hour period. After completion of the metered addition, the reactor content was rapidly cooled to 25° C.

Referring to Table A, below: A known weight of the crude reaction mixture of epoxyoctyl norbornene (EONB) was then charged to a vacuum distillation setup consisting of a still pot with heating mantle, a packed distillation column (3 theoretical plates), a reflux splitter, a water cooled condenser, a condensate receiver and a vacuum pump. The distillation system vacuum was adjusted to the desired set point, and the oil bath used to heat the still pot to establish reflux conditions in the distillation column. Once these conditions were established, the reflux splitter was then started at the desired reflux ratio and fractional distillation proceeded by periodically removing liquid fractions from the overhead receiver. GC analysis was used to determine composition of the overhead liquid fractions. Distillation reflux ratio was adjusted as needed to affect composition of the overhead stream. The initial overhead fractions are enriched in the "light" components, which are primarily cyclopentadiene (CPD), dicyclopentadiene (DCPD) and epoxydecene (EPD). After removal of the "light" components, medium purity EONB (≥92%) is then separated from the remaining cyclopentadiene trimers (CPDT) and epoxyoctyltetracyclododecene (EOTD). The EOTD and other heavies are left in the still pot. The distillation process was terminated once the majority of EONB had been removed from the still pot residual.

Referring to Table B, below: A second-pass distillation of the medium purity EONB obtained from the first distillation was used to obtain high purity EONB (≥98%) product.

TABLE A

Distillation 1st Pass

| Crude EONB Charge | 36.82 kg | |
|---|---|---|
| Still Pot Temperature: | EPD 95-100° C. | EONB 130-140° C. |
| Overhead Temperature: | EPD 65-70° C. | EONB 90-100° C. |
| System Vacuum: | EPD 2-3 mmHg | EONB 0.15-0.20 mmHg |
| Reflux Ratio: | EPD 2:1 | EONB 1:1 |

TABLE B

Distillation 2nd Pass

| Medium Purity EONB Charge | 6.66 kg |
|---|---|
| Still Pot Temperature: | EONB 120-130° C. |
| Overhead Temperature: | EONB 89-92° C. |
| System Vacuum: | EONB 0.10-0.20 mmHg |
| Reflux Ratio: | EONB 3:1 |

EXAMPLE A15

Synthesis of DHNMINB

Norbornene methylamine (60.0 mL, 0.49 mol) in 57.5 g of toluene was added drop wise to a 3,4-dihydronaphthalic anhydride (80.1 g, 0.40 mol) dissolved in approximately 290 g to toluene with vigorous stirring. A light tan solid formed. The mixture was heated. Between 65-95° C. the solid dissolved to give a clear, dark brown solution. The solution was heated to reflux and water was removed using a Dean-Stark trap (8.6 g) over the course of 6 hours. The reaction mixture was cooled and then concentrated using a rotary evaporator to achieve a very viscous brown oil (170 g). A portion of the oil (80 g) was purified by silica gel column chromatography using 5:1 mixture of hexanes and ethyl acetate as eluent. Twenty five, 125 mL fractions were collected. Fractions 4-12 were combined and concentrated to dryness using a rotary evaporator to give a viscous yellow oil (19.7 g). $^1$H NMR confirmed the identity of the product as DHNMINB.

EXAMPLE A16

Synthesis NBCH$_2$GlyOAc

An initial charge of 5.51 kg allyloxyethyl acetate was weighed into a reactor and heated to 210° C. 0.07 kg of allyloxyethyl acetate and 0.32 kg of dicyclopentadiene were premixed and charged to a metering vessel and then metered into the reactor at a constant flow rate over a 5 hour period once the reaction temperature was reached. At the end of the metering period the charge was allowed to cool to room temperature and analyzed by GC showing 29% norbornene methoxyethyl acetate with approximately 0.6% cyclopentadiene trimers and 0.9% tetracyclododecene methoxyethyl acetate; the remainder is mostly allyloxyethyl acetate (all results are GC area %). Purification of norbornene methoxyethyl acetate is accomplished by fractional vacuum distillation on a packed column. High purity distillation was conducted under vacuum in the range of 150 to 200 mTorr with an overhead temperature of 65 to 67° C. Approximately 80% of the contained norbornene was recovered at greater than 99% purity (based upon GC area %).

EXAMPLE A17

Synthesis of MCHMNB

4'-Hydroxy-4-methoxychalcone: To a solution of sodium hydroxide (100 g, 2.50 mol) in 1.8 L of a 10:8 mixture of water and methanol was added 4-hydroxyacetophenone (136 g, 1.00 mol). After stirring at room temperature for 30 minutes, 4-Methoxybenzaldehyde (136 g, 1.00 mol) was added to this mixture. The reaction mixture was stirred at 50° C. oil bath for 16 hours. A clear yellow solution resulted which was allowed to stir at room temperature for 30 minutes. 1N HCl aq (500 mL) and 600 mL of a 1:1 mixture of dichloromethane and THF were added to result two layers. The organic layer was washed by saturated NaHCO$_3$ aq. (300 mL×2) and water (300 mL×3) and evaporated to yield orange solid. This solid was washed by 300 mL of EtOAc two times. The resulted yellow solid was dried in vacuo. Yield 133 g (52%). $^1$H NMR (CDCl$_3$): δ3.85 (s, 3H), 6.93 (m, 4H), 7.47 (d, 1H), 7.50 (d, 2H), 7.75 (d, 1H), 7.96 (d, 2H).

1-(4-bicyclo[2.2.1]hept-5-ene-2-methoxyphenyl)-3-(4-methoxyphenyl)-2-propen-1-one (MCHMNB): To a solution of K$_2$CO$_3$ (18.0 g, 0.130 mol) in 200 mL of DMF were added 4'-hydroxy-4-methoxychalcone (25.4 g, 0.100 mol) and bicyclo[2.2.1]hept-5-ene-2-methyl trifluoromethanesulfonate (23.3 g, 0.115 mol). This reaction mixture was stirred at 100° C. oil bath for 24 hours. An orange suspension resulted which allowed to stir at room temperature for 1 hour. 300 mL of dichloromethane and 300 mL of 1N HCl aq were added to result two layers. The organic layer was washed by sat. NaHCO$_3$ aq. (200 mL) and water (200 mL×5), then evaporated to yield orange solid. This solid was washed by 300 mL of EtOAc two times. The resulted pale yellow solid was dried in vacuo. Yield 16.0 g (44%). The structure was determined by $^1$H NMR (CDCl$_3$).

EXAMPLE A18

Synthesis of DMMIEtNB

Cyanomethylnorbornene: A 1 L, 4 neck RBF was equipped with a thermowell, condenser with a nitrogen inlet, stopper and mechanical stirrer. The RBF was charged with chloromethylnorbornene (120 g, 0.84 mol, 95.6% pure), 400 mL DMSO and solid NaCN (74.2 g, 1.51 mol). An extra 20 mL DMSO was added to rinse in the NaCN. The reaction mixture was stirred @ ~90° C. for 72 hours. GC analysis of an aliquot indicated all starting material had been consumed and the reaction was completed. The reaction mixture was cooled to room temperature. Approximately 200 mL water was poured into the flask and diluted with 200 mL MTBE. The organic phase was separated and the aqueous layer was re-extracted with (3×300 mL) MTBE. The organic phases were combined and washed with (3×500 mL) tap water until the aqueous wash reached pH=6. The MTBE solution was dried over anhydrous sodium sulfate overnight, filtered, and rotary evaporated, and dried under high vacuum (0.94 torr) for 3 h at bath temp 50° C. to give 112 g (100% yield) with 95.8% purity by GC. Proton NMR analysis indicated the material contained ~1% MTBE. The crude dark brown product was used for the next reaction without further purification. Data: GC analysis on a DB5 Column, 30 meters, 0.32 mm ID, 0.25 μm film, 75° C. to 300° C. at 25° C./min., hold for 2 min at 300° C., Injector temperature: 275° C., Detector temperature: 350° C.

DMMIEtNB: A 3 L, 4 neck RBF was equipped with a thermowell, Dean Stark trap connected to condenser with a nitrogen inlet, addition funnel and mechanical stirrer. The RBF was charged with 600 mL toluene followed by dimethylmaleic anhydride (DMMA, 92 g, 0.73 mol) with stirring. The mixture cooled to 14° C. as the dimethylmaleic anhydride dissolved in the toluene. The mixture was warmed to 25° C. to clear the solution. The addition funnel was charged with aminoethylnorbornene (104 g, 0.73 mol, 96.4% pure) in 100 mL toluene and added drop wise over 15 minutes. An additional 130 mL toluene was added to rinse in the aminoethylnorbornene and the addition funnel was replaced by a stopper. The mixture immediately exothermed to 50° C. and a white thick precipitate was observed. The mixture was heated carefully (to avoid excessive foaming) to reflux over 30 minutes and refluxed for 2 hours. A clear solution was observed and 13.1 mL water (99.5% of theoretical) was collected in the Dean Stark trap. GC analysis revealed the reaction was complete (94.9% product with 1.8% DCPD and 1.7% unknown impurity at 7.8 minute). The reaction mixture was cooled to room temperature and transferred to 5 L flask and concentrated on the rotary evaporator. The crude product was further dried under high vacuum (0.94 torr) at 75° C. bath temperature on the rotary evaporator for 5 h and gave 179 g of crude product as dark orange color viscous oil. GC analysis indicated the purity of crude product after drying under high vacuum was 97.4% with 0.3% DCPD and 1.8% unknown impurity. The 179 g of crude product was adsorbed in 179 g of silica gel and chromatographed over 500 g of silica gel eluting with heptane (8 L), 2% EtOAc in heptane (2 L), 2.5% EtOAc in heptane (2 L), 3% EtOAc in heptane (4 L) and 5% EtOAc in heptane (1 L). The concentrated purified fractions yielded 164 g of product as colorless viscous oil (91% yield) with 99.8% purity by GC. $^1$H NMR and mass spectrum were consistent with the structure. Data: GC analysis done on a DB5 Column, 30 meters, 0.32 mm ID, 0.25 μm film, 75° C. to 300° C. at 15° C./min, 2 min hold at 300° C., Injector temperature: 275° C., Detector temperature: 350° C., Retention time: 11.893 minute.

EXAMPLE A19

Synthesis of DMMIPrNB

Cyanoethylnorbornene: A 1 L, 4 neck RBF was equipped with a thermowell, condenser with a nitrogen inlet, stopper and mechanical stirrer. The RBF was charged with chloroethylnorbornene (100 g, 0.64 mol), 300 mL DMSO and solid NaCN (43.8 g, 0.89 mol). An extra 20 mL DMSO was added to rinse in the NaCN. The reaction mixture was stirred at ~80° C. for 2 hours. GC analysis of an aliquot indicated all starting material had been consumed and the reaction was completed. The reaction mixture was cooled to room temperature. Approximately 200 mL water was poured into the flask and diluted with 100 mL MTBE. The organic phase was separated and the aqueous layer was re-extracted with (3×200 mL) MTBE. The organic phases were combined and washed with (3×500 mL) tap water until the aqueous wash reached pH=6. The MTBE solution was dried over anhydrous sodium sulfate overnight, filtered, and rotary evaporated to give 93.5 g (99.5% yield) with 99.3% purity by GC. NMR analysis indicated the material contained ~1% MTBE. The crude product was used for the next reaction without further purification. Data: GC analysis done on a DB5 Column, 30 meters, 0.32 mm ID, 0.25 μm film, 75° C. to 300° C. at 25° C./min., hold for 2 min at 300° C., Injector temperature: 275° C., Detector temperature: 350° C.

Aminopropylnorbornene: A 3 L, 4 neck RBF was equipped with a thermowell, condenser with a nitrogen inlet, addition funnel and mechanical stirrer. The RBF was charged with LAH pellets (50.6 g, 1.33 mol) and mechanically stirred overnight with 800 mL MTBE. A thick paste resulted due to some loss of solvent. An additional 200 mL of MTBE were added and the resulting dispersion was chilled to −6° C. with a methanol-ice bath. The addition funnel was charged with cyanoethylnorbornene (93.5 g, 0.635 mol) in 500 mL MTBE and added dropwise at a rate to maintain the reaction temperature below −2° C., but warmer than −5° C. The addition of cyanoethylnorbornene occurred over a 1 h period. The cooling bath was removed and the mixture was then heated to 35° C. over a 1.5 h period and stirred at 35° C. for additional 30 minutes when GC analysis indicated no starting material remained. The mixture was cooled to −15° C. (methanol/ice bath) and 150 ml of distilled water was added very slowly over 3 hours 30 min, keeping the temperature below 0° C. This mixture was then diluted with 250 mL MTBE and a second 250 ml portion of water was added to precipitate the lithium and aluminum by-products as free flowing white solid. After stirring 10 minutes, the lithium and aluminum by-products were allowed to settle and the MTBE phase was decanted. The lithium and aluminum residues were covered with additional 500 mL MTBE, then mixed, settled, and the MTBE decanted. The MTBE decants were combined, dried over sodium sulfate, then filtered, and rotary evaporated to give 92 g (95.8% yield) of colorless viscous oil. GC analysis indicated 99.7% purity. $^1$H NMR analysis indicated the material contained ~1% MTBE. The crude NB(CH$_2$)$_3$NH$_2$ product was used for the next reaction without further purification. Data: GC analysis done on a DB5 Column, 30 meters, 0.32 mm ID, 0.25 μm film, 75° C. to 300° C. at 15° C./min., Injector temperature: 275° C., Detector temperature: 350° C., Retention time: 6.225 minute.

DMMIPrNB: A 3 L, 4 neck RBF was equipped with a thermowell, Dean Stark trap connected to condenser with a nitrogen inlet, addition funnel and mechanical stirrer. The RBF was charged with 500 mL toluene followed by dimethylmaleic anhydride (DMMA, 76.7 g, 0.60 mol) with stirring. The mixture self-cooled to about 14° C. as the dimethylmaleic anhydride dissolved in the toluene. The mixture was warmed to 25° C. to clear the solution. The addition funnel was charged with aminopropylnorbornene (92 g, 0.60 mol) in 100 mL toluene and added dropwise over 15 minutes. An additional 100 mL toluene was added to rinse in the aminopropylnorbornene and the addition funnel was replaced by a stopper. The mixture immediately exothermed to 53° C. and a white precipitate was observed. The mixture was heated carefully (to avoid excessive foaming) to reflux over 20 minutes and refluxed for 3 hours. A clear solution was observed and 10.7 mL water (98.2% of theoretical) was collected in the Dean Stark trap. GC analysis revealed the reaction was complete (98.2% product and 0.95% DMMA). The reaction mixture was cooled to room temperature and transferred to 5 L flask and concentrated on the rotary evaporator. The crude product was further dried under high vacuum (0.94 torr) at 50° C. bath temperature on the rotary evaporator through overnight and gave 122 g of crude product as light yellow viscous oil. GC analysis indicates the purity of crude product was 98.8% and 0.68% DMMA as major impurity. The 122 g of crude product was adsorbed in 122 g of silica gel and chromatographed over 360 g of silica gel eluting with heptane (4 L), 2% EtOAc in heptane (4 L), 2.5% EtOAc in heptane (4 L) and 3% EtOAc in heptane (4 L). The concentrated purified fractions yielded 115 g of product as colorless viscous oil (73.2% yield) with 100% purity by GC. $^1$H NMR and mass spectrum were consistent with the structure. Data: GC analysis done on a DB5 Column, 30 meters, 0.32 mm ID, 0.25 μm film, 75° C. to 300° C. at 15° C./min, 2 min hold at 300° C., Injector temperature: 275° C., Detector temperature: 325° C., Retention time: 12.634 minute.

EXAMPLE A20

Synthesis of DiOxoTCN

Norbornadiene (77 g, 0.84 mol) and perfluoro (5-methyl-3,6-dioxanon-1-ene or 3-(pentafluorophenyl)pentafluoroprop-1-ene (93 g, 0.21 mol) were premixed in a 250 mL glass vial and transferred to a 0.5 L stainless steel reactor. The reactor was sealed and heated to 190° C. for 24 hours while stirring under a nitrogen blanket. The reactor was cooled to ambient temperature and the reaction mixture (169 g) was concentrated by rotovap to obtain 140 g of the crude product. The crude product was fractionally distilled to obtain 65 g (57% yield) of the desired product in more than 87% purity by GC area percentages.

EXAMPLE A21

Synthesis of PFBTCN

Norbornadiene (1.2 g, 0.013 mol) and 3-(pentafluorophenyl) pentafluoroprop-1-ene (0.99 g, 0.0033 mol) premixed in a glass vial and transferred to a stainless steel reactor equipped with a glass insert. The reactor was sealed and heated to 190° C. for 24 hours. The reactor was cooled to ambient temperature and the reaction mixture analyzed for product identification by gas chromatography (GC) and gas chromatography-mass spectrometry (GC-MS). The desired product in the reaction mixture constituted 45.6% of the reaction mixture by GC area percentages.

EXAMPLE A22

Synthesis of NBTODD

To an 8-liter stainless steel autoclave reactor was charged 3.75 kg (18.4 mol) allyl triethylene glycol methyl ether. Stirring was started, and the reactor evacuated of air and padded with 5 psig nitrogen. Heating to 200° C. commenced, and upon achieving 200° C., the reactor was held for 3.75 hours at this temperature. During this time, a mixture of 0.06 kg (0.3 mol) allyl triethylene glycol methyl ether and 0.21 kg (1.6 mol) dicyclopentadiene were added to the reactor at a constant rate of 1.19 g/min. At the end of the addition, the reactor was cooled to ambient temperature and discharged. The major identified components of the charge, as measured by GC area, were: 75% allyl triethylene glycol methyl ether, and 23% norbornenyltetraoxadodecane. The charge was distilled and produced approximately 0.4 kg norbornenyltetraoxadodecane with assay greater than 98% (GC area).

EXAMPLE A23

Synthesis of NBTON

To an 8 liter stainless steel autoclave reactor was charged 3.4 kg (21.2 mol) allyl diethylene glycol methyl ether. Stirring was started, and the reactor evacuated of air and padded with 5 psig nitrogen. Heating to 200° C. commenced, and upon achieving 200° C., the reactor was held for 4.25 hours at this temperature. During this time, a mixture of 0.06 kg (0.4 mol) allyl diethylene glycol methyl ether and 0.24 kg (1.8 mol) dicyclopentadiene were added to the reactor at a constant rate of 1.17 g/min. At the end of the addition, the reactor was cooled to ambient temperature and discharged. The major identified components of the charge, as measured by GC area, were: 72% allyl diethylene glycol methyl ether, and 26% norbornenyltrioxanonane. The charge was distilled and produced approximately 0.5 kg norbornenyltrioxanonane with assay greater than 99% (GC area).

B. Polymer Synthesis

In each of the tables provided below, unless otherwise specifically noted, the amount of catalyst and each monomer reported is presented as grams (g); the yield is reported as a percentage (%), the molecular weight ($M_w$) is reported, PDI (polydispersity index) as the ratio $M_w/M_n$ and the molar composition of the polymer (A/B or A/B/C) determined by $^1$H NMR.

For each of Examples B1-B5, an amount of the specific monomers indicated were dissolved in a mixture of toluene and methyl ethyl ketone (72.9 mL and 12.8 mL, respectively) contained in a vial equipped with a stir bar. For B6, the monomer and catalyst were both dissolved in anhydrous ααα-trifluorotoluene (98.4 mL and 6.3 mL, respectively). The vial was sparged with nitrogen to remove residual oxygen and sealed. The amount of catalyst, ($\eta^6$-toluene)Ni $(C_6F_5)_2$ (hereinafter NiAr$^f$), indicated in Table 1 was dissolved in toluene (5 mL) in a nitrogen purged glove box.

EXAMPLE B1

Co-Polymerization of MeOAcNB and DMMIMeNB

The monomer solution was heated to 45° C. and catalyst mixture described above was injected into the heated vial. The solution was maintained at temperature for 17 hours with stirring after which it was allowed to cool to room temperature. Residual catalyst was removed and the polymer precipitated by pouring the reaction mixture into an excess of ethanol. After isolating the polymer by filtration, it was dried in a vacuum oven at 60° C.

EXAMPLE B2

Co-Polymerization of BuNB and DMMIMeNB

The monomer solution was heated to 45° C. and catalyst mixture described above was injected into the heated vial. The solution was maintained at temperature for 1.5 hours with stirring after which it was allowed to cool to room temperature. Residual catalyst was removed and the polymer precipitated by pouring the mixture into an excess of 75/25 acetone/methanol. After isolating the polymer by filtration, it was dried in a vacuum oven at 65° C.

EXAMPLE B3

Co-Polymerization of DecNB and DMMIMeNB

The monomer solution was heated to 45° C. and catalyst mixture described above was injected into the heated vial. The solution was maintained at temperature for 1.5 hours with stirring after which it was allowed to cool to room temperature. Residual catalyst was removed and the polymer precipitated by pouring the mixture into an excess of 75/25 acetone/methanol. After isolating the polymer by filtration, it was dried in a vacuum oven at 65° C.

EXAMPLE B4

Homopolymerization of DMMIMeNB

The monomer solution was heated to 45° C. and catalyst mixture described above was injected into the heated vial. The solution was maintained at temperature for 1.5 hours with stirring after which it was allowed to cool to room temperature. Residual catalyst was removed and the polymer precipitated by pouring the mixture into an excess of 75/25 acetone/methanol. After isolating the polymer by filtration, it was dried in a vacuum oven at 65° C.

EXAMPLE B5

Homopolymerization of FPCNB

The monomer solution was held at room temperature and catalyst mixture described above was injected into the vial. The solution was maintained at room temperature for 1.5 hours with stirring after which residual catalyst was removed and the polymer precipitated by pouring the mixture into an excess of 75/25 acetone/methanol. After isolating the polymer by filtration, it was dried in a vacuum oven at 65° C.

EXAMPLE B6

Homopolymerization of $C_8AcNB$

The monomer solution was held at room temperature and catalyst mixture described above was injected into the vial. The solution was maintained at room temperature for 1.5 hours with stirring after which it was allowed to cool to room temperature. Residual catalyst was removed and the polymer precipitated by pouring the mixture into an excess of 75/25 acetone/methanol. After isolating the polymer by filtration, it was dried in a vacuum oven at 65° C.

TABLE 1

| Ex | Monomer A | Monomer B | Catalyst | Yield | $M_w* 10^{-3}$ | PDI | A/B |
|---|---|---|---|---|---|---|---|
| B1 | MeOAcNB (10.8) | DMMIMeNB (15.0) | 0.29 | 76 | 84 | 1.77 | 51/49* |
| B2 | DMMIMeNB (19.43) | BuNB (5.41) | 0.39 | 85 | 76 | 1.34 | 65/35 |
| B3 | DMMIMeNB (17.81) | DecNB (7.74) | 0.36 | 37 | 65 | 1.48 | 67/33 |
| B4 | DMMIMeNB (25.44) | — | 0.36 | 74 | 66 | 2.00 | N/A |
| B5 | FPCNB (21.62) | — | 0.39 | 43 | 53 | 1.37 | N/A |

TABLE 1-continued

| Ex | Monomer A | Monomer B | Catalyst | Yield | $M_w* 10^{-3}$ | PDI | A/B |
|---|---|---|---|---|---|---|---|
| B6 | C8AcNB (41.62) | — | 0.39 | 37 | 300 | 1.72 | N/A |

*determined by $^{13}$C NMR.

For each of Examples B7-B19, the amount of $NBC_4F_9$ ($NBCH_2C_6F_5$ in Example B 13) indicated in Table 2, below, was dissolved in the indicated amount of anhydrous trifluorotoluene (trifluorotoluene and toluene in Examples B8 and B9) contained in a vial equipped with a stir bar. The vial was sparged with nitrogen to remove residual oxygen and sealed. For Examples B11, B12 and B17-B19 the indicated amount of DANFABA (dimethylanilinium tetrakis(pentafluorophenyl)borate) and (acetonitrile)bis(t-butyldicyclohexylphosphine)palladium(acetate)tetrakis(perfluorophenyl)borate (Pd 1394) were added to the vial after sparging but before the vial was sealed. For Examples B7-B10 and B13-16, the indicated amount of catalyst, $NiAr^f$ was dissolved in the indicated amount of toluene in a nitrogen purged glove box and injected into the sealed vial. For Examples 12 and 17-19, the indicated amount of formic acid was injected rather than catalyst. Table 2 also provides the yield (%) for each polymer as well as $M_w$, and PDI where available.

EXAMPLE B7

Homopolymerization of $NBC_4F_9$

The monomer solution was then stirred at ambient temperature and the catalyst solution injected into the vial. The mixture was maintained at temperature for 2 hours with stirring after which 2 mL of distilled water added to the vial. After residual catalyst removal and precipitation of the polymer into methanol, the polymer was isolated and dried in a vacuum oven at 70-80° C.

EXAMPLE B8

Homopolymerization of $NBC_4F_9$

The monomer solution was then stirred at 60° C. and the catalyst solution injected into the vial. The mixture was maintained at temperature for 1.5 hours with stirring after which 2 mL of distilled water added to the vial. After residual catalyst removal and precipitation of the polymer into methanol, the polymer was isolated and dried in a vacuum oven at 70-80° C.

EXAMPLE B9

Homopolymerization of $NBC_4F_9$

The monomer solution was then stirred at 60° C. and the catalyst solution injected into the vial. The mixture was maintained at temperature for 1.5 hours with stirring after which 2 mL of distilled water added to the vial. After residual catalyst removal and precipitation of the polymer into methanol, the polymer was isolated and dried in a vacuum oven at 70-80° C.

EXAMPLE B10

Homopolymerization of $NBC_4F_9$

The monomer solution was then stirred at 60° C. and the catalyst solution injected into the vial. The mixture was maintained at temperature for 1.5 hours with stirring after which 2 mL of distilled water added to the vial. After residual catalyst removal and precipitation of the polymer into methanol, the polymer was isolated and dried in a vacuum oven at 70-80° C.

EXAMPLE B11

Homopolymerization of $NBC_4F_9$

The monomer solution was then stirred at 90° C. for 16 hours. After residual catalyst removal and precipitation of the polymer into 90/10 methanol/water, the polymer was isolated and dried in a vacuum oven at 70-80° C.

EXAMPLE B12

Homopolymerization of $NBC_4F_9$

The monomer solution was then stirred at 90° C. for 16 hours. After residual catalyst removal and precipitation of the polymer into 90/10 methanol/water, the polymer was isolated and dried in a vacuum oven at 70-80° C.

EXAMPLE B13

Homopolymerization of $NBCH_2C_6F_5$

The monomer solution was then stirred at ambient temperature and the catalyst solution injected into the vial. The mixture was maintained at temperature for 5 minutes with stirring after which 2 mL of distilled water added to the vial. After residual catalyst removal and precipitation of the polymer into methanol, the polymer was isolated and dried in a vacuum oven at 70-80° C.

EXAMPLE B14-16

Homopolymerization of $NBC_4F_9$

The monomer solutions were then stirred at 65° C. and the catalyst solutions injected into the vials. The mixtures were maintained at temperature for 2 hours. After residual catalyst removal and precipitation of the polymer s into methanol, the polymers were isolated and dried in a vacuum oven at 70-80° C.

EXAMPLE B17-19

Homopolymerization of $NBC_4F_9$

The monomer solutions were then stirred at 90° C. and the catalyst solutions injected into the vials. The mixtures were maintained at temperature for 16 hours. After residual catalyst removal and precipitation of the polymers into 90/10 methanol/water, the polymers were isolated and dried in a vacuum oven at 70-80° C.

TABLE 2

| Ex. | Monomer | Monomer/ solvent | Catalyst solvent/ Cocatalyst | Catalyst | Yield | $M_w$* $10^{-3}$ | PDI |
| --- | --- | --- | --- | --- | --- | --- | --- |
| B7 | $NBC_4F_9$ (20.0) | 60 | 3.5 | 0.34 | 80 | 276 | 1.68 |
| B8 | $NBC_4F_9$ (10.0) | 30/10 | 6.9 | 0.68 | 71 | 215 | 1.97 |
| B9 | $NBC_4F_9$ (10.0) | 67.5/22.5 | 6.9 | 0.68 | 71 | 176 | 2.00 |
| B10 | $NBC_4F_9$ (10.0) | 40 | 6.9 | 0.68 | 70 | 130 | 1.59 |
| B11 | $NBC_4F_9$ (9.98) | 22.8 | †0.26 | 0.15 | 61 | 468 | 2.81 |
| B12 | $NBC_4F_9$ (20.3) | 46.7 | ††0.39/0.02 | 0.23 | 50 | 162 | 1.81 |
| B13 | $NBCH_2C_6F_5$ (20.0) | 80 | 4.0 | 0.39 | 80 | 306 | 7.15 |
| B14 | $NBC_4F_9$ (25.0) | 100 | 3.9 | 0.39 | 84 | 312 | 1.78 |
| B15 | $NBC_4F_9$ (25.0) | 100 | 7.8 | 0.78 | 84 | 331 | 1.73 |
| B16 | $NBC_4F_9$ (25.0) | 100 | 15.5 | 1.55 | 84 | 292 | 1.85 |
| B17 | $NBC_4F_9$ (31.2) | 72.4 | ††0.24/0.14 | 0.14 | 48 | 241 | 1.97 |
| B18 | $NBC_4F_9$ (31.2) | 72.4 | ††0.24/0.28 | 0.14 | 61 | 116 | 1.63 |
| B19 | $NBC_4F_9$ (31.2) | 72.4 | ††0.24/0.09 | 0.14 | 45 | 77.3 | 1.62 |

†DANFABA Cocatalyst
††DANFABA Cocatalyst/Formic Acid

For each of Examples B20-B41, the amount of monomers indicated in Table 3, below, were dissolved in the amount of solvent shown below and charged to a vial equipped with a stir bar (for B31 a glass reactor was used). The vial/reactor was sparged with nitrogen to remove residual oxygen and sealed. The indicated amount of catalyst, NiAr′ was dissolved in the indicated amount of toluene in a nitrogen purged glove box and injected into the sealed vial/reactor. Table 3 also provides the yields of polymers obtained for each synthesis as well as $M_w$, and PDI.

EXAMPLES B20-21

Polymerization of $NBC_4F_9$ and DMMIMeNB

The monomer solutions (60.0 g toluene for B20 and 75.0 g for B21) were stirred at ambient temperature and the catalyst solutions were injected into the vials. The mixture B20 was maintained at temperature for 3 hours with stirring after which 2 mL of distilled water added to the vial. The B21 reaction mixture was maintained at temperature for 16 hours. After residual catalyst removal and precipitation of the polymers into methanol, the polymers were isolated and dried in a vacuum oven at 70-80° C.

EXAMPLE B22

Polymerization of $NBC_4F_9$ and DMMIMeNB

The monomer solution (toluene (56.3 g) and trifluorotoluene (18.8 g)) was stirred at ambient temperature and the catalyst solution was injected into the vial. The mixture was maintained at temperature for 16 hours with stirring. After residual catalyst removal and precipitation of the polymer into methanol, the polymer was isolated and dried in a vacuum oven at 70-80° C.

EXAMPLE B23

Polymerization of $NBCH_2C_6F_5$ and DMMIMeNB

The monomer solution (60.0 g of toluene) was stirred at ambient temperature and the catalyst solution was injected into the vial. The mixture was maintained at ambient temperature for 2 hours with stirring after which 2 mL of distilled water added to the vial. After residual catalyst removal and precipitation of the polymer into methanol, the polymer was isolated and dried in a vacuum oven at 70-80° C.

EXAMPLE B24

Polymerization of NBC$_4$F$_9$ PPVENBB

The monomer solution (trifluorotoluene (40.0 g), toluene (32.0 g) and methyl ethyl ketone (8.0 g)) was stirred at 45° C. and the catalyst solution was injected into the vial. The mixture was maintained at temperature for 16 hours. After residual catalyst removal and precipitation of the polymer into methanol, the polymer was isolated and dried in a vacuum oven at 70-80° C.

EXAMPLE B25

Polymerization of NBC$_4$F$_9$ and MeCoumNB

The monomer solution (trifluorotoluene (75 g)) was stirred at 55° C. and the catalyst solution was injected into the vial. The mixture was maintained at temperature for 16 hours. After residual catalyst removal and precipitation of the polymer into methanol, the polymer was isolated and dried in a vacuum oven at 70-80° C.

EXAMPLE B26-B29

Polymerization of BuNB or DecNB and MeOCinnNB

The monomer solutions (toluene (103.8 g) and methyl ethyl ketone (18.3 g)) were stirred at ambient temperature and the catalyst solutions were injected into the vials. The mixtures were maintained at temperature for 16 hours with stirring. After residual catalyst removal and precipitation of the polymers into methanol, the polymers were isolated and dried in a vacuum oven at 70-80° C.

EXAMPLE B30

Polymerization of DecNB and PhIndNB

The monomer solution (toluene (68.0 g) and methyl ethyl ketone (12.0 g)) were stirred at 50° C. and the catalyst solution was injected into the vials. The mixtures were maintained at temperature for 16 hours. After residual catalyst removal and precipitation of the polymers into methanol, the polymers were isolated and dried in a vacuum oven at 70-8° C.

EXAMPLE B31

Polymerization of BuNB and DMMIMeNB

The monomer solution (toluene (488 g) and methyl ethyl ketone (90.0 g)) was stirred at 45° C. and the catalyst solution was injected into the reactor. The mixture was maintained at temperature for 3 hours. After residual catalyst removal the product was divided into two batches, each a 50/50 ethanol/i-butanol mixture, the two batches were solvent exchanged into 2-heptanone.

EXAMPLE B32-33

Polymerization of DMMIMeNB and HexNB or OctNB

The monomer solutions ((98.0 g) and methyl ethyl ketone (18.0 g)) were stirred at 45° C. and the catalyst solutions were injected into the vials. The mixtures were maintained at temperature for 3 hours. After residual catalyst removal and precipitation of the polymers into 95/5 methanol/water, the polymers were isolated and dried in a vacuum oven at 60-70° C.

EXAMPLE B34-37

Polymerization of DMMIMeNB, DecNB and AkSiNB

The monomer solutions (toluene (76.5 g) and methyl ethyl ketone (13.5 g)) were stirred at ambient temperature and the catalyst solutions were injected into the vials. The mixtures were maintained at temperature for 45 hours. After residual catalyst removal and precipitation of the polymers into methanol the polymers were isolated and dried in a vacuum oven at 65-70° C.

EXAMPLE B38-39

Polymerization of DMMIMeNB, DecNB, and NBTODD

The monomer solutions (toluene (63.8 g) and methyl ethyl ketone (11.3 g)) were stirred at 45° C. and the catalyst solutions injected into the vials. The mixtures were maintained at temperature for 3.5 hours for B38 and 16 hours for B39. After residual catalyst removal and precipitation of the polymers into methanol the polymers were isolated and dried in a vacuum oven at 70° C.

EXAMPLE B40-41

Polymerization of DMMIMeNB, NBCH$_2$C$_6$F$_5$ and MeOAcNB

The monomer solutions (toluene (195 g)) were stirred at 45° C. and the catalyst solutions were injected into the vials. The mixtures were maintained at temperature for 4.75 hours. After residual catalyst removal and precipitation of the polymers into 95/5 methanol/water the polymers were isolated and dried in a vacuum oven at 70° C.

TABLE 3

*monomer Feed Ratio - †Composition determined by $^{13}$C-NMR

| Ex. | Monomer A | Monomer B | Monomer C | Catalyst/Solvent | Yield | $M_w$ * $10^{-3}$ | PDI | A/B/C |
|---|---|---|---|---|---|---|---|---|
| B20 | NBC$_4$F$_9$ (11.5) | DMMIMeNE (8.51) | — | 0.39/4.0 | 65 | 85.0 | 2.21 | 50/50 |
| B21 | NBC$_4$F$_9$ (14.4 g) | DMMIMeNE (10.6 g) | | 0.49/5.0 | 80 | 99.2 | 1.74 | 56/44 |
| B22 | NBC$_4$F$_9$ (20.1 g) | DMMIMeNE (4.95 g) | | 0.61/6.2 | 76 | 81.6 | 1.60 | 62/38 |
| B23 | NBCH$_2$C$_6$F$_5$ (10.8) | DMMIMeNE (9.18) | — | 0.42/4.3 | 80 | 108 | 3.27 | 50/50* |
| B24 | NBC$_4$F$_9$ (11.1 g) | PPVENB (13.9 g) | | 0.51/6.1 | 88 | 164 | 1.45 | 50/50 |
| B25 | NBC$_4$F$_9$ (10.8 g) | MeCoumNB (9.24 g) | | 1.47/14.9 | 60 | 787 | 1.43 | 43/57 |
| B26 | BuNB (8.97) | MeOCinnNB (16.0) | — | 0.43/4.3 | 72 | 239 | 3.51 | 55/45 |
| B27 | BuNB (14.2) | MeOCinnNB (10.8) | — | 0.48/4.9 | 76 | 305 | 3.36 | 74/21 |
| B28 | DecNB (11.7) | MeOCinnNB (13.3) | — | 0.53/3.6 | 80 | 166 | 2.60 | 57/43 |
| B29 | DecNB (16.8) | MeOCinnNB (8.23) | — | 0.35/3.7 | 72 | 183 | 2.04 | 77/23* |
| B30 | DecNB (9.04) | PhIndNB (8.23) | — | 0.82/9.3 | 70 | 46.9 | 2.13 | 54/46 |
| B31 | BuNB (78.9) | DMMIMeNE (121.2) | — | 2.50/25.9 | 78 | 82.3 / 76.0 | 1.74 / 1.73 | 48/52 / 49/51 |
| B32 | HexNB (17.4) | DMMIMeNE (22.6) | — | 0.45/4.6 | 75 | 99.4 | 1.85 | 53/47 |
| B33 | OctNB (18.9) | DMMIMeNE (21.2) | — | 0.43/4.3 | 60 | 102 | 1.72 | 53/47 |
| B34 | DecNB (11.6) | DMMIMeNE (16.9) | AkSiNB (1.52) | 0.78/7.9 | 77 | 77.4 | 2.47 | 42/54/4† |
| B35 | DecNB (12.6) | DMMIMeNE (14.8) | AkSiNB (2.66) | 0.68/6.9 | 60 | 78.8 | 2.11 | 50/44/6† |
| B36 | DecNB (11.3) | DMMIMeNE (14.7) | AkSiNB (3.97) | 0.91/9.2 | 63 | 57.9 | 2.15 | 44/46/10† |
| B37 | DecNB (10.1) | DMMIMeNE (14.6) | AkSiNB (5.27) | 0.90/9.1 | 60 | 50.3 | 2.26 | 42/43/15† |
| B38 | DecNB (11.2) | DMMIMeNE (12.3) | NBTODD (1.44) | 0.38/3.8 | 68 | 88.6 | 2.03 | 47/47/6† |
| B39 | DecNB (12.1) | DMMIMeNE (7.32) | NBTODD (5.63) | 0.38/3.8 | 68 | 70.5 | 1.83 | 36/47/17† |
| B40 | NBCH$_2$C$_6$F$_5$ (12.1) | DMMIMeNE (20.5) | MeOAcNB (7.38) | 1.05/10.6 | 85 | 105 | 2.33 | 23/48/29† |
| B41 | NBCH$_2$C$_6$F$_5$ (16.3) | DMMIMeNE (13.8) | MeOAcNB (9.93) | 0.87/8.8 | 93 | 97.4 | 1.89 | 31/33/36† |

For each of Examples B42-B47, the amount of monomers indicated in Table 4, below, were dissolved in the amount of solvent shown below and charged to a vial equipped with a stir bar. The vial/reactor was sparged with nitrogen to remove residual oxygen and sealed. The indicated amount of catalyst, NiAr$^f$ was dissolved in the indicated amount of toluene in a nitrogen purged glove box and injected into the sealed vial/reactor. Table 4 also provides the yields of polymers obtained for each synthesis as well as $M_w$, and PDI.

EXAMPLE B42

Polymerization of DMMIMeNB, DecNB, and NBXOH

The amount of monomers indicated in Table 4, below, were dissolved in a mixture of toluene and methyl ethyl ketone (65.02 mL and 12.75 mL, respectively) contained in a vial equipped with a stir bar. The vial was sparged with nitrogen to remove residual oxygen and sealed. The amount of catalyst, NiAr$^f$, indicated in Table 4 was dissolved in toluene (2.59 mL) in a nitrogen purged glove box. The monomer solution was then heated to 45° C. and the catalyst solution injected into the heated vial. The mixture was maintained at temperature for 5 hours with stirring after which it was allowed to cool to room temperature. After residual catalyst removal and precipitation of the polymer into Methanol, the polymer was isolated and dried in a vacuum oven at 60° C.

EXAMPLE B43

Polymerization of DMMIMeNB, DecNB, and NBXOH

The amount of monomers indicated in Table 4, below, were dissolved in a mixture of toluene and methyl ethyl ketone (59.76 mL and 12.03 mL, respectively) contained in a vial equipped with a stir bar. The vial was sparged with nitrogen to remove residual oxygen and sealed. The amount of catalyst, NiAr$^f$, indicated in Table 4 was dissolved in toluene (4.07 mL) in a nitrogen purged glove box. The monomer solution was then heated to 45° C. and the catalyst solution injected into the heated vial. The mixture was maintained at temperature for 16 hours with stirring after which it was allowed to cool to room temperature. After residual catalyst removal and precipitation of the polymer into Methanol, the polymer was isolated and dried in a vacuum oven at 60° C.

EXAMPLE B44

Polymerization of PPVENB and DMMIMeNB

The amount of monomer indicated in Table 4, below, were dissolved in anhydrous trifluorotoluene (49.13 mL) contained in a vial equipped with a stir bar. The vial was sparged with nitrogen to remove residual oxygen and sealed. The amount of catalyst, NiAr$^f$, indicated in Table 4 was dissolved in anhydrous trifluorotoluene (7.50 mL) in a nitrogen purged glove box. The monomer solution was kept at room temperature and the catalyst solution injected into the vial. The mixture was stirred for 1 hour. After residual catalyst removal and precipitation of the polymer into Methanol, the polymer was isolated and dried in a vacuum oven at 60° C.

EXAMPLE B45

Polymerization of PPVENB and DMMIMeNB

The amount of monomer indicated in Table 4, below, were dissolved in anhydrous trifluorotoluene (56.15 mL) contained in a vial equipped with a stir bar. The vial was sparged with nitrogen to remove residual oxygen and sealed. The amount of catalyst, NiAr$^f$, indicated in Table 4 was dissolved in anhydrous trifluorotoluene (7.50 mL) in a nitrogen purged glove box. The monomer solution was kept at room temperature and the catalyst solution injected into the vial. The mixture was stirred for 1 hour. After residual catalyst removal and precipitation of the polymer into Methanol, the polymer was isolated and dried in a vacuum oven at 60° C.

EXAMPLE B46

Polymerization of BuNB and MeOCinnNB

The amounts of monomer indicated in Table 4, below, were dissolved in a mixture of toluene (140.7 mL) and ethyl acetate (25.3 mL) contained in a vial equipped with a stir bar. The vial was sparged with nitrogen to remove residual oxygen and sealed. The amount of catalyst, NiAr$^f$, indicated in Table 4 was dissolved in toluene (9.69 mL) in a nitrogen purged glove box. The monomer solution was heated to 45° C. The catalyst solution was then injected into the reaction vessel and the mixture was stirred (45° C., 3 hours). After residual catalyst removal and precipitation of the polymer into a mixture of acetone and methanol (75:25), the polymer was isolated and dried in a vacuum oven at 60° C.

EXAMPLE B47

Homopolymerization of EtCoumNB

In a nitrogen purged glove box, the amount of monomer indicated in Table 4, below, was dissolved in anhydrous dichloroethane (21.9 mL) contained in a vial equipped with a stir bar. The amount of catalyst, NiAr$^f$, indicated in Table 4 was dissolved in toluene (1.61 mL) in a nitrogen purged glove box. The monomer solution was heated to 45° C. The catalyst solution was then injected into the reaction vessel and the mixture was stirred (45° C., 3 hours).

TABLE 4

| Ex. | Monomer A | Monomer B | Monomer C | Catalyst | Yld | $M_w * 10^{-3}$ | PDI | A/B/C |
|---|---|---|---|---|---|---|---|---|
| B42 | DMMIMeNB (11.56) | DecNB (10.55) | NBXOH (0.76) | 0.22 | 63 | 69.0 | 1.60 | 46/43/11 |
| B43 | DMMIMeNB (11.56) | DecNB (7.03) | NBXOH (3.04) | 0.35 | 63 | 33.6 | 1.65 | 51/39/10 |
| B44 | PPVENB (13.66) | DMMIMeNB (8.10) | — | 0.34 | 78 | 183 | 1.86 | 56/44 |
| B45 | PPVENB (20.49) | DMMIMeNB (4.05) | — | 0.34 | 94 | 143 | 1.62 | 92/8 |
| B46 | BuNB (3.83) | MeOCinnNB (17.04) | — | 0.82 | 74 | 78.0 | 2.04 | 30/70 |
| B47 | EtCoumNB (4.00) | — | — | 0.14 | | 10.2 | | |

For each of Examples B48-B55, the amount of monomers indicated in Table 5, below, were dissolved in the amount of solvent shown below and charged to a vial equipped with a stir bar. The vial/reactor was sparged with nitrogen to remove residual oxygen and sealed. The indicated amount of catalyst, NiAr$^f$ was dissolved in the indicated amount of toluene in a nitrogen purged glove box and injected into the sealed vial/reactor. Table 5 also provides the yields of polymers obtained for each synthesis as well as $M_w$, and PDI.

EXAMPLE B48-B53

Polymerization of DMMIMeNB with Either BuNB or DecNB

The amounts of monomers indicated in Table 5, below, were dissolved in toluene (170 g) and methyl ethyl ketone (31 g) contained in vials equipped with a stir bar. The vials were sparged with nitrogen to remove residual oxygen and sealed. The amounts of catalyst, NiAr$^f$, indicated in Table 5 were dissolved in toluene (7-9 g) in a nitrogen purged glove box. The monomer solutions were then stirred at 45° C. and the catalyst solutions injected into the vials. The mixtures were maintained at temperature for 1-2 hours. After residual catalyst removal and precipitation of the polymers into methanol the polymers were isolated and dried in a vacuum oven at 70° C.

EXAMPLE B54-B55

Polymerization of BuNB and /DCPD

The amounts of monomer s indicated in Table 5, below, were dissolved in toluene (30 g) contained in vials equipped with a stir bar. The vials were sparged with nitrogen to remove residual oxygen and sealed. In a glove box, [Li(OEt$_2$)$_{2.5}$][B(C$_6$F$_5$)$_4$] (LiFABA) (Boulder Scientific Company, Mead, Colo.) (0.009 g) was added to the vials. Next hexene-1 (1.85 g) was added to the vials. The vials were heated to 80° C. To the vials was added (allyl)palladium(trinaphthylphosphine)(trifluoroacetate) in the amounts indicated in Table 5 in 2 g of toluene. The mixtures were maintained at temperature for 17 hours. After cooling the reaction mixture, they were diluted with THF (150 mL). Polymer that precipitated with methanol was isolated and dried in a vacuum oven at 70° C.

TABLE 5

| Ex. | Monomer A | Monomer B | Catalyst | Yield | $M_w* 10^{-3}$ | PDI | A/B |
|---|---|---|---|---|---|---|---|
| B48 | BuNB (60.86) | DMMIMeNB (10.40) | 0.95 | 94 | 76.9 | 2.06 | 89/11 |
| B49 | BuNB (42.07) | DMMIMeNB (27.74) | 0.84 | 90 | 87.3 | 1.93 | 72/28 |
| B50 | BuNB (27.80) | DMMIMeNB (42.76) | 0.78 | 83 | 90.2 | 1.98 | 55/45* |
| B51 | DecNB (60.24) | DMMIMeNB (6.93) | 0.66 | 95 | 110 | 1.84 | 87/13 |
| B52 | DecNB (49.19) | DMMIMeNB (20.80) | 0.66 | 91 | 99.9 | 1.84 | 70/30 |
| B53 | DecNB (35.13) | DMMIMeNB (34.67) | 0.66 | 84 | 100 | 1.78 | 52/48* |
| B54 | BuNB (13.52) | DCPD (1.32) | 0.004 | 90 | 77.0 | 4.54 | 89/11 |
| B55 | BuNB (13.52) | DCPD (1.32) | 0.004 | 89 | 64 | 5.79 | 80/20 |

*$^{13}$C NMR

For each of Examples B56-B63, the amounts of the monomers indicated in Table 6, below, were charged to a reaction vial and dissolved in 166 g of toluene and 29 g of methyl ethyl ketone. The vials were then sparged with nitrogen to remove residual oxygen and sealed. The amount of catalyst, NiAr$^f$, indicated in Table 6 for each experiment were dissolved in the amount of toluene indicated. Table 6 below provides the yields of polymers obtained for each synthesis as well as $M_w$, PDI and repeat unit ratios.

EXAMPLE B56-B57

Polymerization of DecNB and MGENB

The monomer solutions were then stirred at 40° C. and the catalyst solutions injected into the vials. The mixtures were maintained at temperature for 3 hours. After residual catalyst removal and precipitation of the polymer into methanol the polymer was isolated and dried in a vacuum oven at 80° C.

EXAMPLE B58-B59

Polymerization of BuNB and MGENB

The monomer solutions were then stirred at 40° C. and the catalyst solutions injected into the vials. The mixtures were maintained at temperature for 3 hours. After residual catalyst removal and precipitation of the polymer into methanol the polymer was isolated and dried in a vacuum oven at 80° C. Table 6 below provides the yields of polymers obtained for each synthesis as well as $M_w$ and $M_w/M_n$.

EXAMPLE B60-B61. Polymerization of DecNB and EONB

The monomer solutions were then stirred at 40° C. and the catalyst solutions injected into the vials. The mixtures were maintained at temperature for 3 hours. After residual catalyst removal and precipitation of the polymer into methanol the polymer was isolated and dried in a vacuum oven at 80° C.

EXAMPLE B62-B63

Polymerization of BuNB and MGENB

The monomer solutions were then stirred at 40° C. and the catalyst solutions injected into the vials. The mixtures were maintained at temperature for 3 hours. After residual catalyst removal and precipitation of the polymer into methanol the polymer was isolated and dried in a vacuum oven at 80° C.

EXAMPLE B64

Homopolymerization of DMMIBuNB

DMMIBuNB, toluene (68.68 g) and MEK (13.04 g) were mixed together, sparged with nitrogen for 30 min, then heated to 45° C. The amount of catalyst, NiAr$^f$ and solvent (toluene), indicated in Table 6, was added to the monomer mixture. The mixture was stirred overnight then cooled to room temperature. Residual catalyst was removed and the polymer precipitated by pouring the mixture into an excess of methanol. After isolating the polymer by filtration, it was dried in a vacuum oven at 50° C.

EXAMPLE B65

Homopolymerization of PPVENB

The monomer was dissolved in trifluorotoluene in the amount indicated. The solution was then stirred at room temperature and the trifluorotoluene catalyst solutions injected into the vials. The mixtures were maintained at room temperature overnight. After residual catalyst removal and precipitation of the polymer into methanol the polymer was isolated and dried in a vacuum oven at 80° C.

EXAMPLE B66

Homopolymerization of HexNB

HexNB, toluene (81.31 g) and MEK (15.98 g) were mixed together, sparged with nitrogen for 30 min, then heated to 45° C. The amount of catalyst, NiAr$^f$ and solvent (toluene), indicated in Table 6, was added to the monomer mixture. The mixture was stirred for 16 h then cooled to room temperature. Residual catalyst was removed and the polymer precipitated by pouring the mixture into an excess of ethanol. After isolating the polymer by filtration, it was dried in a vacuum oven at 60° C.

EXAMPLE B67

Homopolymerization of BuNB

BuNB, toluene and MEK were mixed together, sparged with nitrogen, then heated to 45° C. The amount of catalyst, NiAr$^f$ and solvent (toluene), indicated in Table 6, was added to the monomer mixture. The mixture was stirred for 2 h then cooled to room temperature. Residual catalyst was removed and the polymer precipitated by pouring the mixture into an excess of methanol. After isolating the polymer by filtration, it was dried overnight a vacuum oven.

TABLE 6

| Ex. | Monomer A | Monomer B | Catalyst/solvent | Yield | $M_w^* 10^{-3}$ | PDI | A/B |
|---|---|---|---|---|---|---|---|
| B56 | DecNB (59.88) | MGENB (5.12) | 2.45/25 | 94 | 76.8 | 2.47 | 88/12 |
| B57 | DecNB (48.88) | MGENB (16.12) | 2.45/35 | 95 | 69.3 | 2.52 | 69/31 |
| B58 | BuNB (57.35) | MGENB (7.65) | 3.5/35 | 95 | 61.4 | 3.27 | 88/12 |
| B59 | BuNB (42.92) | MGENB (22.08) | 3.5/35 | 96 | 63.3 | 3.35 | 69/31 |
| B60 | DecNB (58.84) | EONB (6.16) | 2.36/35 | 95 | 77.1 | 1.92 | 90/10 |
| B61 | DecNB (46.31) | EONB (18.69) | 2.36/35 | 96 | 75.6 | 2.15 | 70/30 |
| B62 | BuNB (55.88) | MGENB (9.12) | 3.33/35 | 96 | 68.1 | 2.70 | 85/15 |
| B63 | BuNB (39.89) | MGENB (25.11) | 3.33/35 | 97 | 70.2 | 2.19 | 65/35 |
| B64 | DMMIBuNB (21.9) | — | 0.52/5.23 | 82 | 62.2 | 2.10 | |
| B65 | PPVENB (19.50) | — | 0.24 | 14 | 319 | 1.63 | |
| B66 | HexNB (26.75) | — | 0.49/9.21 | 72 | 72 | 1.83 | |
| B67 | BuNB (80.0) | — | 1.15/11.6 | 88 | 89.7 | 2.96 | |

AD. Additive Preparations

EXAMPLE AD1

Preparation of the Adhesion Promoter—3,4-dimethyl-1-[3-(triethoxysilyl)propyl]-1H-pyrrole-2,5-dione (DMMIPrTEOS To an appropriately sized reaction vessel equipped with a thermowell, Dean Stark trap connected to condenser with a nitrogen inlet, addition funnel, and mechanical stirrer. was charged 2.2 L of cyclohexane followed by dimethylmaleic anhydride (DMMA, 107.8 g, 0.85 mol) and pyridine (3.5 mL, 0.042 mol) with stirring. A slight endotherm was observed (20 to 14° C.) as the dimethylmaleic anhydride dissolved in the cyclohexane. The mixture was warmed to 25° C. and a turbid solution was observed. The addition funnel was charged with 3-aminopropyltriethoxysilane (189.2 g, 200 mL, 0.85 mol) which was added slowly over 15 minutes. An additional 300 mL cyclohexane was added to rinse in the 3-aminopropyltriethoxysilane and the addition funnel was replaced by a stopper. The mixture immediately exothermed to 24° C. and a white turbid solution was observed. The mixture was heated carefully (to avoid excessive foaming) over 30 minutes to reflux. A clear solution was observed at 40° C. and again turned to a white turbid solution at 70° C. The reaction mixture was refluxed for 1 h at 70° C. and aliquot was analyzed and indicated that the reaction was completed (88% product with 11% DMMA and no 3-aminopropyltriethoxysilane). The reaction mixture was cooled to room temperature and the cyclohexane layer decanted to a 5 L flask leaving the white polymeric residue (120 g). The cyclohexane layer was concentrated on the rotary evaporator at 60° C. bath temperature. The residue was transferred to a 500 mL RBF and dried under high vacuum for 2 h at 7° C. bath temperature to give 132 g of crude product as a viscous oil (crude purity 96.5% with 3.2% DMMA). The crude product was further purified via Kugelrohr distillation at 150-170° C. oven temperature under vacuum at 0.15-0.2 torr to give 64.4 g (23% yield) of product with 99.7% purity by gas chromatography (GC) as a clear liquid. $^1$H NMR and mass were consistent with the desired structure. Pot residue was 60.6 g and total polymeric residue was 180.1 g (64%). Data: GC analysis performed on a DB-5MS Column, 25 meters, 0.32 mm ID, 0.52 μm film, heat from 75° C. to 200° C. @15° C./min, then 200° C. to 300° C. hold for 2 min @300° C., Injector temperature: 200° C., Detector temperature: 350° C., Retention time: 9.250 minutes.

EXAMPLE AD2

Preparation of Crosslinker—1,4-Bis(dimethylmaleimido)butane

To an appropriately sized reaction vessel equipped with a thermowell, a septum, condenser with nitrogen inlet and mechanical stirrer was charged DMMA (28.6 g, 0.226 mol) in 110 mL glacial acetic acid. The reaction mixture was heated to 35° C., and a clear solution was observed. Then neat butane-1,4-diamine (10 g, 0.113 mol) was added slowly and rinsed in with 30 mL of glacial acetic acid. The reaction mixture exothermed to 75° C. and was then heated to 118° C. and maintained there for 3 h during which time a light yellow solution resulted. The reaction was monitored by GC (aliquot quenched with ice/water and filter the precipitate and dissolved in $CH_2Cl_2$) and found to be complete after 3 h stirring at 118° C. The reaction was cooled to room temperature, quenched with 500 g of ice cubes and diluted with 500 mL water and stirred for 30 minutes. A white product as a precipitate was filtered and washed with 1 L water and dried under vacuum. The white precipitate was triturated with 1 L water for 1 h in a sonic bath. The white precipitate was again filtered and then dried under vacuum to give 29.8 g (87% yield) product with 99.03% purity by GC as a white powder. MS, $^1$H NMR, and $^{13}$C NMR were consistent with the desired structure. The melting point of the product was 127-130° C. Data: GC analysis performed on a DB-5MS Column, 25 meters, 0.32 mm ID, 0.52 μm film, heat from 75° C. to 300° C.@30° C./min, hold for 6 min @300° C., Injector temperature: 200° C., Detector temperature: 350° C., Retention time: 7.745 minutes.

EXAMPLE AD3

Preparation of Crosslinker—1,6-Bis(dimethylmaleimido)hexane

To an appropriately sized reaction vessel equipped with a thermowell, a septum, condenser with nitrogen inlet and mechanical stirrer was charged DMMA (26 g, 0.206 mol) in 100 mL glacial acetic acid. The reaction mixture was heated to 35° C., and a clear solution observed. Then neat hexane-1, 6-diamine (12 g, 0.103 mol) was added slowly and rinsed in with 20 mL of glacial acetic acid. The reaction mixture exothermed to 75° C. and was then heated to 118° C. and maintained there for 3 h during which time a light yellow solution resulted. The reaction was monitored by GC (aliquot quenched with ice/water and filter the precipitate and dissolved in $CH_2Cl_2$) and found to be complete after 3 h stirring at 118° C. The reaction was cooled to room temperature, quenched with 500 g of ice cubes and diluted with 500 mL water and stirred for 30 minutes. A white product as a precipitate was filtered and washed with 1 L water and dried under vacuum. The white precipitate was triturated with 1 L water for 1 h in a sonic bath. The white precipitate was filtered and dried under vacuum to give 30.4 g (88.6% yield) product with 99.02% purity by GC as a white powder. MS, $^1$H NMR, and $^{13}$C NMR were consistent with the desired structure. The melting point of the product was 122-125° C. Data: GC analysis performed on a DB-5MS Column, 25 meters, 0.32 mm ID, 0.52 μm film, heat from 75° C. to 300° C. @30° C./min, hold for 6 min @300° C., Injector temperature: 200° C., Detector temperature: 350° C., Retention time: 8.590 minutes.

C. Device Preparation

A top gate OFET is prepared as follows. A substrate of Corning 1737 glass is sonicated in 3% Decon90 for 30 min at 70° C., washed twice with water and sonicated in MeOH, then dried by spin off on the spin coater. Gold source and drain electrodes of 30 nm thickness are thermally evaporated through a shadow mask onto the substrate, creating a channel L=50 μm and W=1000 μm. The substrate is treated with the surface treatment formulation Lisicon™ M001 (available from Merck KGaA, Darmstadt, Germany) for 1 min, washed with isopropyl alcohol and dried by spin off on the spin coater.

The OSC Formulations Lisicon™ S1200 or SP320 (available from Merck KGaA, Darmstadt, Germany) are spun onto the substrate after above treatment and then annealed for 1 min at 100° C. on a hotplate. In the next step the dielectric layer is spun according to the conditions described in examples C13-20 below. A 30 nm gold layer is thermally evaporated through a shadow mask onto the dielectric layer to form the gate electrode.

A bottom gate OFET is prepared as follow. A substrate of Corning Eagle XG glass is sonicated in 3% Decon90 for 30 min at 70° C., washed twice with water and sonicated in MeOH, then dried by spin off on the spin coater. A 30 nm aluminium layer is then thermally evaporated onto the substrate through a shadow mask to form the gate electrode. The dielectric is spun, annealed and cured according to the conditions described in Examples C1-12. In the case of latent reactivity provided by an EONB or MGENB moiety (examples C1-4) it is necessary to employ a reactive washing step after post annealing using Lisicon™ M008 (available from Merck KGaA, Darmstadt, Germany) in which the dielectric is covered in M008 for 1 min, rinsed twice with THF and then spun to dryness. Following dielectric deposition, silver source and drain electrodes of 30 nm thickness are evaporated onto the dielectric, creating a channel L=50 μm and W=1000 μm. The substrate is treated with the surface treatment formulation Lisicon™ M001 (available from Merck KGaA, Darmstadt, Germany) for 1 min, washed with isopropyl alcohol and dried by spin off on the spin coater.

The OSC Formulations Lisicon™ S1200 and S1036 (available from Merck KGaA, Darmstadt, Germany) are spun onto the substrate after above treatment and then annealed for 30 s at 100° C. on a hotplate For the electrical characterization the sample is placed in a probe station and connected via Suess PH100 probe heads to an Agilent 4155C semiconductor analyzer. Linear and saturation mobility is calculated at VD=−5V and VD=−60V (or VD=−40V) respectively using the following equations:

$$\mu_{LIN} = -\frac{L}{W*Cox*VD}*\frac{\partial ID}{\partial VG}$$

$$\mu_{SAT} = \frac{2L}{W*Cox}*\frac{\partial sqrtID}{\partial VG}$$

wherein L and W are length and width of the channel, Cox=dielectric capacitance [F/cm²], ID=drain current, sqrt ID=square root of absolute ID values, VG=gate voltage, VD=drain voltage.

EXAMPLE C1

OFET Having a Gate Insulator of Example B56

Figure 3:
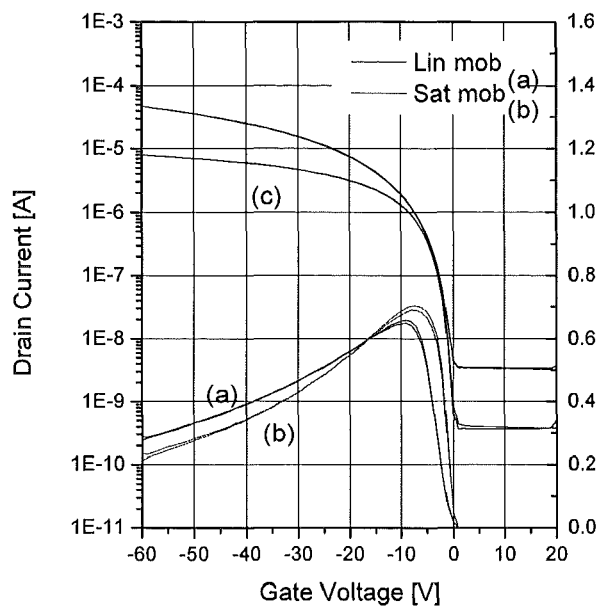
FIGS. 3 to 20 depict transfer curves of top and bottom gate OFET devices fabricated in accordance with embodiments of the present invention described in examples C1 to C18.

DecNB and MGENB 50:50 ratio co-polymer is formulated as a 15% w/w solution in 2-heptanone including 0.7% (by weight of polymer) of 365 nm PAG. The solution is spun at 1500 rpm for 30 sec, annealed for 2 min at 120° C. on a hotplate and irradiated under 365 nm UV light (11 mW/cm²) for 30 sec before a post-anneal of 3 min at 120° C. on a hotplate. Spin coated Merck Lisicon S1200™ formulation is used in this example. The transfer curve is depicted in FIG. 3.

EXAMPLE C2

OFET Having a Gate Insulator of Example B56

Figure 4:
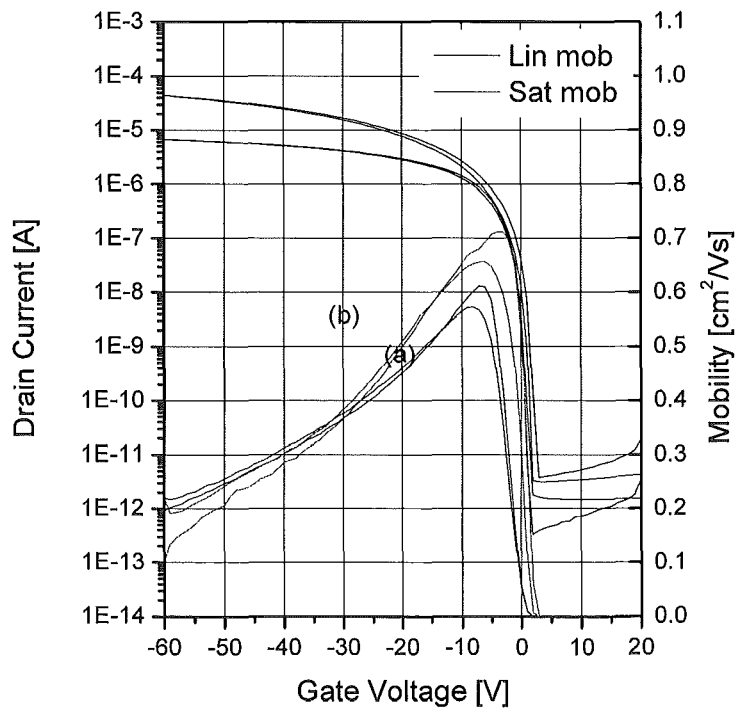

DecNB and MGENB 50:50 ratio co-polymer is formulated as a 15% w/w solution in 2-heptanone including 0.7% (by weight of polymer) of 365 nm PAG. The solution is spun at 1500 rpm for 30 sec, annealed for 2 min at 120° C. on a hotplate and irradiated under 365 nm UV light (11 mW/cm2) for 30 sec before a post-anneal of 3 min at 120° C. on a hotplate. Inkjet printed Merck Lisicon S1200™ formulation is used in this example. The transfer curve is depicted in FIG. 4.

EXAMPLE C3

OFET Having a Gate Insulator of Example B56

Figure 5:
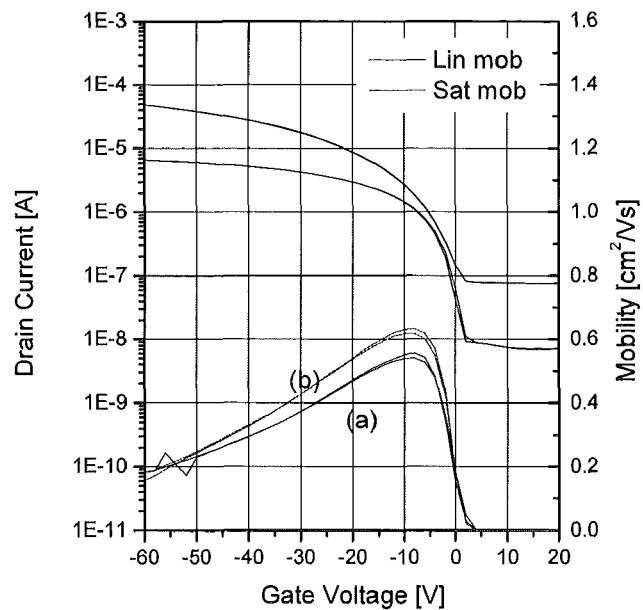

DecNB and MGENB 50:50 ratio co-polymer is formulated as a 15% w/w solution in 2-heptanone including 0.7% (by weight of polymer) of p-isopropylphenyl (p-methylphenyl) iodonium tetrakis(pentafluorophenyl)borate. The solution is spun at 1500 rpm for 30 sec, annealed for 2 min at 120° C. on a hotplate and irradiated under 254 nm UV light (1 mW/cm²) for 30 sec before a post-anneal of 3 min at 120° C. on a hotplate. Spin coated Merck Lisicon S1200™ formulation is used in this example. The transfer curve is depicted in FIG. 5.

EXAMPLE C4

OFET Having a Gate Insulator of Example B57

Figure 6:
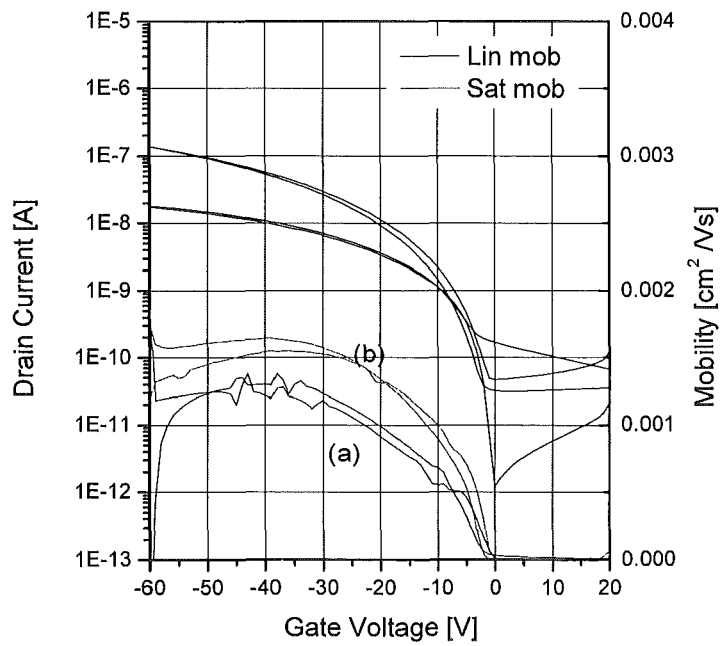

DecNB and MGENB 69:31 ratio co-polymer is formulated as a 15% w/w solution in 2-heptanone including 0.5% (by weight of polymer) of the photo acid generator, p-isopropylphenyl-(p-methylphenyl)iodonium tetrakis(pentafluorophenyl)borate. The solution is spun at 1500 rpm for 30 sec, annealed for 2 min at 120° C. on a hotplate and irradiated under 254 nm UV light (1 mW/cm²) for 30 sec before a post-anneal of 3 min at 120° C. on a hotplate. Spin coated Merck Lisicon S1036™ is used in this example. The transfer curve is depicted in FIG. 6.

EXAMPLE C5

OFET Having a Gate Insulator of Example B64

Figure 7:
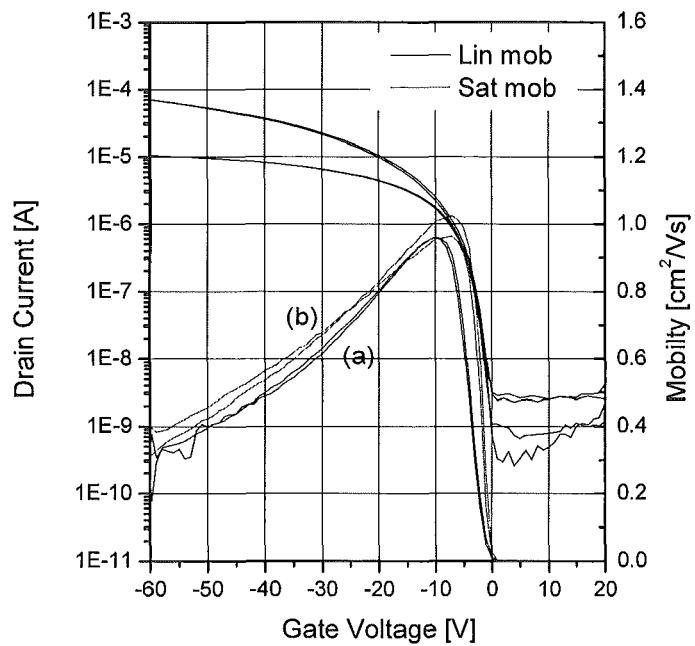

DMMIBuNB homopolymer is formulated as a 17% w/w solution in 2-heptanone including 0.7% (by weight of polymer) of 1-chloro-4-propoxythioxanthone. The solution is spun at 1500 rpm for 30 sec, annealed for 2 min at 120° C. on a hotplate and irradiated under 365 nm UV light (11 mW/cm²) for 200s. Spin coated Merck Lisicon S1200™ is used in this example. The transfer curve is depicted in FIG. 7.

EXAMPLE C6

OFET Having a Gate Insulator of Example B47

Figure 8:
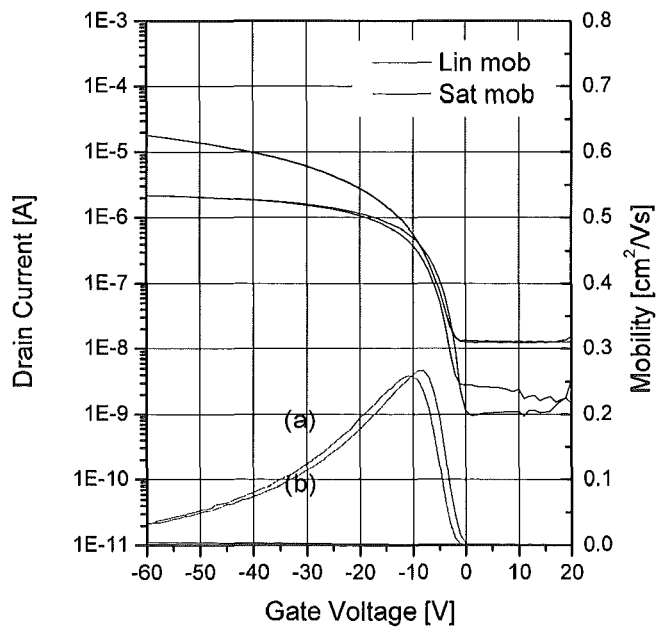

EtCoumNB homopolymer is formulated as a 14% w/w solution in 2-heptanone including 0.7% (by weight of polymer) of 1-chloro-4-propoxythioxanthone. The solution is spun at 1500 rpm for 30 sec, annealed for 2 min at 120° C. on a hotplate and irradiated under 365 nm UV light (11 mW/cm²) for 200 sec. Spin coated Merck Lisicon S1200™ is used in this example. The transfer curve is depicted in FIG. 8.

EXAMPLE C7

OFET Having a Gate Insulator of Example B30

Figure 9:
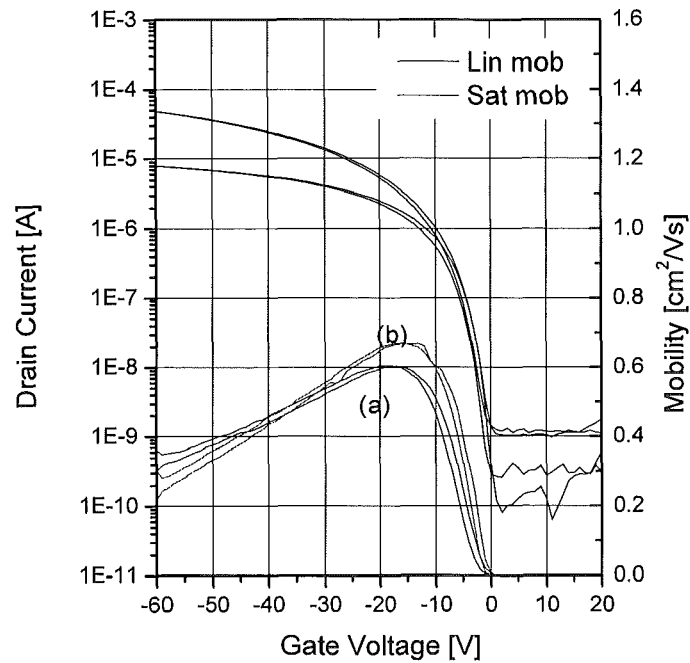

DecNB and PhIndNB 54:46 co-polymer is formulated as a 15% w/w solution in 2-heptanone. The solution is spun at 1500 rpm for 30 sec, annealed for 2 m at 120° C. on a hotplate and irradiated under 365 nm UV light (11 mW/cm²) for 120 sec. Spin coated Merck Lisicon S1200™ is used in this example. The transfer curve is depicted in FIG. 9.

EXAMPLE C8

OFET Having a Gate Insulator of Example B26

Figure 10:
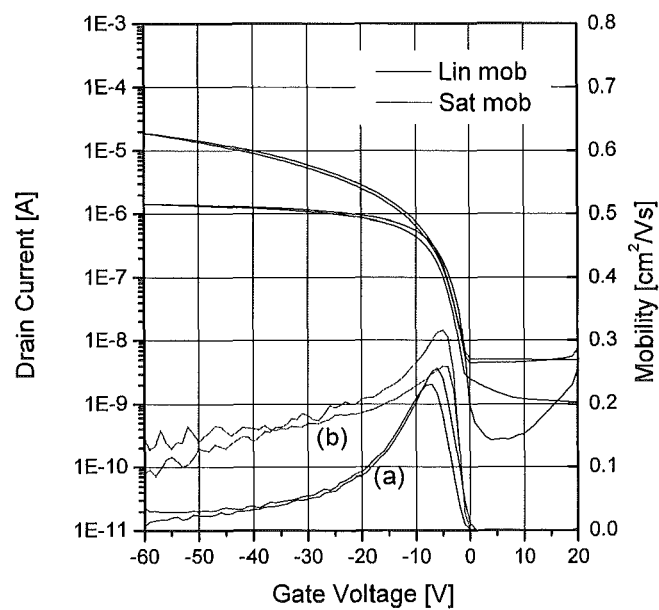

BuNB and MeOCinnNB 55:45 copolymer is formulated as a 13% w/w solution in 2-heptanone including 1.0% (by weight of polymer) of 1-chloro-4-propoxythioxanthone. The solution is spun at 1500 rpm for 30 s, annealed for 2 min at 120° C. on a hotplate and irradiated under 365 nm UV light (11 mW/cm²) for 200 sec. Spin coated Merck Lisicon S1200™ is used in this example. The transfer curve is depicted in FIG. 10.

EXAMPLE C9

OFET Having a Gate Insulator of Example B2 with B26 as a Sensitizer

Figure 11:
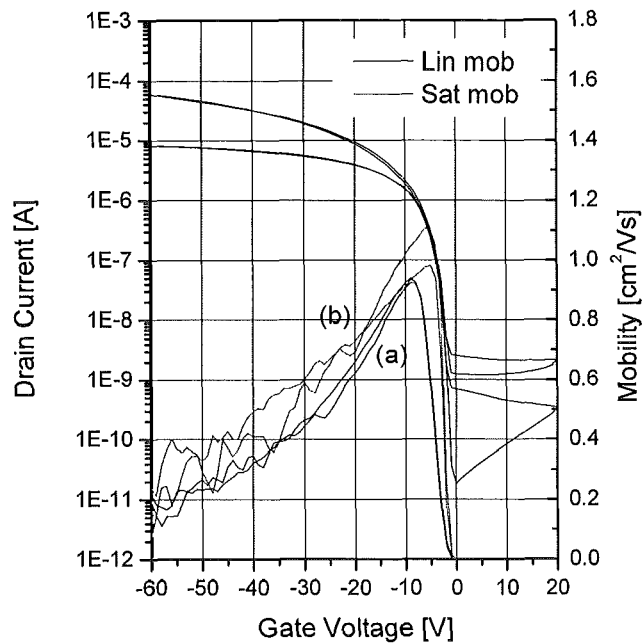

DMMIMeNB and BuNB 65:35 ratio co-polymer and BuNB and MeOCinnNB 55:45 ratio copolymer are combined in a 4:1 ratio and are formulated as a 13% w/w solution in 2-heptanone The solution is spun at 1500 rpm for 30 sec, annealed for 2 min at 120° C. on a hotplate and irradiated under UVA (320-400 nm) UV light (0.35 W/cm²) for 20 sec. Spin coated Merck Lisicon S1200™ is used in this example. The transfer curve is depicted in FIG. 11.

EXAMPLE C10

OFET Having a Gate Insulator of Example B4

Figure 12:
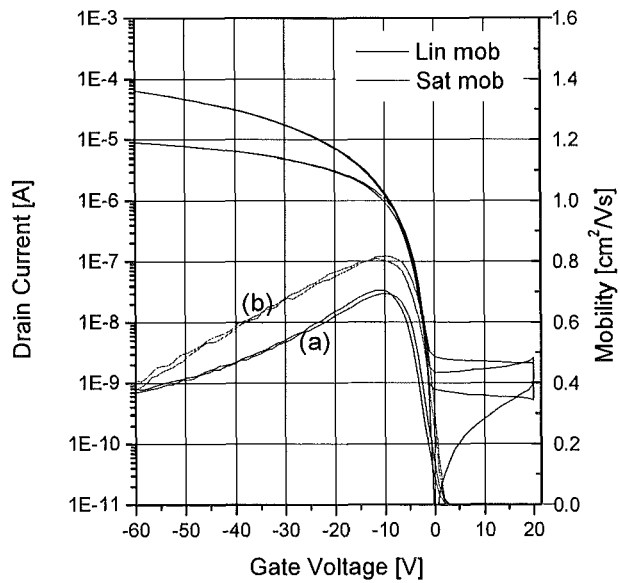

DMMIMeNB homopolymer is formulated as a 13% w/w solution in 2-heptanone including 0.7% (by weight of polymer) of 1-chloro-4-propoxythioxanthone. The solution is spun at 1500 rpm for 30 sec, annealed for 2 min at 120° C. on a hotplate and irradiated under 302 nm UV light (7 mW/cm²) for 120 sec. Spin coated Merck Lisicon S1200™ is used in this example. The transfer curve is depicted in FIG. 12.

EXAMPLE C11

OFET Having a Gate Insulator of Example B2

Figure 13:
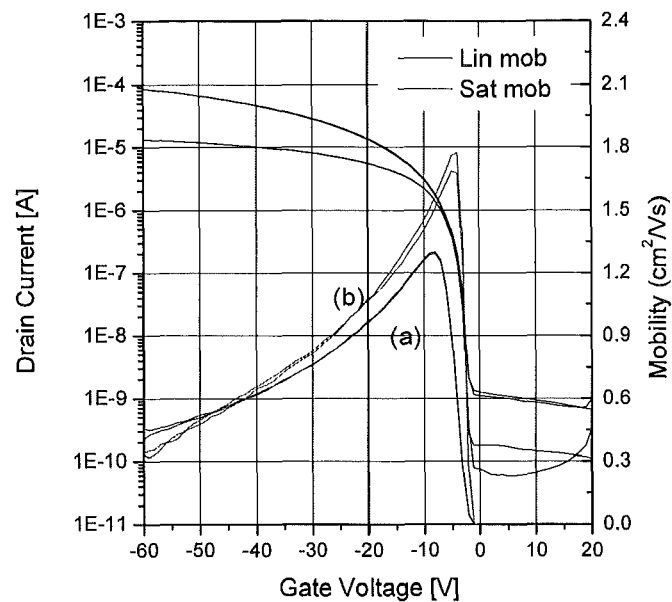

BuNB and DMMIMeNB 35:65 co-polymer is formulated as a 13% w/w solution in 2-heptanone including 0.5% (by weight of polymer) of 1-chloro-4-propoxythio-xanthone. The solution is spun at 1500 rpm for 30 sec, annealed for 2 min at 120° C. on a hotplate and irradiated under 302 nm UV light (7 mW/cm²) for 300 sec. Spin coated Merck Lisicon S1200™ is used in this example. The transfer curve is depicted in FIG. 13.

EXAMPLE C12

OFET Having a Gate Insulator of Example B1

Figure 14:
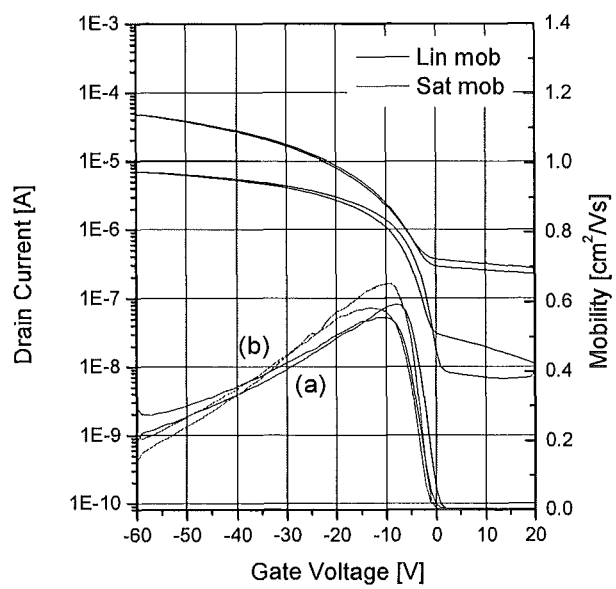

MeOAcNB and DMMIMeNB 51:49 ratio co-polymer is formulated as a 13% w/w solution in 2-heptanone including 0.5% (by weight of polymer) of 1-chloro-4-propoxythioxanthone. The solution is spun at 1500 rpm for 30 sec, annealed for 2 min at 120° C. on a hotplate and irradiated under UVA (320-400 nm) UV light (0.35 W/cm²) for 30 sec. Spin coated Merck Lisicon S1200™ is used in this example. The transfer curve is depicted in FIG. 14.

EXAMPLE C13

OFET Having a Gate Insulator of Example B15

Figure 15:
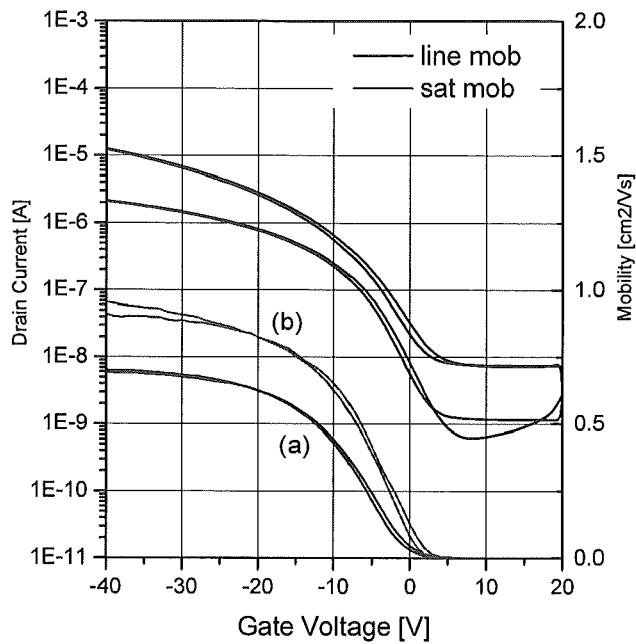

NBC4F9 homopolymer is formulated as 10% solid weight in mixture of 80/20 perfluoroperhydrophenanthrene with HFE7500 and spun at 500 rpm for 10 sec then at 1000 rpm for 20 sec followed by annealing for 2 min at 100° C. on a hotplate. Merck Lisicon S1200™ OSC formulation is used in this example The transfer curve is depicted in FIG. 15.

EXAMPLE C14

OFET Having a Gate Insulator of Example B65

Figure 16:
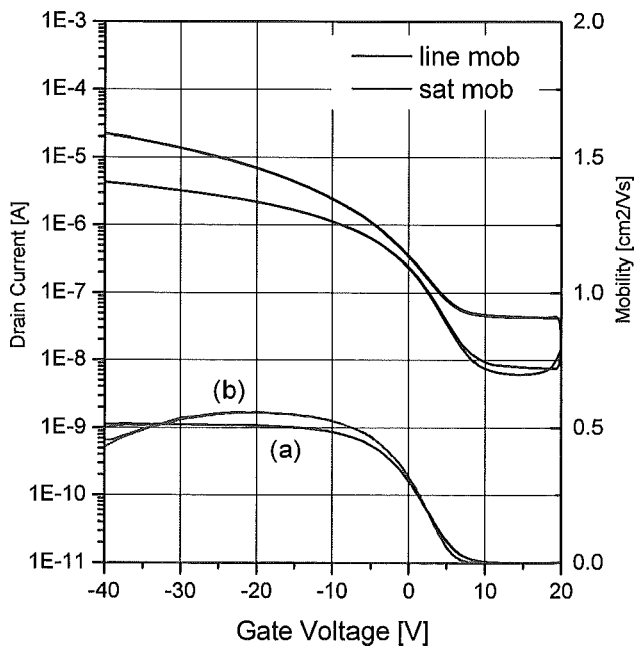

NBCH2CF2CHFOC3F7 (PPVENBB) homopolymer is formulated as 10% solid weight in mixture of 80/20 perfluoroperhydrophenanthrene with HFE7500 and spun at 500 rpm for 10 sec then at 1000 rpm for 20 sec followed by annealing for 2 min at 100° C. on a hotplate. Merck Lisicon S1200™ OSC formulation is used in this example. The transfer curve is depicted in FIG. 16.

EXAMPLE C15

OFET Having a Gate Insulator of Example B66

Figure 17:
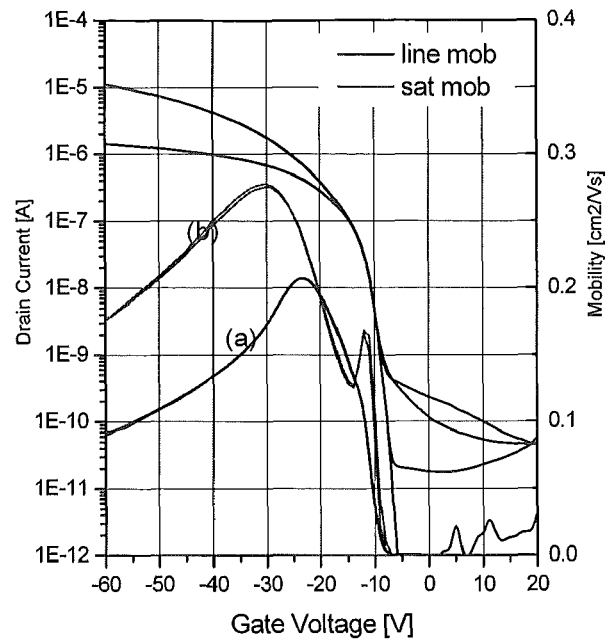

HexNB homopolymer is formulated as 12.5% solid weight in decane and spun at 500 rpm for 10 sec then at 1500 rpm for 30 sec followed by annealing for 1 min at 100° C. on a hotplate. Merck Lisicon SP320™ OSC formulation is used in this example. The transfer curve is depicted in FIG. 17.

EXAMPLE C16

OFET Having a Gate Insulator of Example B67

Figure 18:
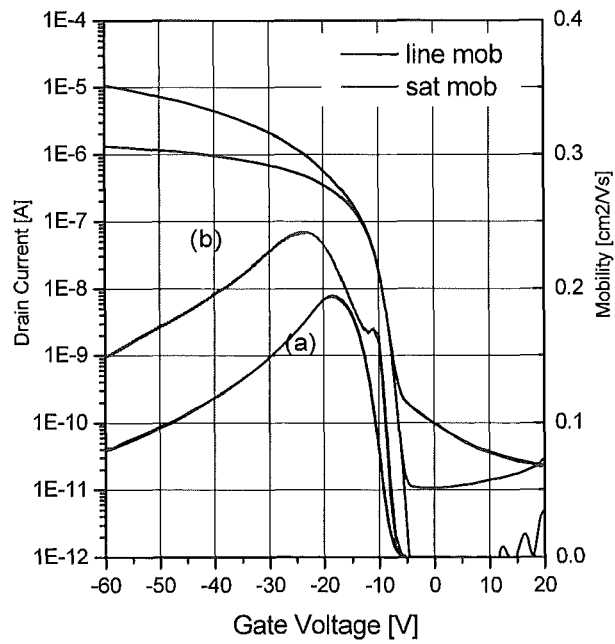

BuNB homopolymer is formulated as 12.5% solid weight in decane and spun at 500 rpm for 10 sec then at 1500 rpm for 30 sec followed by annealing for 1 min at 100° C. on a hotplate. Merck Lisicon SP320™ OSC formulation is used in this example. The transfer curve is depicted in FIG. 18.

EXAMPLE C17

OFET Having a Gate Insulator of Example B48

Figure 19:
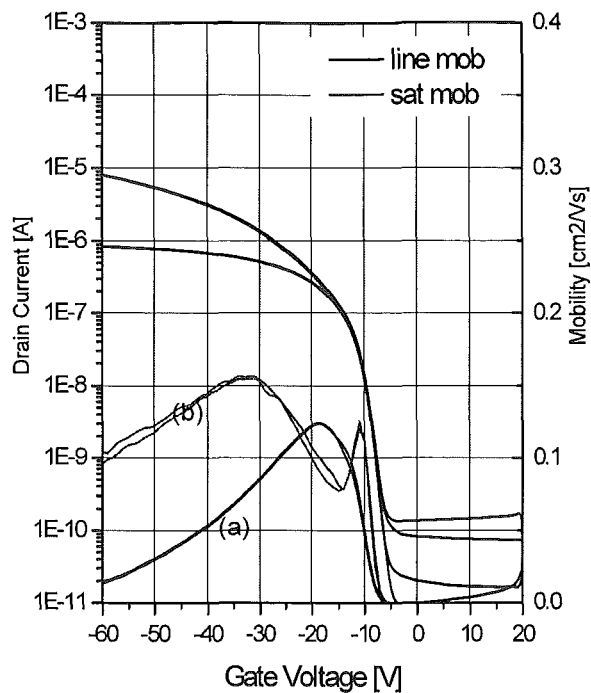

BuNB/DMMIMeNB 0.9/0.1 ratio copolymer is formulated as 15% solid weight in decane and spun at 500 rpm for 10 sec then at 1500 rpm for 30 sec followed by annealing for 1 min at 100° C. on a hotplate. Merck Lisicon SP320™ OSC formulation is used in this example. The transfer curve is depicted in FIG. 19.

EXAMPLE C18

OFET Having a Gate Insulator of Example B61

Figure 20:
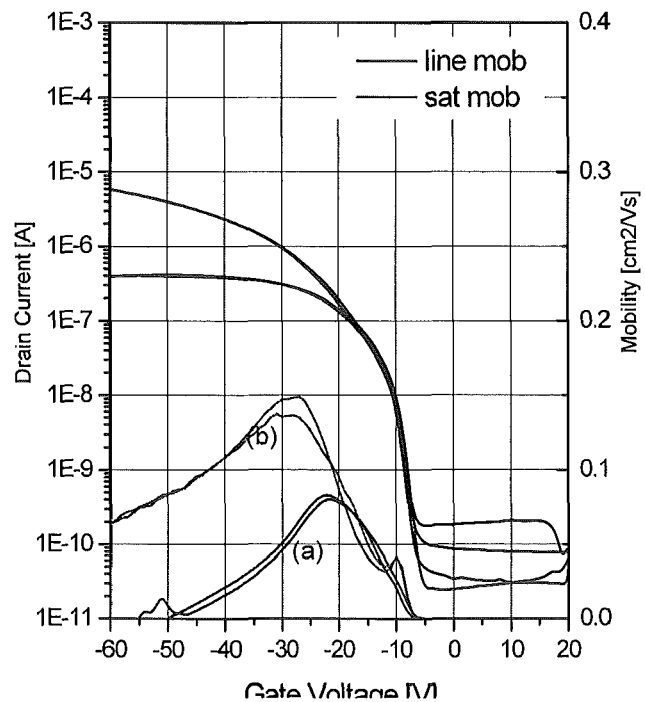

DecNB and EONB 0.7/0.3 ratio copolymer is formulated as 16% solid weight in decane and spun at 500 rpm for 10 sec then at 1500 rpm for 30 sec followed by annealing for 1 min at 100° C. on a hotplate. Merck Lisicon SP320™ OSC formulation is used in this example. The transfer curve is depicted in FIG. 20.

The examples C1-C18 show that a gate insulator in accordance with the invention is suitable for use in an organic field effect transistor, where it shows good wetting and orthogonal solubility properties with respect to the organic semiconductor material, and enables good transistor performance.

EXAMPLE C19

OFET Having a Gate Insulator with Adhesion Promoter

A bottom gate OFET is prepared as follows. A substrate of Corning Eagle XG glass is sonicated in 3% Decon90 for 30 min at 70° C., washed twice with water and sonicated in MeOH, then dried by spin off on the spin coater. A 30 nm aluminium layer is then thermally evaporated onto the substrate through a shadow mask to form the gate electrode.

The substrate is soaked with 1% solution of DMMI-propyl-Si(OEt)$_3$ (also referred to as DMMIPrTEOS) in PGMEA, spin-off and washed with IPA.

A 17% solution of the homopolymer of DMMIBuNB (see example B64) containing 0.7% (w/w to polymer) of the sensitizer CPTX in MAK is coated by spin-coating, and UV cured for 4 minutes under 11 mW/cm$^2$ 365 nm irradiation.

Silver source and drain electrodes of 30 nm thickness are thermally evaporated through a shadow mask onto the substrate, creating a channel length L=50 µm and channel width W=1000 µm. Next the surface treatment formulation Lisicon™ M001 (available from Merck KGaA, Darmstadt, Germany) is applied for 1 min, washed with isopropyl alcohol and dried by spin off on the spin coater. Next the OSC Formulation Lisicon™ S1200 (available from Merck KGaA, Darmstadt, Germany) is spun onto the substrate after above treatment and then annealed for 1 min at 100° C. on a hotplate.

Figure 21:
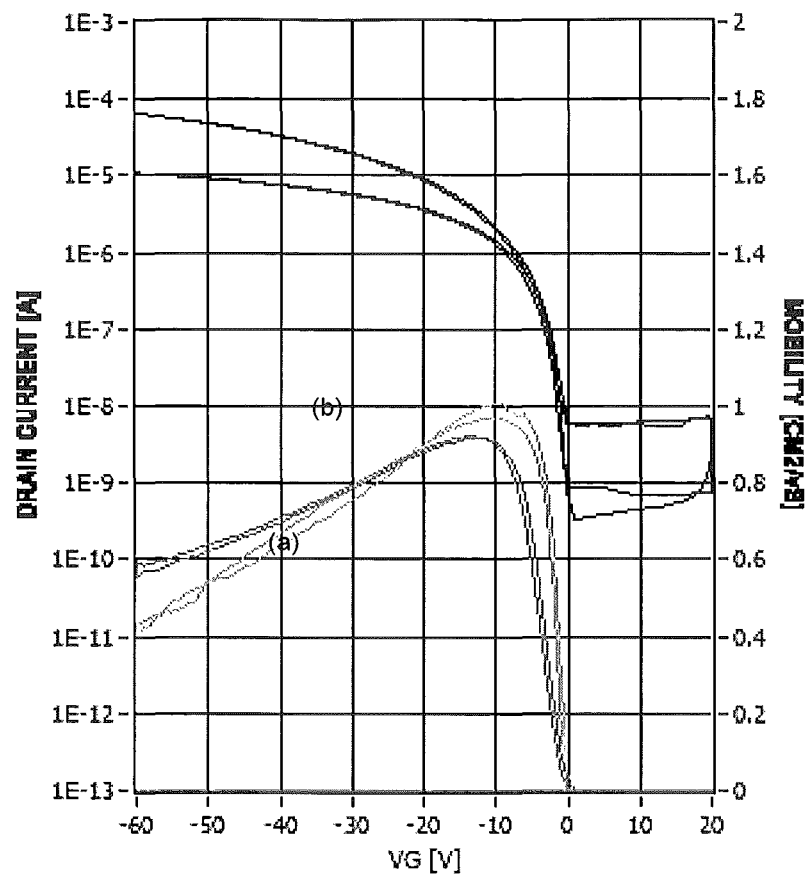
FIG. 21 is the transfer curve of a bottom gate OFET device fabricated as described in Example C19.

FIG. 21 shows the characteristic of the transistor encompassing the organic dielectric pDMMIBuNB with the adhesion promoter DMMI-propyl-Si(OEt)$_3$.

EXAMPLE C20

OFET Having a Gate Insulator Without Adhesion Promoter

A bottom gate OFET is prepared as described in Example D3, but wherein the step of soaking the substrate with DMMI-propyl-Si(OEt)$_3$ is omitted.

Figure 22:
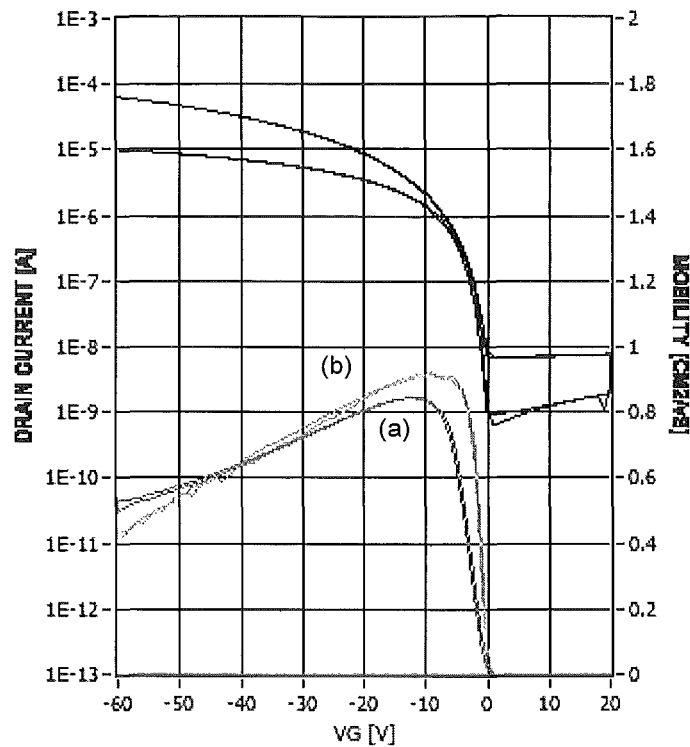
FIG. 22 is the transfer curve of a bottom gate OFET device fabricated as described in Example C20

FIG. 22 shows the characteristic of a transistor encompassing the organic dielectric homopolymer of DMMIBuNB without adhesion promoter. The comparison between FIGS. 21 and 22 shows that transistor performance is not influenced by the use of the adhesion promoter.

For mechanical characterization a glass substrate is soaked with 1% solution of DMMI-propyl-Si(OEt)$_3$ in PGMEA, spin-off and washed with IPA. A 17% solution of the homopolymer of DMMIBuNB (see example B64) containing 0.7% w/w of CPTX in MAK is coated by spin-coating, and UV cured for 4 minutes under 11 mW/cm$^2$ 365 nm irradiation.

A reference sample is prepared by the process as described above, but without the step of soaking the substrate with 1% solution of DMMI-propyl-Si(OEt)$_3$ in PGMEA.

Mechanical tests are performed for both samples in 180°-geometry adhesion tests with the use of a Mecmesin machine (Multitest 1-i).

Figure 23:
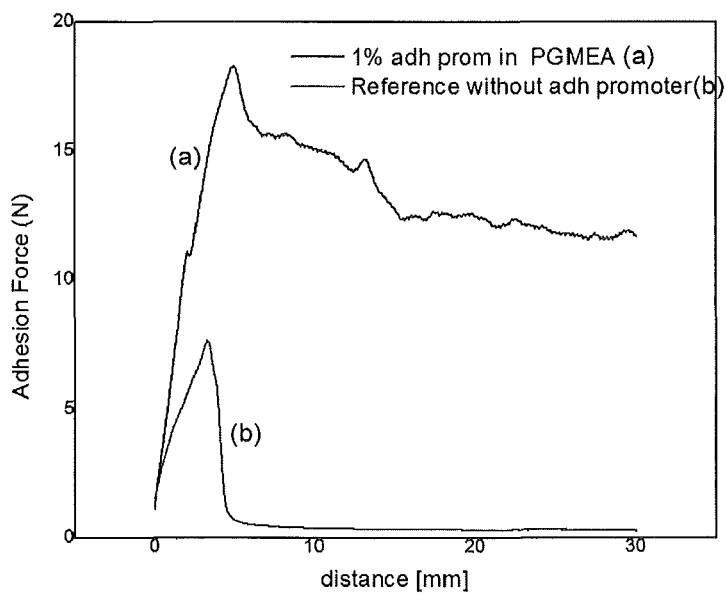
FIG. 23 depicts the adhesion force of a layer of an organic dielectric, with and without an adhesion promoter, respectively, on a glass substrate as described in Example C19 and C20.

FIG. 23 shows a graph of the adhesion force vs. distance for both samples. It can be seen that the adhesion between the glass substrate and the DMMIBuNB polymer layer including the adhesion promoter DMMI-propyl-Si(OEt)$_3$ is significantly improved, compared to the DMMIBuNB polymer layer without adhesion promoter.

EXAMPLE C21

OFET Having a Gate Insulator with a Crosslinker

A bottom gate OFET is prepared as follow. A substrate of Corning Eagle XG glass is sonicated in 3% Decon90 for 30 min at 70° C., washed twice with water and sonicated in MeOH, then dried by spin off on the spin coater. A 30 nm aluminium layer is then thermally evaporated onto the substrate through a shadow mask to form the gate electrode.

A 17% solution of the homopolymer of DMMIBuNB (see example B64) containing either 0.7% CPTX (w/w to polymer), or 0.5% DMMI-butyl-DMMI (w/w to polymer) in MAK, or no additives, is coated by spin-coating, UV cured for different time under 11 mW/cm2 365 nm irradiation.

Silver source and drain electrodes of 30 nm thickness are thermally evaporated through a shadow mask onto the substrate, creating a channel L=50 µm and W=1000 µm. Next the surface treatment formulation Lisicon™ M001 (available from Merck KGaA, Darmstadt, Germany) is applied for 1 min, washed with isopropyl alcohol and dried by spin off on the spin coater. Next the OSC Formulations Lisicon™ S1200 (available from Merck KGaA, Darmstadt, Germany) is spun onto the substrate after above treatment and then annealed for 1 min at 100° C. on a hotplate.

Charge carrier mobility obtained from bottom gate transistors prepared with different UV-curing time is shown below. Times in Table C1 are reported in seconds (s) and represent the minimum and optimum times (Min and Opt) needed to crosslink the polymer layer and achieve the mobility indicated for each additive, if any.

TABLE C1

| Additive | Min > 0.8 cm²/Vs | Opt > 1 cm²/Vs |
|---|---|---|
| None | 180 s | 300 s |
| 0.7% CPTX | 120 s | 240 s |
| 0.5% DMMI-butyl-DMMI | 90 s | 120 s |

Examples C19 to C21 further demonstrate that device performance is not negatively influenced by using an adhesion promoter or a crosslinker, while certain advantages like shorter UV illumination time and improved adhesion are achieved.

All the references described above are incorporated by reference in their entirety.

The invention claimed is:

1. A gate insulator layer that is in direct contact with an organic semiconductor layer in an organic electronic device, said gate insulator layer consisting essentially of a polycycloolefinic polymer said polycycloolefinic polymer comprising a first type of repeating unit of formula I:

I where Z is selected from —$CH_2$—, —$CH_2$—$CH_2$— or —O—, m is an integer from 0 to 5, and each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group or one of $R^1$, $R^2$, $R^3$ and $R^4$ has a pendant crosslinkable group.

2. The gate insulator layer of claim 1, wherein m is 0 or 1.

3. The gate insulator layer of claim 1, wherein one of $R^1$, $R^2$, $R^3$ and $R^4$ has a pendent crosslinkable group.

4. The gate insulator layer of claim 3, wherein the pendent crosslinkable group is a latent crosslinkable group.

5. The gate insulator layer of claim 3, wherein the pendent crosslinkable group comprises a substituted or unsubstituted maleimide portion, an epoxide portion, a vinyl portion, a cinnamate portion or a coumarin portion.

6. The gate insulator layer of claim 3, where the first type of repeating unit is derived from any one of the following monomers:

P1

P2

P3

P4

P5 wherein n is an integer from 1 to 8, $Q^1$ and $Q^2$ are each independently of one another —H or —$CH_3$, and $R^1$ is —H or —$OCH_3$.

7. The gate insulator layer of claim 1, wherein the polycycloolefinic polymer further comprises a second type of repeating unit, such second type being distinct from the first type.

8. The gate insulator layer of claim 1, wherein the polycycloolefinic polymer further comprises one or more types of repeating units in accordance with formula II

II wherein

Z is selected from —$CH_2$—, —$CH_2$—$CH_2$— or —O—, m is an integer from 0 to 5, each of $R^5$, $R^6$, $R^7$ and $R^8$ are independently selected from H, a $C_1$ to $C_{25}$ hydrocarbyl, a $C_1$ to $C_{25}$ halohydrocarbyl or a $C_1$ to $C_{25}$ perhalocarbyl group, the repeating units of formula II being distinct from the repeating units of formula I.

9. The gate insulator layer of claim 1, comprising a blend of a first polycycloolefinic polymer and a second polycycloolefinic polymer.

10. The gate insulator layer of claim 9, wherein the first polycycloolefinic polymer comprises one or more types of repeating units of formula I, and the second polycycloolefinic polymer comprises one or more types of repeating units of formula II

I

-continued

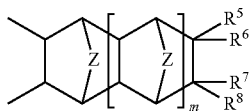
II wherein
Z is selected from —CH₂—, —CH₂—CH₂— or —O—,
m is an integer from 0 to 5,
each of $R^1$, $R^2$, $R^3$ and $R^4$ and $R^5$, $R^6$, $R^7$ and $R^8$ are independently selected from H,
a $C_1$ to $C_{25}$ hydrocarbyl, a $C_1$ to $C_{25}$ halohydrocarbyl or a $C_1$ to $C_{25}$ perhalocarbyl group, and wherein the repeating units of formula I are distinct from the repeating units of formula II.

11. The gate insulator layer of claim 1, wherein the layer is formed from a polymer composition comprising the polycycloolefinic polymer and one or more of a solvent, a crosslinking agent, an adhesion promoter, an optional reactive solvent, a stabilizer, a UV sensitizer and a thermal sensitizer.

12. The gate insulator layer of claim 11, wherein the adhesion promoter is represented by formula III

G-A'-P      III wherein
G is a surface-active group,
A' is a spacer group or a single bond, and
P is a crosslinkable group.

13. The gate insulator layer of claim 12, wherein the surface active group is a silane group, having the formula —$SiR^{12}R^{13}R^{14}$, or a silazane group having the formula —NH—$SiR^{12}R^{13}R^{14}$, wherein $R^{12}$, $R^{13}$ and $R^{14}$ independently are selected from halogen, silazane, $C_1$-$C_{12}$-alkoxy, $C_1$-$C_{12}$-alkylamino, optionally substituted $C_5$-$C_{20}$-aryloxy and optionally substituted $C_2$-$C_{20}$-heteroaryloxy, and wherein one or two of $R^{12}$, $R^{13}$ and $R^{14}$ may also denote $C_1$-$C_{12}$-alkyl, optionally substituted $C_5$-$C_{20}$-aryl and optionally substituted $C_2$-$C_{20}$-heteroaryl.

14. The gate insulator layer of claim 12, wherein the crosslinkable group comprises a substituted or unsubstituted maleimide portion, an epoxide portion, a vinyl portion, a cinnamate portion or a coumarin portion.

15. The gate insulator layer of claim 13, wherein the adhesion promoter is represented by structure A1

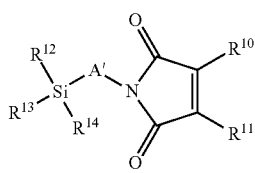
A1 wherein
$R^{12}$, $R^{13}$ and $R^{14}$ independently are selected from halogen, silazane, $C_1$-$C_{12}$-alkoxy, $C_1$-$C_{12}$-alkylamino, optionally substituted $C_5$-$C_{20}$-aryloxy and optionally substituted $C_2$-$C_{20}$-heteroaryloxy, and wherein one or two of $R^{12}$, $R^{13}$ and $R^{14}$ may also denote $C_1$-$C_{12}$-alkyl, optionally substituted $C_5$-$C_{20}$-aryl and optionally substituted $C_2$-$C_{20}$-heteroaryl,
A' is a spacer group or a single bond, and
$R^{10}$ and $R^{11}$ are each independently H or a $C_1$-$C_6$ alkyl group.

16. The gate insulator layer of claim 11, where the crosslinking agent comprises two or more crosslinkable functional groups that are capable of reacting with the crosslinkable group of the said repeating unit of the polycycloolefinic polymer.

17. The gate insulator layer of claim 16, wherein the crosslinking agent is represented by formula IV1 or IV2

P-X-P      IV1

$H_{4-m}C(A''-P)_m$      IV2 where X is A"-X'-A",
X' is, O, S, NH, or a single bond,
A" is a single bond or a connecting, spacer or bridging group,
P is a crosslinkable group, and m is 2, 3 or 4.

18. The gate insulator layer of claim 17, wherein the crosslinkable group comprises a substituted or unsubstituted maleimide portion, an epoxide portion, a vinyl portion, a cinnamate portion or a coumarin portion.

19. The gate insulator layer of claim 16, wherein the crosslinking agent is represented by formula C1:

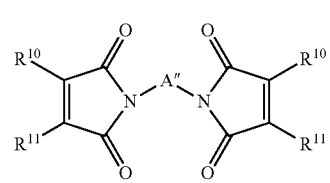
C1 wherein
$R^{10}$ and $R^{11}$ are independently of each other H or a $C_1$-$C_6$ alkyl group, and
A" is a single bond or a connecting, spacer or bridging group as defined in claim 17 and additionally selected from $(CZ_2)_n$, $(CH_2)_n$—(CH=CH)$_p$—$(CH_2)_n$, $(CH_2)_n$—O, $(CH_2)_n$—O—$(CH_2)_n$, $(CH_2)_n$—$C_6Q_{10}$-$(CH_2)_n$, and C(O)—O, where
each n is independently an integer from 0 to 12,
p is an integer from 1-6,
Z is independently H or F, $C_6Q_{10}$ is cyclohexyl that is substituted with Q,
Q is independently H, F, $CH_3$, $CF_3$ or $OCH_3$.

20. The gate insulator layer of claim 11, wherein the solvent has orthogonal solubility properties with respect to an organic semiconductor layer.

21. The gate insulator layer of claim 1, wherein the polycycloolefinic polymer further comprises one or more repeat units derived from a monomer selected from the following:

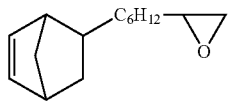   EONB   28

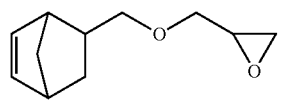 [SMILES: C1=CC2CC1CC2COCC1CO1]   MGENB   29

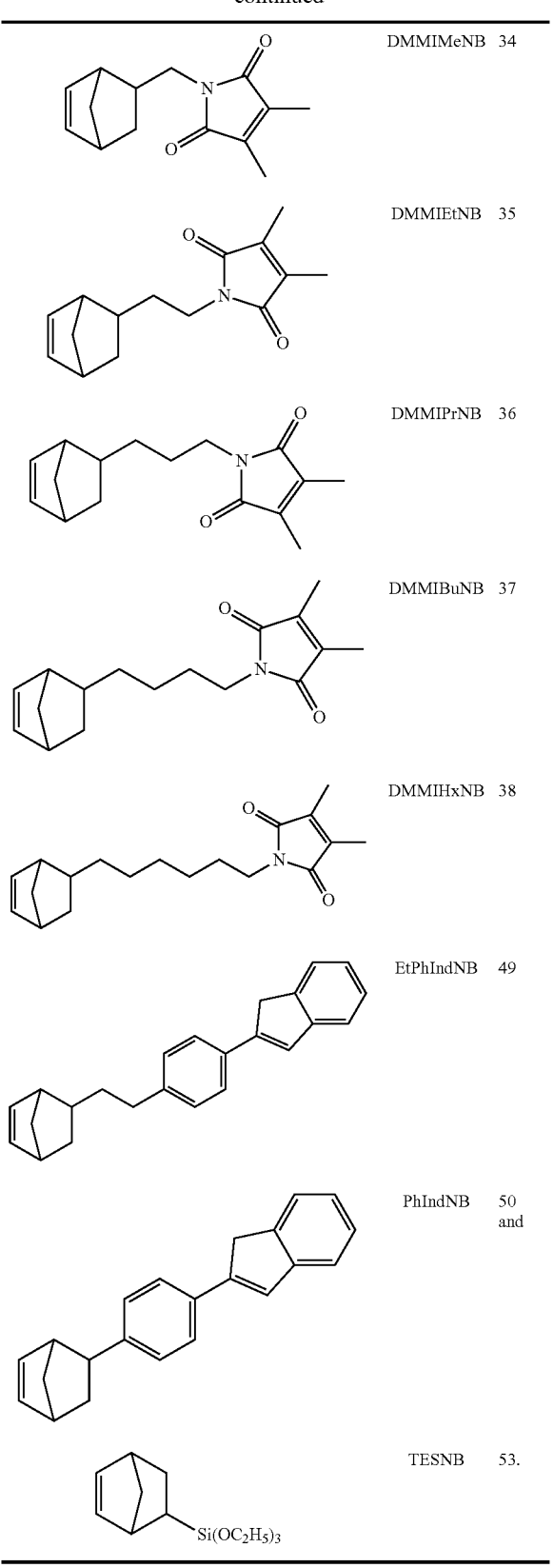

22. The gate insulator layer of claim 1, wherein the polycycloolefinic polymer further comprises one or more repeat units derived from a monomer selected from the following:

23. A gate insulator layer that is in direct contact with an organic semiconductor layer in an organic electronic device, said gate insulator layer consisting essentially of a norbornene-type polymer formed from one or more norbornene-type monomers selected from the following formulae

| | | |
|---|---|---|
|  | NB | 1 |
| 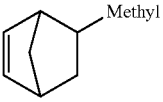 Methyl | MeNB | 2 |
| 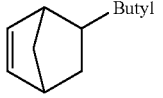 Butyl | BuNB | 3 |
| 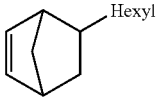 Hexyl | HexNB | 4 |
| 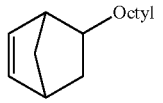 Octyl | OctNB | 5 |
| 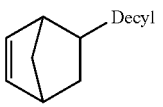 Decyl | DecNB | 6 |
| 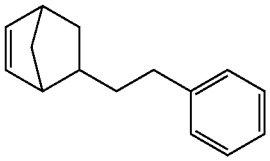 [SMILES: C1=CC2CC1CC2CCc1ccccc1] | PENB | 7 |
| 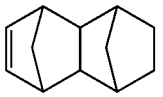 [SMILES: C1=CC2CC1C1C3CCC(C3)C21] | TD | 8 |
| 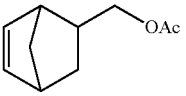 OAc | MeOAcNB | 9 |
| 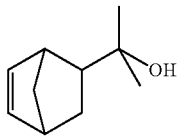 OH | NBXOH | 10 |
| 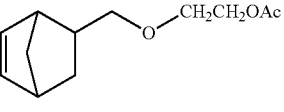 O CH$_2$CH$_2$OAc | NBCH$_2$GlyOAc | 11 |
| 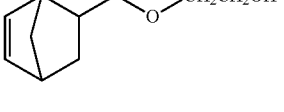 O CH$_2$CH$_2$OH | NBCH$_2$GlyOH | 12 |
| 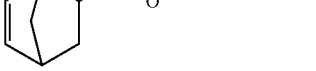 O (CH$_2$CH$_2$O)$_2$Me | NBTON | 13 |

| Structure | Name | # |
|---|---|---|
|  | NBTODD | 14 |
|  | NBC$_4$F$_9$ | 15 |
| 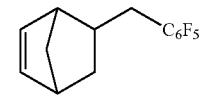 | NBCH$_2$C$_6$F$_5$ | 16 |
| 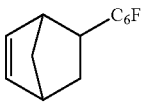 | NBC$_6$F$_5$ | 17 |
| 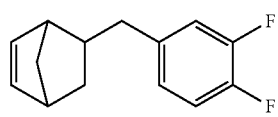 [SMILES: Fc1ccc(CC2CC3C=CC2C3)cc1F] | NBCH$_2$C$_6$F$_2$ | 18 |
| 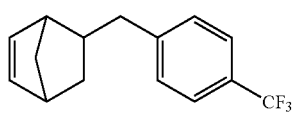 [SMILES: FC(F)(F)c1ccc(CC2CC3C=CC2C3)cc1] | NBCH$_2$C$_6$H$_4$CF$_3$ | 19 |
| 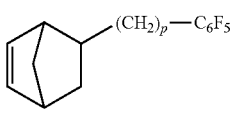 | NBalkylC$_6$F$_5$ | 20 |
| 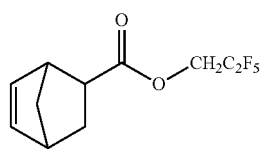 | FPCNB | 21 |
| 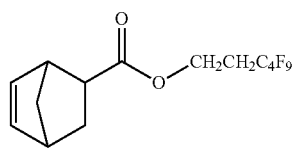 | FHCNB | 22 |
| 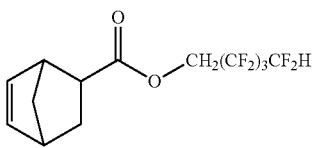 | FOCHNB | 23 |
| 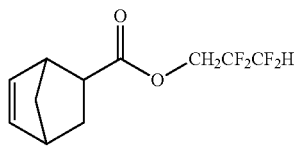 | FPCHNB | 24 |
| 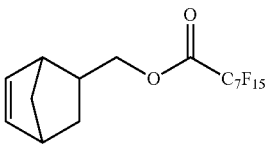 | C$_8$PFAcNB | 25 |

-continued

| Structure | Name | # |
|---|---|---|
| Norbornene-CH₂-O-CF₂-CFH-OC₃F₇ | PPVENB | 26 |
| Dicyclopentadiene | DCPD | 27 |
| Norbornene-C₆H₁₂-epoxide | EONB | 28 |
| Norbornene-CH₂-O-CH₂-epoxide | MGENB | 29 |
| Norbornene-(CH₂)₂-C≡C-SiEt₃ | AkSiNB | 30 |
| Norbornene-(CH₂)₂-C₆H₄-C≡C-SiEt₃ | ArSiNB | 31 |
| Norbornene-CH₂-O-C₆H₄-C(=O)-CH=CH-C₆H₄-OMe | MCHMNB | 32 |
| Norbornene-CH₂-O-C₆H₄-C(=O)-CH=CH-naphthyl | NPCHMNB | 33 |
| Norbornene-CH₂-N(dimethylmaleimide) | DMMIMeNB | 34 |
| Norbornene-(CH₂)₂-N(dimethylmaleimide) | DMMIEtNB | 35 |

-continued
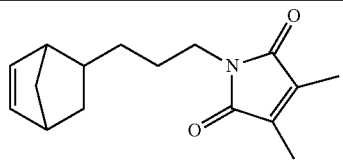 DMMIPrNB 36
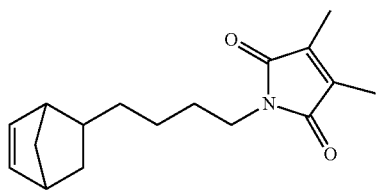 [SMILES: CC1=C(C)C(=O)N(CCCCC2CC3C=CC2C3)C1=O] DMMIBuNB 37
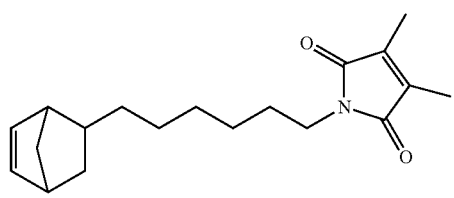 [SMILES: CC1=C(C)C(=O)N(CCCCCCC2CC3C=CC2C3)C1=O] DMMIHxNB 38
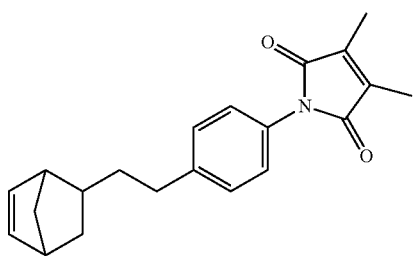 [SMILES: CC1=C(C)C(=O)N(c2ccc(CCC3CC4C=CC3C4)cc2)C1=O] EtPhDMMINB 39
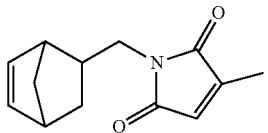 [SMILES: CC1=CC(=O)N(CC2CC3C=CC2C3)C1=O] MMIMeNB 40
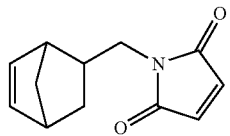 [SMILES: O=C1C=CC(=O)N1CC1CC2C=CC1C2] MINB 41
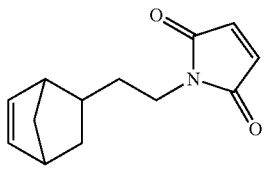 [SMILES: O=C1C=CC(=O)N1CCC1CC2C=CC1C2] MIENB 42
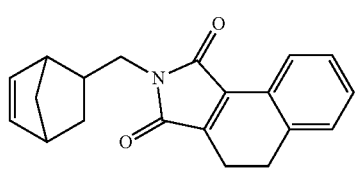 [SMILES: O=C1C2=C(C(=O)N1CC1CC3C=CC1C3)c1ccccc1CC2] DHNMINB 43
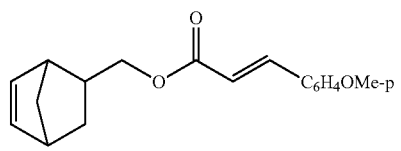 MeOCinnNB 44

-continued
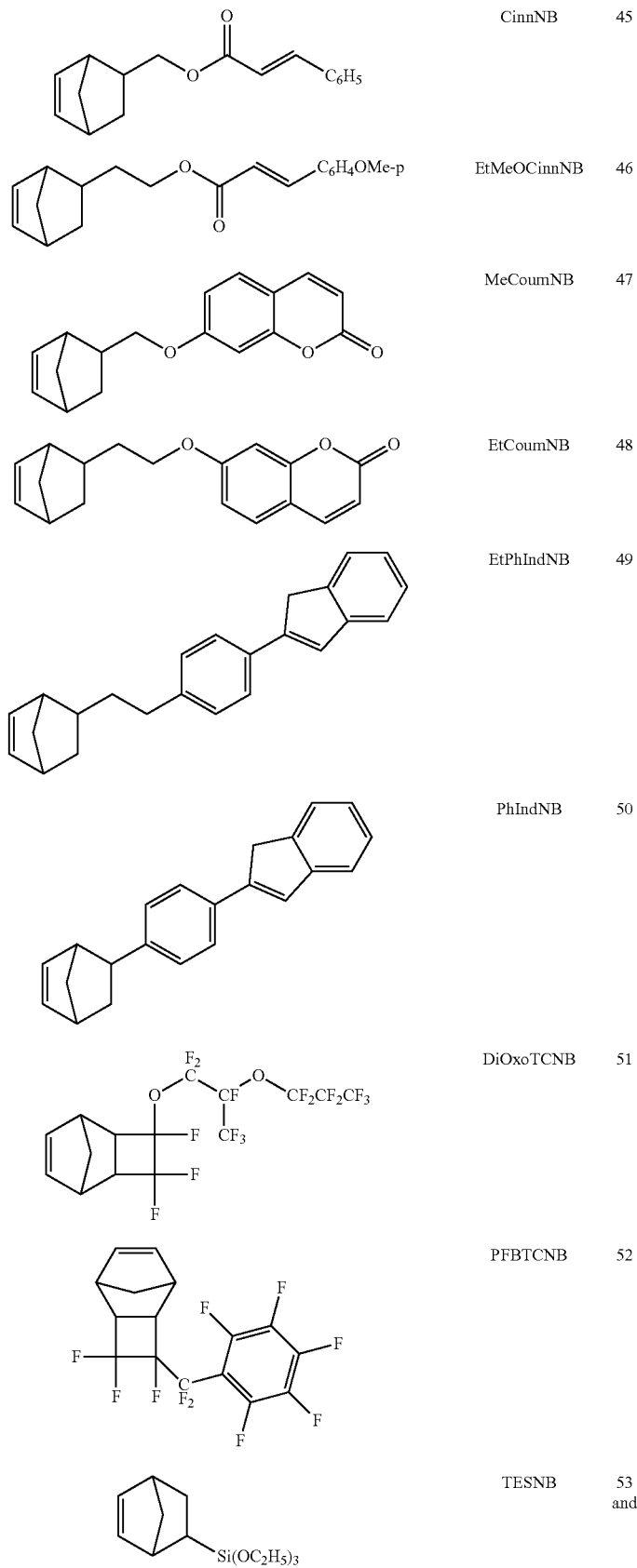
| | | |
|---|---|---|
| CinnNB | 45 | |
| EtMeOCinnNB | 46 | |
| MeCoumNB | 47 | |
| EtCoumNB | 48 | |
| EtPhIndNB | 49 | |
| PhIndNB | 50 | |
| DiOxoTCNB | 51 | |
| PFBTCNB | 52 | |
| TESNB | 53 and | |

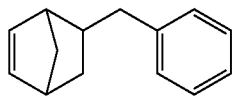 [SMILES: C1=CC2CC1CC2Cc1ccccc1] PMNB 54 wherein "Me" means methyl, "Et" means ethyl, "OMe-p" means para-methoxy, "Ph" and "$C_6H_5$" means phenyl, "$C_6H_4$" means phenylene, "$C_6F_5$" means pentafluorophenyl, "OAc" means acetate, "PFAc" means —OC(O)$_p$—C$_7$F$_{15}$, and for each of the above subformulae having a methylene bridging group, such methylene bridging group is inclusive of a covalent bond or —(CH$_2$)$_p$— where p is an integer from 1 to 6.

24. The gate insulator layer of claim 23, wherein the polycycloolefinic polymer further comprises one or more repeat units derived from a monomer selected from the following:

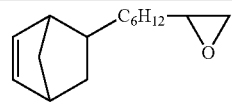 EONB 28

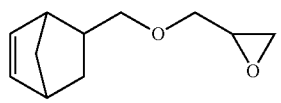 [SMILES: C1=CC2CC1CC2COCC1CO1] MGENB 29

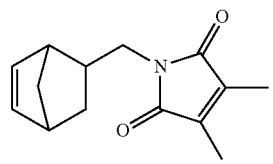 [SMILES: CC1=C(C)C(=O)N(CC2CC3C=CC2C3)C1=O] DMMIMeNB 34

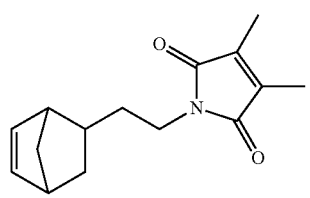 [SMILES: CC1=C(C)C(=O)N(CCC2CC3C=CC2C3)C1=O] DMMIEtNB 35

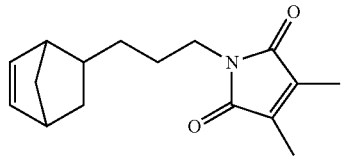 [SMILES: CC1=C(C)C(=O)N(CCCC2CC3C=CC2C3)C1=O] DMMIPrNB 36

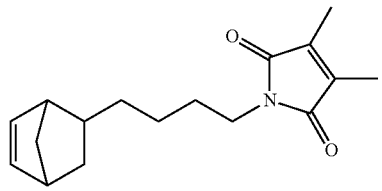 [SMILES: CC1=C(C)C(=O)N(CCCCC2CC3C=CC2C3)C1=O] DMMIBuNB 37

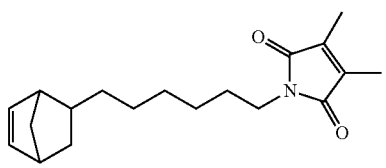 [SMILES: CC1=C(C)C(=O)N(CCCCCCC2CC3C=CC2C3)C1=O] DMMIHxNB 38

-continued

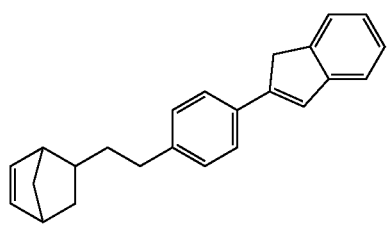 [SMILES: C1=CC2CC1CC2CCc1ccc(C2=Cc3ccccc3C2)cc1] EtPhIndNB 49

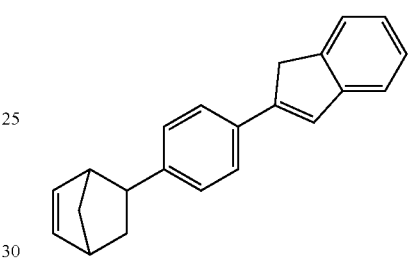 PhIndNB 50 and

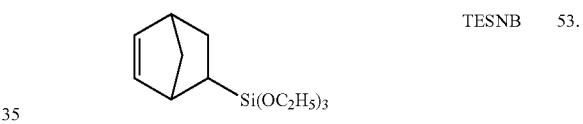 TESNB 53.

25. The gate insulator layer of claim 23, wherein the polycycloolefinic polymer further comprises one or more repeat units derived from a monomer selected from the following:

 NB 1

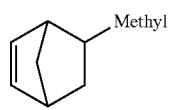 MeNB 2

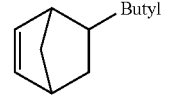 BuNB 3

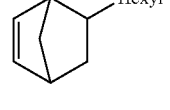 HexNB 4

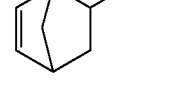 OctNB 5

-continued
| Structure | Name | # |
|---|---|---|
| 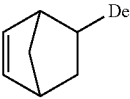 Decyl | DecNB | 6 |
| 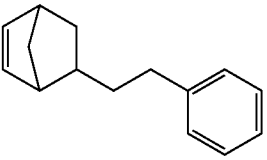 [SMILES: C1=CC2CC1CC2CCc1ccccc1] | PENB | 7 |
| 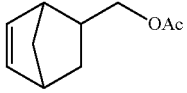 [SMILES: CC(=O)OCC1CC2C=CC1C2] OAc | MeOAcNB | 9 |
| 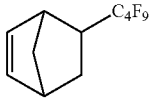 C$_4$F$_9$ | NBC$_4$F$_9$ | 15 |
| 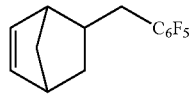 C$_6$F$_5$ | NBCH$_2$C$_6$F$_5$ | 16 and |
| 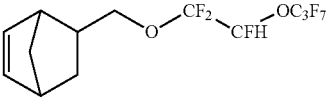 | PPVENB | 26. |
* * * * *